United States Patent
Obayashi et al.

(10) Patent No.: US 8,331,185 B2
(45) Date of Patent: Dec. 11, 2012

(54) SEMICONDUCTOR DEVICE HAVING ELECTRICAL FUSES WITH LESS POWER CONSUMPTION AND INTERCONNECTION ARRANGEMENT

(75) Inventors: Shigeki Obayashi, Tokyo (JP); Toshiaki Yonezu, Tokyo (JP); Takeshi Iwamoto, Tokyo (JP); Kazushi Kono, Tokyo (JP); Masashi Arakawa, Toyko (JP); Takahiro Uchida, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 293 days.

(21) Appl. No.: 12/723,218

(22) Filed: Mar. 12, 2010

(65) Prior Publication Data

US 2010/0165775 A1     Jul. 1, 2010

Related U.S. Application Data

(63) Continuation of application No. 11/802,627, filed on May 24, 2007, now Pat. No. 7,706,202.

(30) Foreign Application Priority Data

May 25, 2006   (JP) .................................. 2006-145759

(51) Int. Cl.
  *G11C 17/18*    (2006.01)
(52) U.S. Cl. .............................. 365/225.7; 365/189.16
(58) Field of Classification Search .................. None
  See application file for complete search history.

(56) References Cited

U.S. PATENT DOCUMENTS

| 5,999,037 | A | * | 12/1999 | Bernstein et al. ............. 327/525 |
| 6,292,422 | B1 | | 9/2001 | Pitts |
| 6,727,590 | B2 | | 4/2004 | Izumitani et al. |
| 2002/0014680 | A1 | | 2/2002 | Tottori |
| 2004/0262710 | A1 | | 12/2004 | Ueda |
| 2007/0063313 | A1 | * | 3/2007 | Barth et al. ................... 257/529 |

FOREIGN PATENT DOCUMENTS

| JP | 02-298049 A | 12/1990 |
| JP | 05-267464 | 10/1993 |
| JP | 09-069571 A | 3/1997 |
| JP | 11-340434 | 12/1999 |
| JP | 2001-189388 A | 7/2001 |
| JP | 2002-042482 | 2/2002 |
| JP | 2002-057306 A | 2/2002 |
| JP | 2003-016797 | 1/2003 |
| JP | 2004-335612 A | 11/2004 |
| JP | 2005-039220 A | 2/2005 |
| JP | 2005-302156 A | 10/2005 |
| WO | WO 2005096378 A1 * | 10/2005 |

OTHER PUBLICATIONS

Japanese Office Action, with English translation, issued in Japanese Patent Application No. 2006-145759, dated Sep. 6, 2011.

* cited by examiner

*Primary Examiner* — Alexander Sofocleous
(74) *Attorney, Agent, or Firm* — McDermott Will & Emery LLP

(57) ABSTRACT

In fuse program circuits, fuse element FS is implemented using metal interconnect at third or higher layer of multilayer metal interconnect. In each fuse program circuit, program information and fuse select information are sequentially transferred using a scan flip-flops, and fuses are selectively and electrically blown one by one. The fuse program circuit provided with fuse elements that can be programmed even after packaging is implemented with low power consumption and a low occupation area.

5 Claims, 34 Drawing Sheets

FF(FSSR,PSR)

TMX (SX0,SX1,SX2)

FIG. 23 T6: FS CUT SEQUENCE

SHIELD

SEMICONDUCTOR DEVICE HAVING ELECTRICAL FUSES WITH LESS POWER CONSUMPTION AND INTERCONNECTION ARRANGEMENT

RELATED APPLICATIONS

This application is a Continuation of U.S. application Ser. No. 11/802,627, filed on May 24, 2007 now U.S. Pat. No. 7,706,202, claiming priority of Japanese Patent Application No. 2006-145759, filed on May 25, 2006, the entire contents of each of which are hereby incorporated by reference.

BACKGROUND OF THE INVENTION

1. Field of the Invention

The present invention relates to a semiconductor device having a fuse program circuit that includes a fuse element storing fixed information, and particularly to a construction for implementing a fuse program circuit operating with low power consumption and small occupation area.

2. Description of the Background Art

Fuse program circuit is employed in semiconductor integrated circuit devices for various purposes. The fuse program circuit generates an output signal of which state is fixedly set by blowing or non-blowing a fuse element. For example, such fuse elements are employed for trimming a constant of an analog circuit. Programming (i.e., blowing or non-blowing) of the fuse elements is performed, for example, for adjusting a current driving power of a transistor element, a supplying current quantity of a reference current source, a level of a reference voltage produced by a reference voltage supply and others. The fuse program circuit is also used for trimming a resistance value of a resistance element.

In a digital circuit, a similar adjustment is performed. A semiconductor memory employs a fuse program circuit for storing a fault address used for replacing a faulty cell with a redundant cell. By using the fuse program circuit, the circuit operation characteristics are optimized, and the faulty cell is repaired so that product yield may be improved.

Conventionally, fuse program circuits have generally used LT (Laser Trimming) fuses that can be blown by irradiation with a laser beam. A laser apparatus is used to blow the LT fuses according to program information for executing fuse programming.

Japanese Patent Laying-Open No. 2003-016797 (Reference 1) has disclosed a construction using a fuse program circuit as a fault address storage circuit for redundant cell repair. In Reference 1, there are provided a fuse block for performing fuse programming of a fault address, a scan shift circuit externally inputting fault addresses in series and internally outputting them in parallel, and a selector circuit for selecting one of outputs of the fuse block and the scan shift circuit according to a mode instructing signal.

Before the programming of the fuse elements, it is internally determined whether redundant repair will be reliably performed, for intending to improve the yield.

Japanese Patent Laying-Open No. 11-340434 (Reference 2) has disclosed a construction in which elements or interconnects are arranged hierarchically with and lower than fuse elements. By arranging the elements below the fuse elements, it is intended to reduce a device chip area. In Reference 2, an impact interrupt layer made of a material having a higher melting point than the fuse elements is arranged below the fuse element, so that thermal and physical impacts that may be applied to elements at the lower layer at the time of blowing of the fuse elements may be prevented. A stacked structure formed of a heat sink layer and a thermal resistance layer is used for the impact interrupt layer.

Japanese Patent Laying-Open No. 05-267464 (Reference 3) has disclosed a structure of a fuse circuit that blows a fuse element by a current. In Reference 3, a select circuit connects one of a fuse trimming circuit including fuse elements and an internal circuit to a common power supply pad according to a control signal. It is intended to reduce the number of pads, for reducing a chip occupation area and a probability of occurrence of connection failure between the pad and a pin.

Japanese Patent Laying-Open No. 2002-042482 (Reference 4) has disclosed a construction, in which fuse elements and internal circuits share a power supply. In Reference 4, an output signal line connected to the fuse element of a fuse program circuit is coupled to a pad other than an internal circuit power supply pad, and it is intended to detect externally a minute current of the fuse element for detecting a fuse cut-off failure.

When a laser beam is to be used for programming such fuse elements, a laser apparatus for the fuse programming is required, and a step of transporting wafers from an inspection apparatus to the laser apparatus is necessary, resulting in problems such as wafer contamination.

For performing the fuse programming through laser beam irradiation, the fuse programming must be performed in a bare chip state because the fuse element cannot be radiated with the laser beam when the semiconductor chip is in a molded state. Therefore, it is difficult to implement the laser programming for failure repairing and others after packaging.

Storage capacity of an on-chip memory on a system LSI such as an SOC (System On Chip) has been increasing, and the faulty cell repair is required from the viewpoint of product yield. Likewise, in the case where a plurality of chips are used for constructing a system, as in an SIP (System In Package) or the like, necessity for repairing after molding is increasing for improving final yield. For example, when an SIP is formed of an inexpensive chip and an expensive chip stacked each other, if a fault is found in the inexpensive chip after packaging, the whole package becomes faulty, and the expensive chip is also treated as a faulty chip. Since each SIP has an optimum burn-in voltage different from others, it has been demanded to eliminate a burn-in step after packaging. Therefore, it is desired to assemble each chip, using a KGN (Known Good Die; a chip of which quality is ensured in an unassembled state).

Since the LT fuse is physically cut by the externally applied laser beam, the apparatus dedicated to trimming and the repairing step are required as already described, and the increase in cost due to investment on the apparatus as well as increase in TAT (Turn-Around Time) are unavoidable.

Instead of the above fuse programming through the laser trimming, electric fuses using, e.g., polycrystalline silicon (polysilicon) that is a gate electrode material are practically available. However, it is likewise necessary to arrange fuse elements with a small occupation area as the development of a miniaturizing process. The polysilicon that is the gate electrode material is the interconnects at the lowest interconnection layer, and peripheral circuits for supplying a current to the fuse elements and for determining an output level cannot be arranged near the fuse elements at high densities without difficulty. Therefore, it is difficult to reduce the occupation area of the fuse circuit including the fuse elements.

In Reference 1, the laser beam is used for blowing the fuse element. For overcoming a problem that the programmed state of the fuse elements cannot be changed after the blowing of the fuse elements, the scan shift circuit is used to set the state of the internal circuit according to the program information for testing the circuit operation before programming of the fuse elements. It is intended to facilitate the analysis for determining whether any fault is due to faulty fuse programming. However, Reference 1 discloses, as the fuse elements, only the LT fuse elements that can be blown through application of the laser beam, and Reference 1 does not consider fuse elements that can be electrically blown off.

Reference 2 discloses the arrangement of the interconnects or the elements in the layer under the fuse elements. However, the laser wavelength decreases with miniaturization of the fuse elements, and accordingly the laser energy increases. According to Reference 2, the impact interruption layer having a high melting point is arranged below the fuse element for reducing an impact to the lower layer portion that may be caused by the increase in laser energy as described above. It is intended to avoid the destruction of the elements in the lower layer. However, Reference 2 likewise gives no consideration to the structure or configuration for electrically blowing the fuse elements.

According to Reference 3, the pad connected to the fuse element and the pad connected to the internal circuit are made common, and a selection circuit selects the connection path of the pad according to a control signal. The fuse element is selectively blown by a current. In the construction disclosed in Reference 3, the current is selectively supplied to the fuse element to blow it according to the signal applied from the pad. Although some pads are shared, there are pads that are not shared, and the number of empty pads that are not used when the semiconductor device practically used, is increased. Although Reference 3 discloses the blowing of the fuse elements with the current, it does not disclose any specific layout of the fuse elements, power consumption and others.

In Reference 4, the power supply for supplying the current to the fuse element is commonly used for the power supply of the internal circuit. It is also disclosed that the fuse element may be of a current-blow type. In Reference 4, however, no consideration is given to the current consumption required for blowing the fuse element by the current. Also, the arrangement and interconnections of the fuse elements are not specifically disclosed.

A construction is also proposed in which a flash memory of an inverted gate structure is used for electrically programming fixed information. However, the flash memory is used, and a circuit construction for the programming is large, resulting in a problem that a fixed information program circuit of a small occupation area cannot be achieved without difficulty.

SUMMARY OF THE INVENTION

An object of the invention is to provide a fuse program circuit that is formed of an electric fuse element of an interconnection blowing type that operates with a small occupation area and low current consumption.

Another object of the invention is to provide a semiconductor device provided with a fuse program circuit including a reliable electric fuse element of an interconnection blowing type that requires no additional interconnection process and allows fuse programming with a small cutting current.

A semiconductor device according to the invention has a plurality of metal interconnection layers, and includes an internal circuit, and at least one fuse program circuit for fixedly storing information related to the internal circuit according to a blown or non-blown state of the fuse element according to fuse program information. The internal circuit includes a transistor element laid out and connected using interconnects in the plurality of interconnection layers.

The fuse program circuit includes the fuse element, and a fuse transistor connected in series to the fuse element. The fuse element is formed using the interconnects in an interconnection layer included in the plurality of metal interconnection layers and located in a layer higher than the lowest metal interconnection layer. The fuse transistor selectively passes a current for blowing the fuse element.

For example, in the semiconductor device using a copper (Cu) interconnect, the metal interconnection in the first layer is written with finest patterns. Thus, the metal interconnect in the lowest layer has a small interconnection width and a small film thickness, and therefore is suitable to cutting. However, on a system-on chip of sub-100 nm et seq., fine metal interconnects are present in upper layers such as fourth to sixth layers, and thus there are interconnects having film thicknesses and interconnection widths that do not change to a large extent, as compared to the interconnects in the first metal layer. Therefore, a metal interconnect in another upper layer is used for the electric fuse elements of the interconnection-cut type, instead of the interconnects in the first metal interconnection layer. Even when the metal interconnects in the upper layer are used, a large difference is not present in film thickness and interconnection width, and likewise a difference is not present in impurity concentration. Therefore, a large difference is not present in blowability between the upper metal interconnect and the first metal interconnect. No particular problem arises even when the metal interconnect in the upper layer is used for the fuse element.

An element such as a transistor supplying a current for blowing the fuse element can be arranged in a layer below the fuse element so that increase in occupation area of the fuse program circuit can be suppressed.

For example, when a copper interconnect is cut, a barrier metal for preventing diffusion of broken copper as well as an isolating film, e.g., of SiCN or SiCO are destroyed. In this case, it is necessary to devise the layout for preventing diffusion of copper atoms of blown copper pieces. By using the interconnects in the third or fourth metal interconnection layer in the upper layers, a sufficient margin can be ensured in interconnection layout to facilitate the devising on the layout. Thus, it is possible to achieve the fuse program circuit with the electric fuse element of the interconnection cut type having high reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
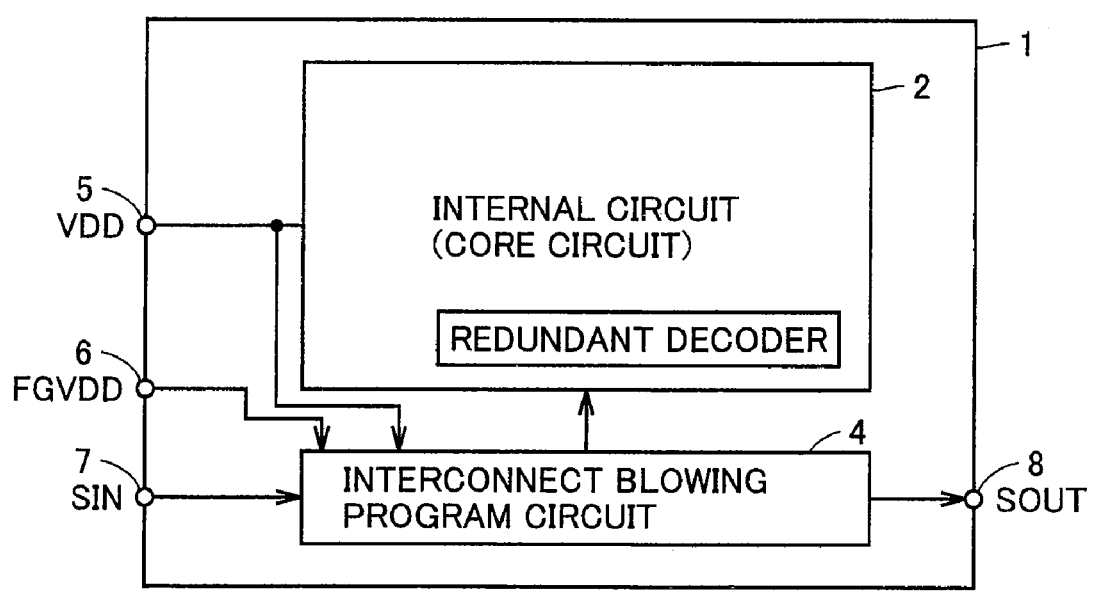
FIG. 1 schematically shows a whole construction of a semiconductor device according to the invention.

FIG. 1 schematically shows a whole construction of a semiconductor device according to a first embodiment of the invention. In FIG. 1, a semiconductor integrated circuit device 1 includes an internal circuit (core circuit) 2 implementing a predetermined function, and an interconnect blowing program circuit 4 for fixedly storing an operation state of internal circuit 2 or information defining the operation state (the information related to the internal circuit).

This semiconductor integrated circuit device 1 may be formed on a semiconductor chip singly, or may be integrated with another function block such as a processor or a memory on the same chip.

Internal circuit 2 receives, as an operation power supply voltage, a power supply voltage VDD from a power supply node 5, and implements a predetermined function. Internal circuit 2 is a core circuit of the semiconductor integrated circuit device, and it may be a memory circuit including a memory cell array, or may also be a processing device such as a processor, for example. Internal circuit (core circuit) 2 is merely required to have internal interconnections made using multiple interconnection layers of copper (Cu). In FIG. 1, internal circuit 2 is a memory circuit including a memory cell array, and there is shown, by way of example, a construction including a redundant decoder for repairing a faulty cell. The redundant decoder performs redundant replacement according to stored information of an interconnect blowing program circuit, for repairing the faulty cell.

An interconnect blowing program circuit 4 forms the fuse element, using an interconnects in internal core circuit 2 and a metal interconnect (copper (Cu) interconnect) in an upper layer among the metal interconnects (copper interconnects), and electrically blows the fuse element. Interconnect blowing program circuit 4 receives power supply voltage VDD applied from power supply node 5, and a fuse gate power supply voltage FGVDD applied from a fuse power supply node 6. Fuse gate power supply voltage FGVDD is used for a control voltage for passing a current through the fuse element in a blowing operation.

Interconnect blowing program circuit 4 includes a plurality of fuse elements arranged in parallel, as will be described later in detail. A scan path is employed for selectively programming blow or non-blow of each fuse element. In the scan path, flip-flops are provided corresponding to the fuse elements, respectively. Through the scan path formed of a series of the flip-flops, a serial input SIN is transferred from a node 7 so that fuse program information is set in the flip-flop corresponding to each fuse element, and stored information of the flip-flop is outputted as a serial output SOUT from an output node 8.

Interconnect blowing program circuit 4 uses a scan path formed of a series of registers (flip-flops) similar to a boundary scan register that is usually used in a semiconductor integrated circuit, and sets the program information about blow/non-blow of the fuse element. According to the information thus set, interconnect blowing program circuit 4 electrically blows the fuse elements. The number of fuse elements included in interconnect blowing program circuit 4 may be any, and the number of the flip-flops (registers) of the scan path is set according to the number of the fuse elements.

Figure 2:
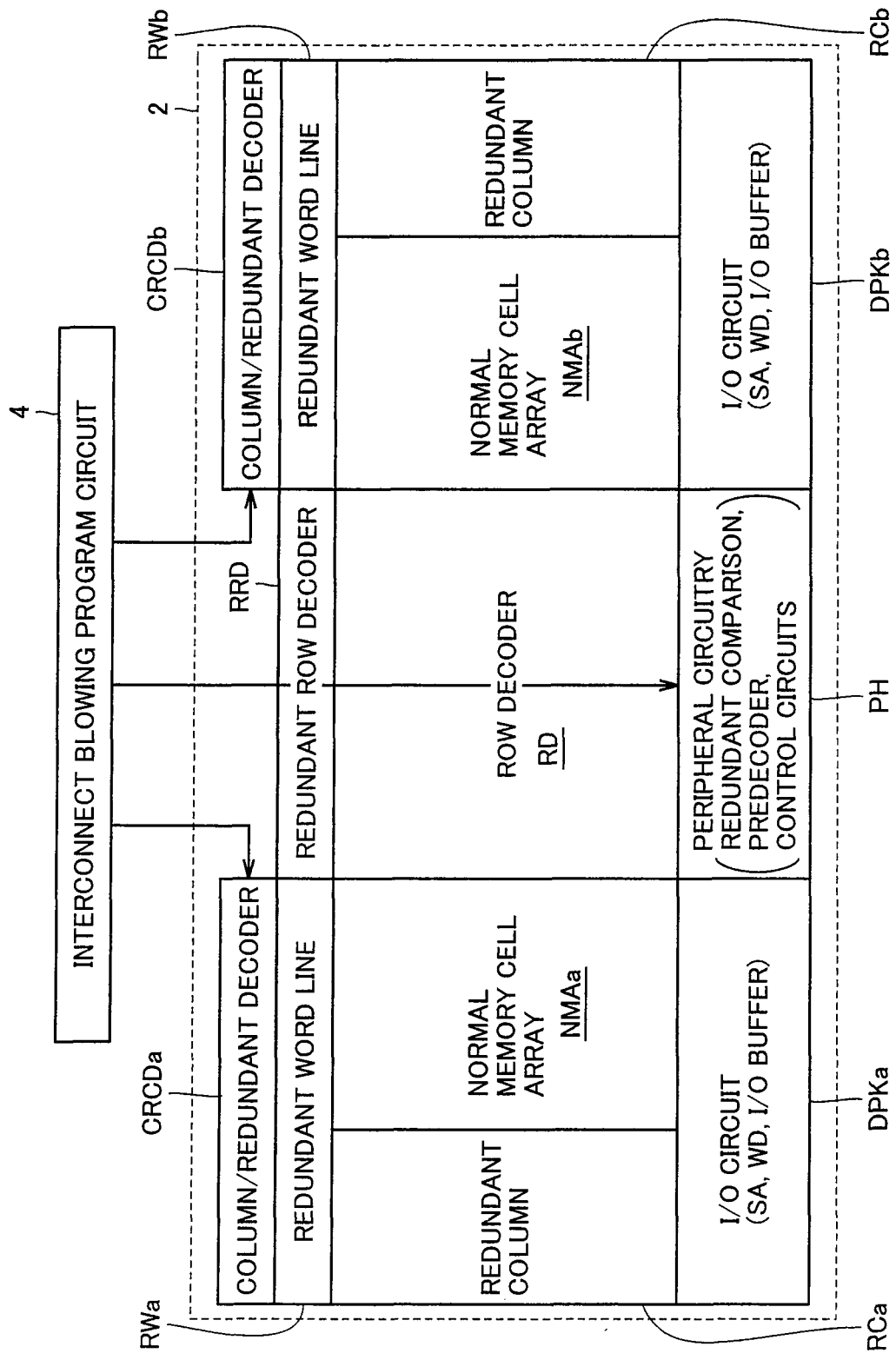
FIG. 2 shows an example of a construction of an internal circuit shown in FIG. 1.

FIG. 2 shows an example of the construction of internal circuit 2 shown in FIG. 1. In FIG. 2, internal circuit 2 is a semiconductor memory device. This semiconductor memory device may be integrated with another processor or the like in integrated circuit 1 to form an SOC (System On Chip), or the semiconductor memory device may be arranged alone as an internal circuit in semiconductor integrated circuit device 1.

In FIG. 2, an internal circuit (semiconductor memory device) 2 includes normal memory cell arrays NMAa and NMAb each having a plurality of normal memory cells arranged in rows and columns, redundant word lines RWa and RWb for replacing faulty cell rows in respective normal memory cell arrays NMAa and NMAb, and redundant columns RCa and RCb for replacing faulty cell columns in respective normal memory cell arrays NMAa and NMAb.

Each of redundant word lines RWa and RWb includes a plurality of redundant word lines, and repairs a faulty cell row by replacing the plurality of memory cell rows including the faulty cell row. Likewise, redundant columns RCa and RCb repair a faulty cell column by parallel replacement of a plurality of columns.

The internal circuit (semiconductor memory device) further includes a row decoder RD for selecting normal memory cell rows (word lines) in normal memory cell arrays NMAa and NMAb, a redundant row decoder RRD for selecting redundant word lines RWa and RWb, and column/redundant decoders CRCDa and CRCDb for selecting memory cell columns. Column/redundant decoders CRCDa and CRCDb each include a normal column decoder for selecting a normal memory cell column from the corresponding normal memory cell array NMAa, NMAb, and a redundant column decoder for selecting corresponding redundant column RCa, RCb.

Internal circuit (semiconductor memory device) 2 further includes I/O circuits DPKa and DPKb performing input/output of data with normal memory cell arrays NMAa and NMAb, respectively, and a peripheral circuit PH.

Peripheral circuit PH includes a row redundant determining circuit for determining match/mismatch between the program information supplied from interconnect blowing program circuit 4 and a received address signal (not shown), a control circuit for activating one of row decoder RD and redundant row decoder RRD and according to the output signal of the row redundant determining circuit and controls internal operations, and a predecoder for predecoding the received address signal. Each of row decoder RD and redundant row decoder RRD, when made active, decodes the row predecode signal received from the predecoder to select one word line.

Each of I/O circuits DPKa and DPKb includes sense amplifiers SA for sensing memory cell data in a read operation, write drivers WD for transferring data to be written to a memory cell in a write operation, and I/O (Input/Output) buffers for externally inputting and outputting the data to/from the internal circuit. Each of I/O circuits DPKa and DPKb performs input/output of data of multiple bits. For each data bit, a plurality of sense amplifiers SA and a plurality of write drivers are arranged. The sense amplifier and the write driver are selected for each bit according to a column address signal.

Each of column/redundant decoders CRCDa and CRCDb receives program information from interconnect blowing program circuit 4, and selectively performs the replacement with redundant column RWa or RWb based on comparison with the column address signal applied thereto.

For example, each of I/O circuits DPKa and DPKb performs input/output of 16 bits of data, and the eight sense amplifiers and the eight write drivers are arranged per bit. Each of normal memory cell arrays NMAa and NMAb is provided with normal memory cells arranged in 512 rows and 512 columns. In this structure, four normal memory cell columns (bit line pairs) are arranged for each sense amplifier and each write driver. Therefore, each of redundant columns RCa and RCb is used for replacing the four normal memory cell columns in parallel.

In interconnect blowing program circuit 4, an address of a faulty memory cell is programmed, and replacement with a redundant word line or a redundant column is performed when the address of the faulty memory cell is designated. Thus, the faulty memory cell is equivalently repaired, and the product yield is improved. The number of the repairable fault addresses is appropriately determined in view of a chip area, repair efficiency and others.

Figure 3:
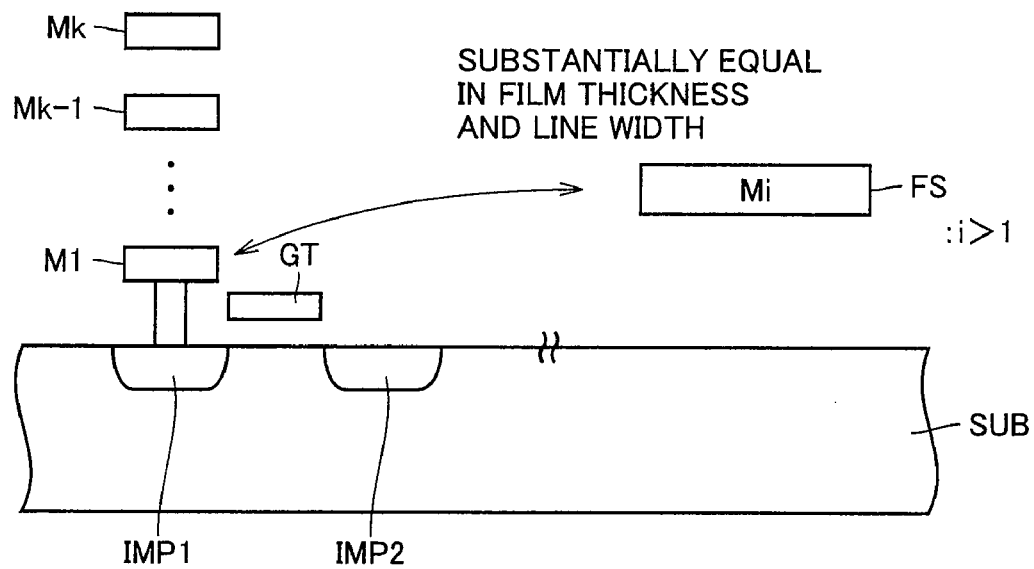
FIG. 3 schematically shows an interconnection structure including a fuse according to the invention.

FIG. 3 schematically shows an interconnection structure of interconnect blowing program circuit 4 shown in FIG. 1. In interconnect blowing program circuit 4 shown in FIG. 3, the first to k-th metal interconnects M1-Mk in respective metal interconnection layers of k in number are used for connection of internal elements such as transistor elements. Interconnect blowing program circuit 4 has impurity regions IMP1 and IMP2 formed at a surface of a semiconductor substrate region (or well region) SUB, and a gate electrode GT made of, e.g., polysilicon is arranged on a substrate region surface between impurity regions IMP1 and IMP2. First metal interconnection M1 is electrically connected to impurity region IMP1 via a contact. Gate electrode GT and impurity regions IMP1 and IMP2 form one MOS transistor (insulated gate field-effect transistor). For example, metal interconnects M1-Mk are each copper (Cu) interconnect.

A fuse element FS is formed using a copper interconnect in the metal interconnection layer above first copper interconnect M1. FIG. 3 shows an example in which fuse element FS is formed using interconnect Mi in the i-th metal interconnection layer where i is greater than 1. Since the metal interconnect may be made of metal other than copper, a term of "metal interconnect (interconnection layer)" is used in the following description.

As shown in FIG. 3, the first metal interconnect is located in the lowest layer in the semiconductor integrated circuit, and is patterned finest (for connections between transistors and connections to internal nodes). Therefore, first metal interconnect M1 is made small in width and in thickness, and may be suitable for blowing. However, in the semiconductor integrated circuit device such as an SOC of sub-100 nm et seq., fine patterns are also employed for the metal interconnections in fourth to sixth layers or higher, and the film thickness and the interconnection line width thereof are not significantly different from those of first metal interconnect M1. Among the upper layer interconnects of fine patterns, i-th metal interconnect Mi is used as the fuse of fuse element FS. The term of "fuse element" represents the element that includes the fuse, connection portions at the opposite ends of the fuse and a peripheral portion of the fuse.

The following advantages can be achieved by using i-th metal interconnect Mi as the fuse of fuse element FS. The process of blowing fuse element FS destroys a barrier metal (employed for preventing copper diffusion) and an interlayer insulating film (SiCN or SiCO) not shown in FIG. 3. If metal interconnect Mi in the upper layer is used for preventing such diffusion of copper in the blowing process, the upper layer metal interconnect Mi provides a larger margin in layout than first metal interconnect M1 in the lowest layer, and countermeasures against the diffusion on the layout can be taken more easily. Thus, the reliability after the blowing can be ensured even when the copper interconnect is used as the fuse element.

Figure 4:
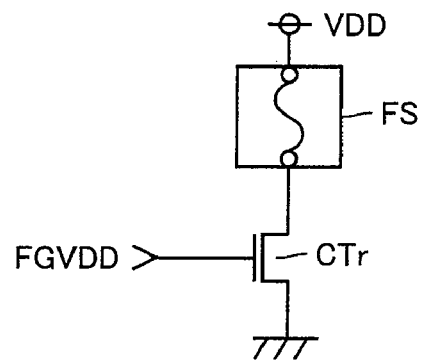
FIG. 4 schematically shows a construction of a fuse blowing portion in a fuse program circuit according to the invention.

FIG. 4 schematically shows a construction for one bit of the fuse circuit using fuse element FS shown in FIG. 3. In FIG. 4, the fuse circuit includes fuse element FS and a blowing current supply transistor CTr which are connected in series between the power supply node and the ground node.

The fuse element receives, on a first end, power supply voltage VDD from power supply node 5 shown in FIG. 1. Blowing current supply transistor CTr receives fuse gate power supply voltage FGVDD on its gate. For blowing fuse element FS, blowing current supply transistor CTr is turned on according to fuse gate power supply voltage FGVDD, to cause a current flow from the power supply node to the ground node. This current generates a Joule heat in fuse element FS, and the heat caused by the current blows fuse element FS through meltdown of the fuse. The power supply of fuse element FS is made common with power supply node 5 supplying power supply voltage VDD for core circuit (internal circuit) 2 shown in FIG. 1, so that the pads dedicated to the fuses are reduced in number.

Since the pad supplying fuse gate power supply voltage FGVDD is separately provided, the voltage level of fuse gate power supply voltage FGVDD can be adjusted independently of power supply voltage VDD, to optimize the quantity of the blowing current.

Specific constructions of interconnect blowing program circuit 4 will now be described.

[Construction 1 of the Interconnection Blowing Program]

Figure 5:
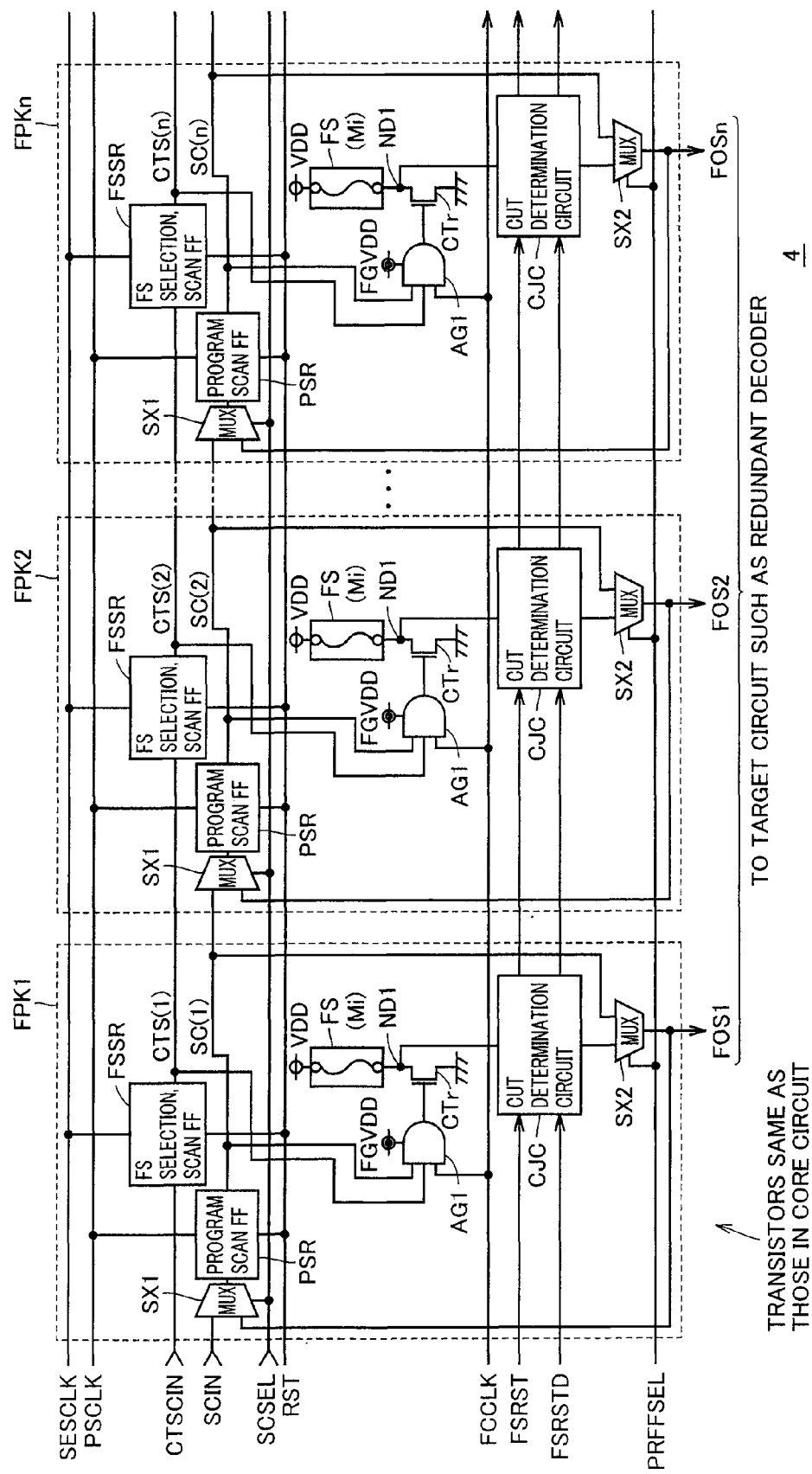
FIG. 5 shows a specific construction of the fuse program circuit according to the invention.

FIG. 5 shows an example of a specific construction of interconnect blowing program circuit 4 shown in FIG. 1. In FIG. 5, interconnect blowing program circuit 4 includes a plurality of cascaded fuse program circuits FPK1-FPKn each including the fuse circuit shown in FIG. 4. The number of fuse program circuits FPK1-FPKn is not restricted. Since fuse program circuits FPK1-FPKn have the same construction, the same or corresponding portions thereof are allotted the same reference numerals in FIG. 5.

Each of fuse program circuits FPK2-FPKn includes fuse element FS connected between a node supplying power supply voltage VDD and internal node ND1, blowing current supply transistor CTr connected between internal node ND1 and the ground node, and a 3-input AND circuit AG1 controlling turn-on of blowing current supply transistor CTr. AND circuit AG1 receives fuse gate power supply voltage FGVDD as the operation power supply voltage.

AND circuit AG1 receives an output signal of a corresponding FS select scan flip-flop (FF) FSSR, an output signal of a program scan flip-flop (FF) PSR, and a fuse cut clock signal FCCLK.

FS select scan flip-flop FSSR takes in the output data of the FS select scan flip-flop of the fuse program circuit in the preceding stage according to a fuse select scan clock signal SESCLK, and transfers it to the following stage. Program scan flip-flop PSR takes in the data supplied via a multiplexer (MUX) SX1 according to a program scan clock signal PSCLK, and transfers it to the next stage. Therefore, FS select scan flip-flops FSSR form a scan path that performs the shift operation according to fuse select scan clock signal SESCLK, and transfers the data. Program scan flip-flops PSR likewise form a scan path that successively performs the shift operation according to program scan clock signal PSCLK, and transfers the data.

A set of these flip-flops FSSR and PSR is arranged corresponding to the fuse circuit, whereby the programming (cut/non-cut) of fuse element FS in the fuse circuit can be executed selectively and successively one fuse element at a time. Also, the program information of the fuse elements can be transferred to the respective elements, using a small number of pads.

Each of fuse program circuits FPK2-FPKn includes a cut determination circuit CJC determining a cut state of fuse element FS according to the voltage level of node ND1, and a multiplexer SX2 that selects and outputs one of the output signal of program scan flip-flop PSR and the output signal of cut determination circuit CJC. The output signal of multiplexer SX2 is applied to multiplexer SX1. Multiplexer SX1 selects one of the output signal of program scan flip-flop PSR in the preceding stage and the output signal of corresponding multiplexer SX2 according to a scan select signal SCSEL. In the description, "to cut" represents the same meaning as "to blow".

Using multiplexer SX1, the output signal of multiplexer SX2 is transmitted to program scan flip-flop PSR. In a test operation, multiplexer SX2 selects the output signal of cut determination circuit CJC according to a program flip-flop select signal PRFFSEL, whereby the state of corresponding fuse element FS can be externally read out according to the output signal of cut determination circuit CJC. Thus, it is possible to determine whether cut failure occurs in fuse elements FS.

Multiplexer SX2 selects the output signal of program scan flip-flop PSRN, and multiplexer SX1 selects the output signal of multiplexer SX2 according to scan select signal SCSEL. Accordingly, each of fuse program circuits FPK1-FPKn can feed back and transfer in a loop manner the held data of program scan flip-flop PSR. Accordingly, program scan clock signal PSCLK can be set to a free-running state, and the degree in control and design of the clock signal can enhanced.

Multiplexers SX2 outputs program information FOS1-FOSn. Therefore, after the output signal of multiplexer SX2 is selected by multiplexer SX1 and is stored in corresponding program scan flip-flop PSR, multiplexer SX1 is set to the state for selecting flip-flop PSR in the preceding stage, and then successive transfer is performed via program scan flip-flops PSR. The transfer data is compared with write information by an external tester or a BIST (Built-In Self Tester), whereby it is possible to determine whether multiplexer SX2 is correctly performing the switching operation according to program flip-flop select signal PRFFSEL.

Fuse program circuit FPK1 in the initial stage has the same construction as fuse program circuits FPK2-FPKn except for the following point. Instead of the output signal applied from the fuse program circuit in the preceding stage, FS select scan flip-flop FSSR and program scan flip-flop PSR are supplied with cut control information CTSCIN applied from the external tester or the BIST (Built-In Self Tester) formed on the same chip and scan input SCIN for fuse programming, respectively.

Fuse program circuits FOS1-FOSn apply the output signals to corresponding circuits for setting the internal states, respectively. For example, when fuse program circuits FPK1-FPKn in the memory circuit shown in FIG. 2 store an address of a faulty memory cell, output signals FOS1-FOSn are applied to the redundant decoder for replacing the faulty cell with the redundant cell. In the determining operation for redundant replacement, as already described with reference to FIG. 2, it is determined whether the applied address matches with the fault address. When a match occurs between the addresses, the redundant cell at the fault address is selected instead of the cell (memory cell row or column) designated by the applied address.

When fuse program circuits FPK1-FPKn are used for determining an analog constant, output signals FOS1-FOSn thereof are applied to corresponding analog circuits, to adjust a resistance value of a resistance element or to adjust an amount of driving current of a transistor element.

A target circuit may be either of a redundant decoder or an analog circuit including a current source and a voltage source, and is merely required to have an operation manner or an operation state that is set according to the program information of the fuse program circuits. The information stored in the interconnect blowing program circuit is merely required to be related to the internal circuit.

The cycle in which fuse element FS is cut is defined according to the storage data in corresponding FS select scan flip-flop FSSR. Fuse program circuits FPK1-FPKn are successively and selectively supplied with the blowing currents according to the storage data of program scan flip-flops PSR and fuse cut clock signal SCCLK, and the corresponding fuse elements are selectively blown.

Each fuse element FS is supplied with voltage VDD from the power supply node of the core circuit. Therefore, it is possible to reduce the number of pads that are provided for fuse program circuits FPK1-FPKn, dedicatedly to the fuse blowing.

Transistors of fuse program circuits FPK1-FPKn and the control circuit (not shown) have the same structures (the same film thickness of the gate insulating film and the same material) as the transistors used in the core circuit (see FIG. 1). This suppresses increase in occupation area of interconnect blowing program circuit 4 and increase of manufacturing steps.

Usually, a large current (blowing current) from 20 mA to 40 mA is required for blowing fuse element FS. Therefore, if the power supply pad for fuse elements FS is separately provided from power supply 5 of the core circuit, a power supply pad dedicated to the fuse elements must be employed for each predetermined number of fuse elements for supplying a large blowing current. Therefore, if the many fuse elements are provided, a large number of the power supply pads must be provided (particularly, when a plurality of fuses are to be blown simultaneously). As will be described later in detail, however, fuse program circuits FPK1-FPKn sequentially and selectively execute the programming (blowing) of the fuses according to the program information so that the current consumption thereof is small. Accordingly, the power supply of the fuse circuits can be shared with the core circuit, and the number of pads can be reduced.

AND gate AG1 receives fuse gate power supply voltage FGVDD. In this case, it is merely required to drive the gate potential of blowing current supply transistor CTr, and AND circuit AG1 consumes only a small amount of current even when an AC current (alternate current) is taken into account. Therefore, even if a large number of fuse elements FS are provided, it is merely required to arrange one pad (node 6 in FIG. 1) for supplying fuse gate power supply voltage FGVDD, and the occupation area of interconnect blowing program circuit 4 can be small.

Multiplexer SX2 is used for selecting and outputting one of the storage data of program scan flip-flop PSR and the output signal of cut determination circuit CJC. Therefore, before cutting fuse element FS, a test can be performed by setting the target circuit such as the redundant decoder to the intended state according to the program information. Therefore, when the target circuit is the redundant decoder, e.g., in the memory, a test for determining whether the redundant decoder and redundant cells are normal can be performed by externally and sequentially applying redundant addresses and selecting the redundant cell rows/columns. Thereby, when a failure occurs, failure in cutting of the fuse element can be discriminated from a failure in the redundant cell related part.

Figure 6:
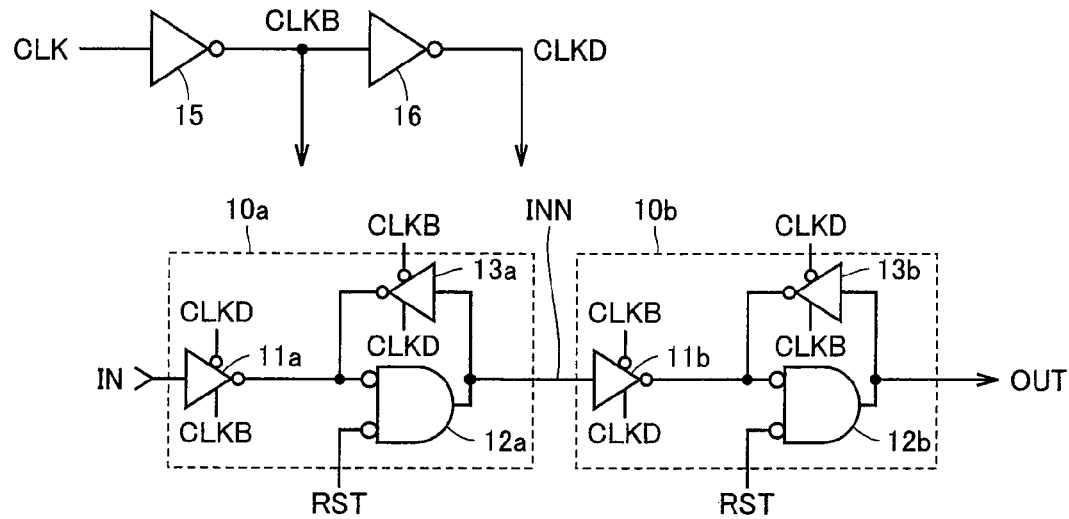
FIG. 6 shows examples of a construction of flip-flops shown in FIG. 5.

FIG. 6 shows an example of a construction of FS select scan flip-flop FSSR and program scan flip-flop PSR shown in FIG. 5. These scan flip-flops FSSR and PSR have the same construction, and therefore reference characters "FF" is used to generically indicate scan flip-flops FSSR and PSR in FIG. 6.

In FIG. 6, flip-flop FF includes a master latch 10a taking in and holding an input signal IN according to clock signals CLKB and CLKD of two phases, and a slave latch 10b that operates complementarily to master latch 10a according to clock signals CLKB and CLKD, and transfers the output signal of master latch 10a to produce an output signal OUT.

Clock signals CLKB and CLKD of two phases are produced from cascaded inverters 15 and 16 of two stages receiving basic clock signal CLK. Clock signal CLK corresponds to fuse select clock signal SESCLK and program select clock signal PSCLK shown in FIG. 5.

Master latch 10a includes a tristate inverter 11a receiving clock signals CLKD and CLKB of two phases, a 2-input NOR circuit 12a receiving a reset signal RST and an output signal of tristate inverter (clocked inverter) 11a, and a clocked inverter 13a that operates complementarily to clocked inverter 11a according to clock signals CLKB and CLKD, and is enabled to transfer an output signal of NOR circuit 12a to an input of NOR circuit 12a.

Slave latch 10b includes a clocked inverter 11b that is selectively activated according to clock signals CLKB and CLKD of two phases, to invert an output signal of master latch 10a, an NOR circuit 12b receiving reset signal RST and an output signal of clocked inverter 11b, and a clocked inverter 13b that is activated complementarily to clocked inverter 11b to transfer an output signal of NOR circuit 12b to an input of NOR circuit 12b.

Clocked inverters 11a and 13b are made active when clock signals CLKB and CLKD are at the H (logical high) and L (logical low) levels, respectively. Clocked inverters 13a and 11b are made active when clock signals CLKB and CLKD are at L and H levels, respectively.

Figure 7:
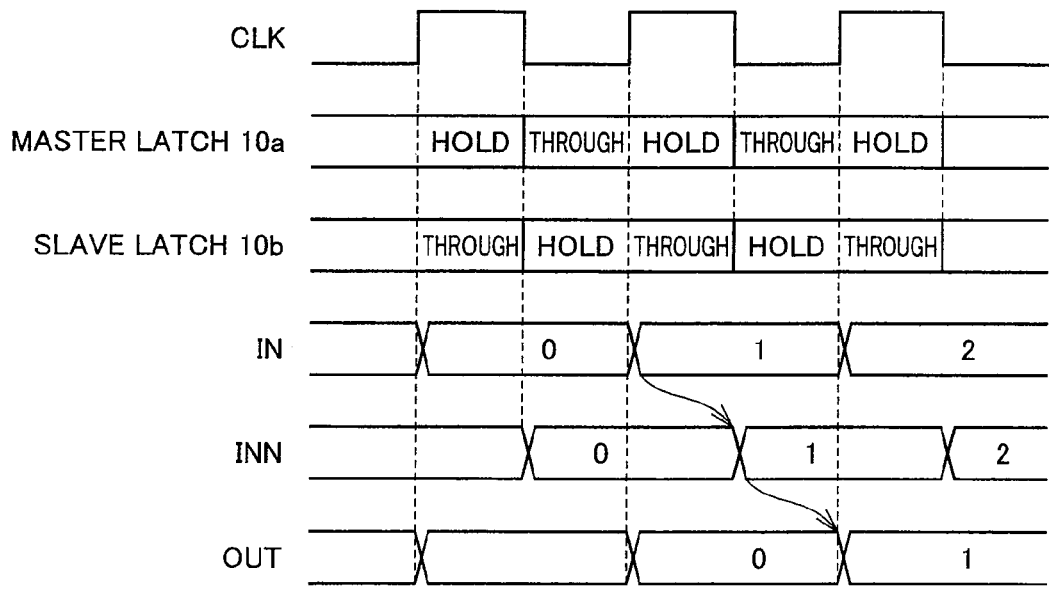
FIG. 7 is a timing chart representing operations of the flip-flop shown in FIG. 6.

FIG. 7 is a timing chart representing an operation of flip-flop FF shown in FIG. 6. Referring to FIG. 7, the operation of flip-flop FF shown in FIG. 6 will now be described.

When the flip-flop is operating, reset signal RST is at L level, and NOR circuits 12a and 12b operate as inverters. When clock signal CLK is at H level, clock signal CLKB is at L level, and clock signal CLKD is at H level. In master latch 10a, tristate or clocked inverter 11a enters an output high-impedance state, and clocked inverter 13a becomes active to operate as an inverter. Therefore, NOR circuit 12a and clocked inverter 13a form a latch circuit, and master latch 10a enters the holding state for holding a signal taken therein.

In slave latch 10b, clocked inverter 11b becomes active to operate as an inverter, and clocked inverter 13b is in the output high-impedance state. Therefore, tristate inverter 11b and NOR circuit 12b form a buffer circuit, and slave latch 10b enters a through state so that the data held by master latch 10a is transmitted through slave latch 10b, and is output as output signal OUT.

When clock signal CLK attains the L level, clock signals CLKB and CLKD attain the H and L levels, respectively. In master latch 10a, therefore, tristate inverter 11a becomes active to operate as an inverter. Tristate invention 13a enters the output high-impedance state. In this state, master latch 10a operates as an inverter buffer by tristate inverter 11a and NOR circuit 12a, and enters the through state to transfer input signal IN. In slave latch 10b, tristate inverter 11b enters an output high-impedance state, and tristate inverter 13b becomes active. Therefore, NOR circuit 12b and tristate inverter 13b form a latch circuit, which holds a signal INN taken by tristate inverter 11b.

Therefore, when input signal IN applied to master latch 10a changes in synchronization with the rising of clock signal CLK, output signal INN of master latch 10a changes in synchronization with the falling of clock signal CLK, and output signal OUT of slave latch 10b changes in synchronization with the rising of clock signal CLK. Thereby, one flip-flop FF transfers the signal with delay of one clock cycle. By cascading the flip-flops, it is possible to provide the scan path sequentially transferring the signal/data according to the clock signal.

Reset signal RST is made active in a one-shot pulse form at the time of power-on or start of the test sequence. When reset signal RST attains the H level, the output signals of NOR circuits 12a and 12b attain the L level, and flip-flop FF is set to hold L data. The storage data in the scan flip-flop corresponds to output signal INN of master latch 10a. Usually, the activation of reset signal RST is performed under the state where the clock signal is stopped. The L data is initially set in scan flip-flops FSSR and PSR shown in FIG. 4, and accordingly the output signal of each scan flip-flop is initially set to L level.

Figure 8:
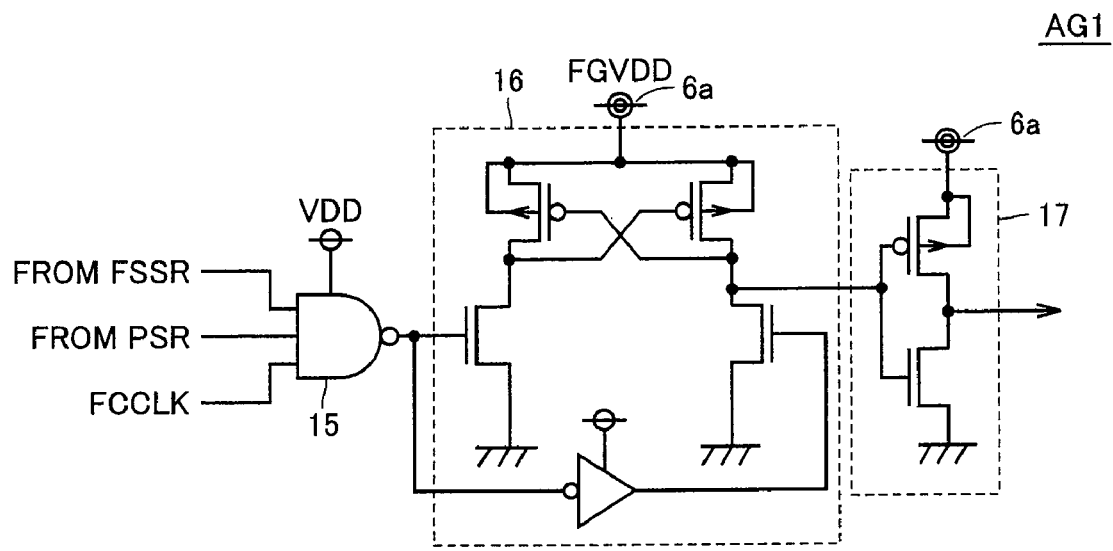
FIG. 8 shows an example of a construction of an AND circuit shown in FIG. 5.

FIG. 8 shows an example of the construction of AND circuit AG1 shown in FIG. 5. In FIG. 8, AND circuit AG1 includes a 3-input NAND gate 15 receiving power supply voltage VDD of the core circuit, a level converter 16 for converting an amplitude of an output signal of NAND gate 15 into the level of fuse gate power supply voltage FGVDD, and an inverter 17 for inverting an output signal of level converter 16. The gate voltage of blowing current supply transistor CTr shown in FIG. 5 is controlled according to an output signal of inverter 17.

As shown in FIG. 5, AND circuit AG1 receives the output signals of program scan flip-flop PSR and FS select scan flip-flop FSSR as well as fuse cut clock signal FCCLK. These signals each have an amplitude at the level of power supply voltage VDD of the internal circuit (core circuit). NAND gate 15 produces a signal of the amplitude of power supply voltage level according to these input signals (produces a signal at L level when all the inputs are at H level).

Level converter 16 and inverter 17 convert the amplitude of the output signal of NAND gate 15 to the level of fuse gate power supply voltage FGVDD. A power supply nodes 6a of level converter 16 and inverter 17 are coupled to fuse gate power supply node (pad) 6 shown in FIG. 1. Therefore, the gate voltage of blowing current supply transistor CTr in FIG. 5 can be adjusted by adjusting the voltage level of voltage FGVDD supplied from fuse gate power supply node 6. Thereby, the blowing current of fuse element FS can be adjusted, to optimize the blowing current for programming fuse element FS.

When the signal applied from fuse select scan flip-flop FSSR attains the H level, this indicates that the corresponding fuse program circuit is selected. Blow/non-blow of the fuse element is set according to H or L level of the signal applied from corresponding program scan flip-flop PSR. Specifically, when the signal of program scan flip-flop PSR is at H level, this indicates the cut of the corresponding fuse element.

Fuse cut clock signal FCCLK has a predetermined pulse width. Therefore, by adjusting the pulse width and the number of times of application of fuse cut clock signal FCCLK, it is possible to achieve the current pulse width and the number of times of current pulse application which are required for blowing the fuse element.

Figure 9:
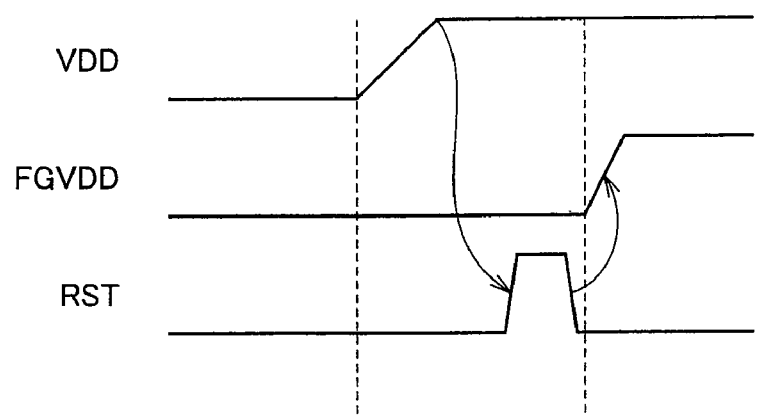
FIG. 9 represents a voltage application sequence in the fuse program circuit series shown in FIG. 5.

FIG. 9 schematically shows a supply sequence of fuse gate power supply voltage FGVDD and core circuit power supply voltage VDD. Referring to FIG. 9, the power supply sequence will now be described.

When core circuit power supply voltage VDD is supplied, the voltage level rises. At this time, fuse gate power supply voltage FGVDD is maintained at a voltage level (the ground voltage level in FIG. 9) lower than a threshold voltage Vth of blowing current supply transistor CTr.

When core circuit power supply voltage VDD becomes stable, reset signal RST is produced, e.g., in the form of a one-shot pulse according to a power-on reset signal. When reset signal RST becomes active, flip-flop FF stores the L data as shown in FIG. 6. Therefore, output signal OUT of scan flip-flops FSSR and PSR shown in FIG. 5 is fixed to L level. Thus, the output signal of AND circuit AG1 is initialized to L level. In this state, blowing current supply transistor CTr is reliably set to the off state, and can prevent flow of a through current via the uncut fuse element at the time of power-up.

Upon supplying core circuit power supply voltage VDD, fuse gate power supply voltage FGVDD is kept at the voltage level lower than threshold voltage Vth of blowing current supply transistor CTr. If fuse gate power supply voltage FGVDD is at the voltage level higher than threshold voltage Vth of blowing current supply transistor CTr at the time of power-up, the output signal of AND circuit AG1 attains an unstable H level, and may turn on blowing current supply transistor CTr. The gate voltage of blowing current supply transistor CTr in the uncut fuse element is set to the lower level than threshold voltage Vth of blowing current supply transistor CTr, to prevent the flow of a large through current.

In level converter 16, the internal node may attain an intermediate voltage level according to the unstable output signal of NAND gate 15. In this case, fuse gate power supply voltage FGVDD is kept at the voltage level lower than threshold voltage Vth of blowing current supply transistor CTr, whereby the output signal of inverter 17 can be kept at a voltage lower than threshold voltage Vth of blowing current supply transistor CTr, and the turn-on of blowing current supply transistor CTr can be prevented.

Therefore, after the power is turned on, fuse gate power supply voltage FGVDD is set to the voltage level lower than threshold voltage Vth of blowing current supply transistor CTr until reset signal RST is made active, to prevent a large current from flowing from the power supply node to the ground node.

Fuse gate power supply voltage FGVDD and core circuit power supply voltage VDD are supplied from circuitry outside the semiconductor integrated circuit device as shown in FIG. 1. Therefore, fuse gate power supply voltage FGVDD is supplied (i.e., the voltage level thereof is raised) after an external power supply controller produces reset signal RST, using a power-on reset signal applied at the start of supply of power supply voltage VDD, to internally initialize interconnect blowing program circuit 4. To this end, it is merely required to control a power supply sequence by a sequence controller such as a processor.

Figure 10:
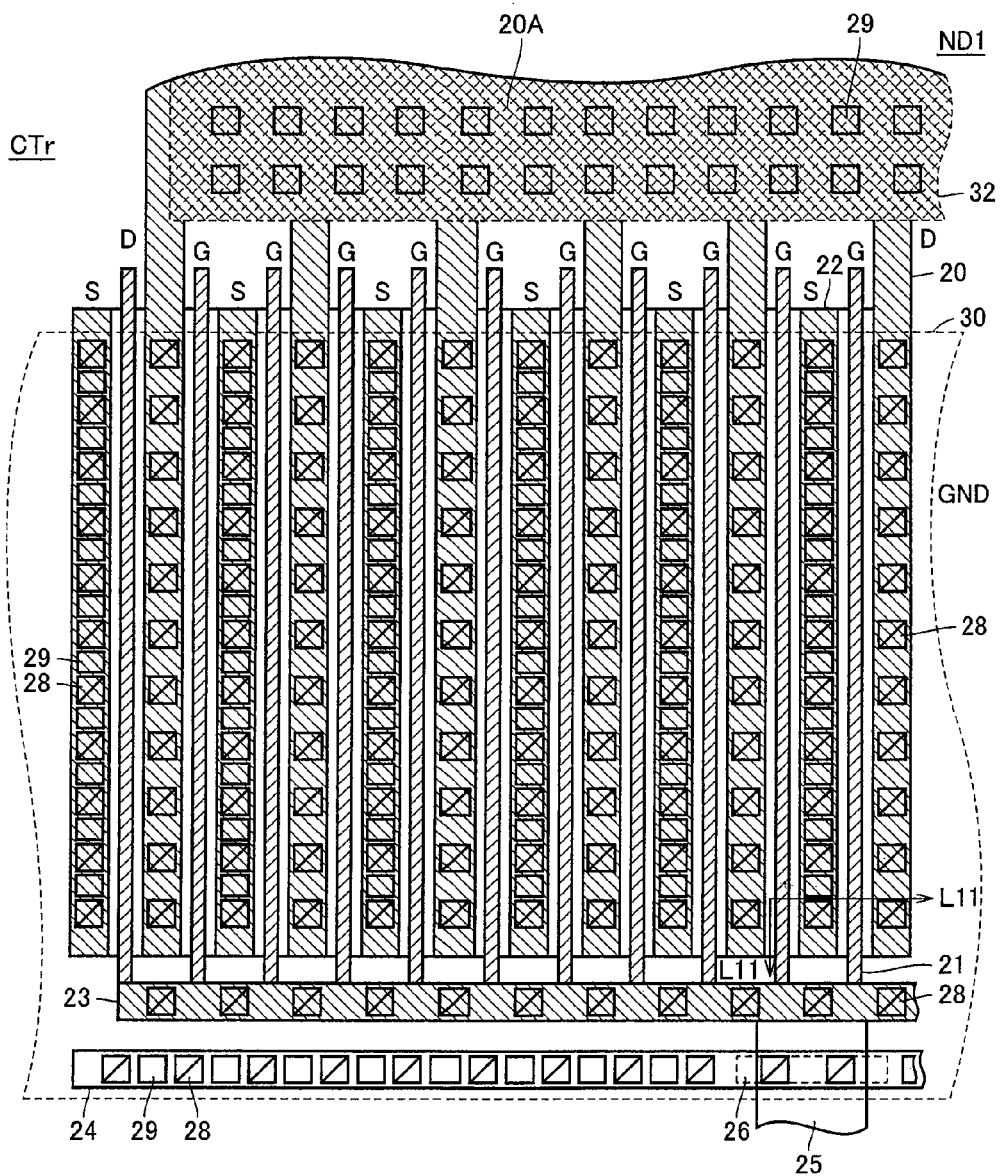
FIG. 10 shows an example of a planar layout of blowing current supply transistors shown in FIG. 5.

FIG. 10 schematically shows a planar layout of blowing current supply transistor CTr shown in FIG. 5. In FIG. 10, multilayer metal interconnects 20 forming drain electrodes D and multilayer metal interconnects 22 forming source electrodes S are arranged alternately to each other. Gate electrode interconnects (polysilicon interconnects) forming gate electrodes G are arranged between multilayer metal interconnects 20 and 22. Each of multilayer metal interconnects 20 and 22 includes interconnects in two interconnection layers, which are interconnected to form one electrode interconnect.

In a layer above these metal interconnects 20 and 22, there are arranged upper (third) metal interconnects 30 extending in a direction crossing metal interconnects 20 and 22. Metal interconnects 30 transmit a ground voltage GND.

Multilayer metal interconnects 20 forming drain electrodes D are interconnected through first vias 28 arranged at predetermined intervals (and finally, the metal interconnect forming a node ND1 connects all multilayer metal interconnects 20 together). Specifically, a wide metal interconnection bed 20A is arranged at the termination ends of multilayer metal interconnects 20, each of which is connected to metal interconnection bed 20A. An upper metal interconnect 32 located in the same layer as upper metal interconnect 30 is arranged above interconnection bed 20A in the termination end. Termination end 20A is coupled to upper metal interconnect 32 through second vias 29, to form node ND1.

Multilayer metal interconnect 22 forming source electrode S is provided with first and second vias 28 and 29 arranged alternately to each other in the extending direction of multilayer metal interconnect 22. Through second via 29, multilayer metal interconnect 22 is electrically connected to upper metal interconnect 30. Through first vias 28, the interconnects of multilayer metal interconnect 22 are interconnected, and are electrically connected to the active region provided below. Thus, source electrodes S of blowing current supply transistor CTr are commonly coupled to the ground node.

Gate electrode interconnects 21 forming gate electrodes G have termination ends that are interconnected by a metal interconnect 23 and vias 28. Metal interconnect 23 is likewise a multilayer metal interconnect, of which metal interconnect in a lower layer interconnects gate electrode interconnects 21, and is connected to a corresponding metal interconnect in an upper layer through first vias 28. Multilayer metal interconnect 23 is connected via a leading-out interconnect 25 to an interconnect 25 transmitting an output signal of AND circuit AG1.

A metal interconnect 24 is arranged parallel to metal interconnect 23. Metal interconnect 24 is electrically connected to a metal interconnect 30 in an upper layer through vias 29, and is electrically connected to an active region in a lower layer through vias 28. A metal interconnect 26 is arranged in a position where metal interconnect 24 crosses leading-out metal interconnect 25, for establishing electrical connection between active regions. In the region where leading-out interconnect 25 is arranged, ground voltage GND is transmitted to the substrate region therebelow.

Metal interconnect 24 keeps the substrate region (well region) of blowing current supply transistor CTr at the level of ground voltage GND transmitted on interconnect 30.

A plurality of unit transistors each having a large gate width are arranged in parallel to implement blowing current supply transistor CTr for supplying a large blowing current.

Interconnect 30 may be used as a virtual ground line as described later.

Figure 11:
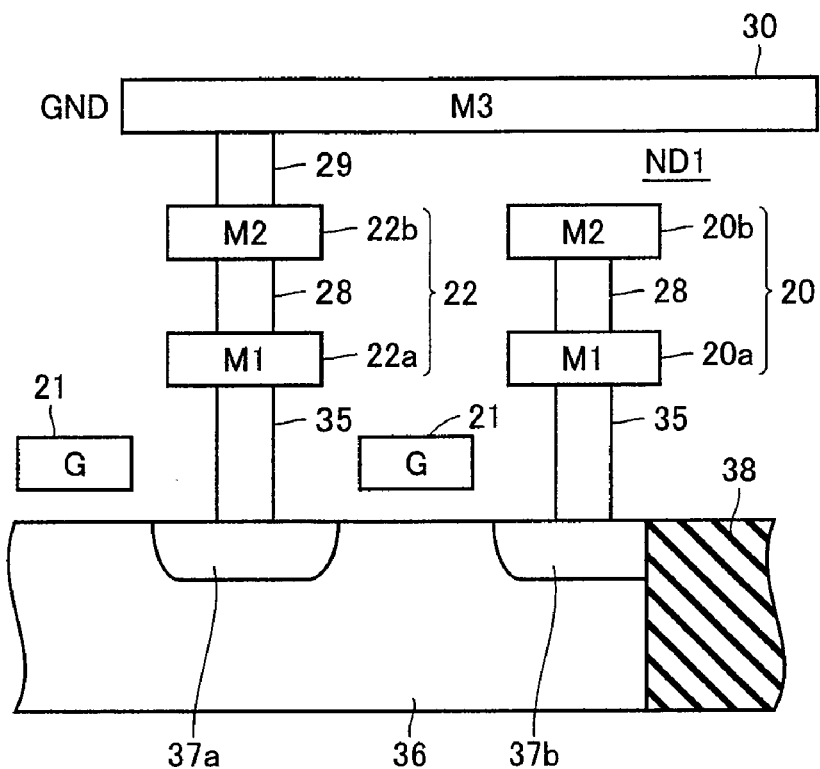
FIG. 11 schematically shows a sectional structure taken along line L11-L11 in FIG. 10.

FIG. 11 schematically shows a sectional structure taken along line L11-L11 shown in FIG. 10. In FIG. 11, upper metal interconnect 30 (e.g., a third metal interconnect M3) is coupled to multilayer metal interconnect 22 through second via 29. Multilayer metal interconnect 22 includes a metal interconnect (first metal interconnect M1) 22a in a lower layer, and a metal interconnect (second metal interconnect) 22b in an upper layer arranged parallel to first metal interconnect 22a. These metal interconnects 22a and 22b are electrically connected to each other through first via 28. Metal interconnect 22a in the lower layer is electrically connected to an impurity region 37a formed at a surface of a substrate region 36 through a contact 35.

Multilayer metal interconnect 20 forming node ND1 includes a metal interconnect (first metal interconnect M1) 20a in a lower layer and a metal interconnect (second metal interconnect M2) 20b in an upper layer. These metal interconnects 20a and 20b are electrically interconnected through first via 28. Metal interconnect (first metal interconnect M1) 20a in the lower layer is electrically connected to an impurity region 37b formed at substrate region 26 through contact 35. Gate electrode interconnect 21 of polysilicon forming gate electrode G is arranged between impurity regions 37a and 37b. Substrate region 36 is formed of, e.g., the well region, and is isolated from other fuse program circuits by an isolating region 38.

Gate electrode interconnect 21 and impurity regions 37a and 37b implement the unit transistor for forming blowing current supply transistor CTr. Therefore, the interconnects in the multiple layers form an interconnect to couple source electrode S of blowing current supply transistor CTr to the ground node as well as an electrode interconnect to connect a drain of the current supply transistor to the fuse element, and the current is caused to flow dispersedly to the respective interconnects.

Figure 12:
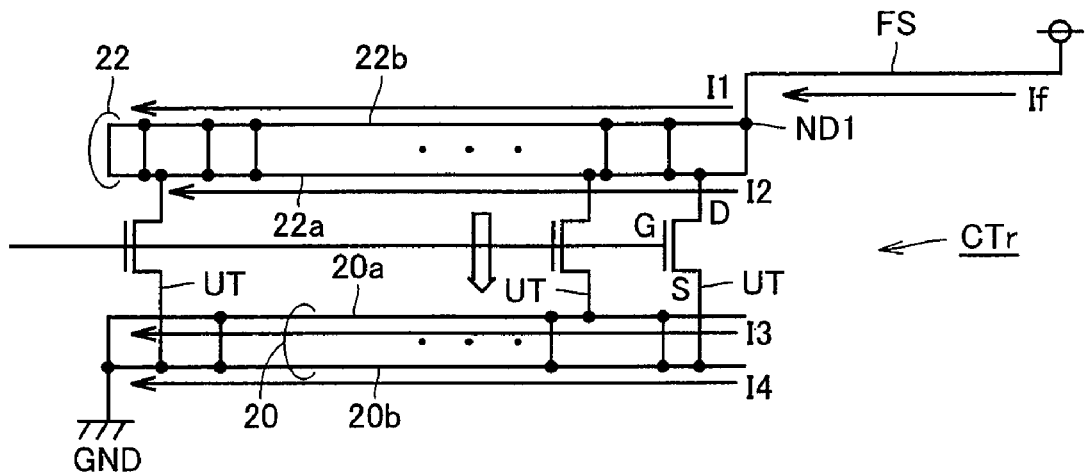
FIG. 12 schematically shows a path of a current in an interconnection structure shown in FIG. 11.

FIG. 12 shows an electrically equivalent circuit for fuse element FS and blowing current supply transistor CTr. Fuse element FS is formed of the metal interconnect in the third or higher metal interconnect. Fuse element FS is coupled to multilayer metal interconnect 22. Unit transistors UT are connected in parallel between multilayer metal interconnects 22 and 20. Unit transistors UT are components of blowing current supply transistor CTr, and each are formed of one multilayer interconnect 20, one multilayer interconnect 22 and one gate electrode interconnect 21 in FIGS. 10 and 11. Gates of these unit transistors UT are coupled in common.

When a current If flows in blowing fuse element FS, this current If in multilayer metal interconnect 22 is shunted into currents I1 and I2 that flow through metal interconnects 22a and 22b, respectively, and these currents flow through unit transistors UT. The currents passing through unit transistors UT flow to metal interconnects 20a and 20b of multilayer metal interconnect 20, so that currents I3 and I4 flow through metal interconnects 20a and 20b, respectively. Therefore, each of these currents I1-I4 is equal to or smaller than half times the current If flowing through fuse element FS. This prevents such a situation that blowing current If blows a source electrode interconnect (S) or a drain electrode interconnect (D) of the blowing current supply transistor before fuse element FS is blown off. Thus, fuse element FS can be reliably blown by passing a relatively large blowing current of 20 mA-40 mA.

[Modification of Fuse Program Circuit]

Figure 13:
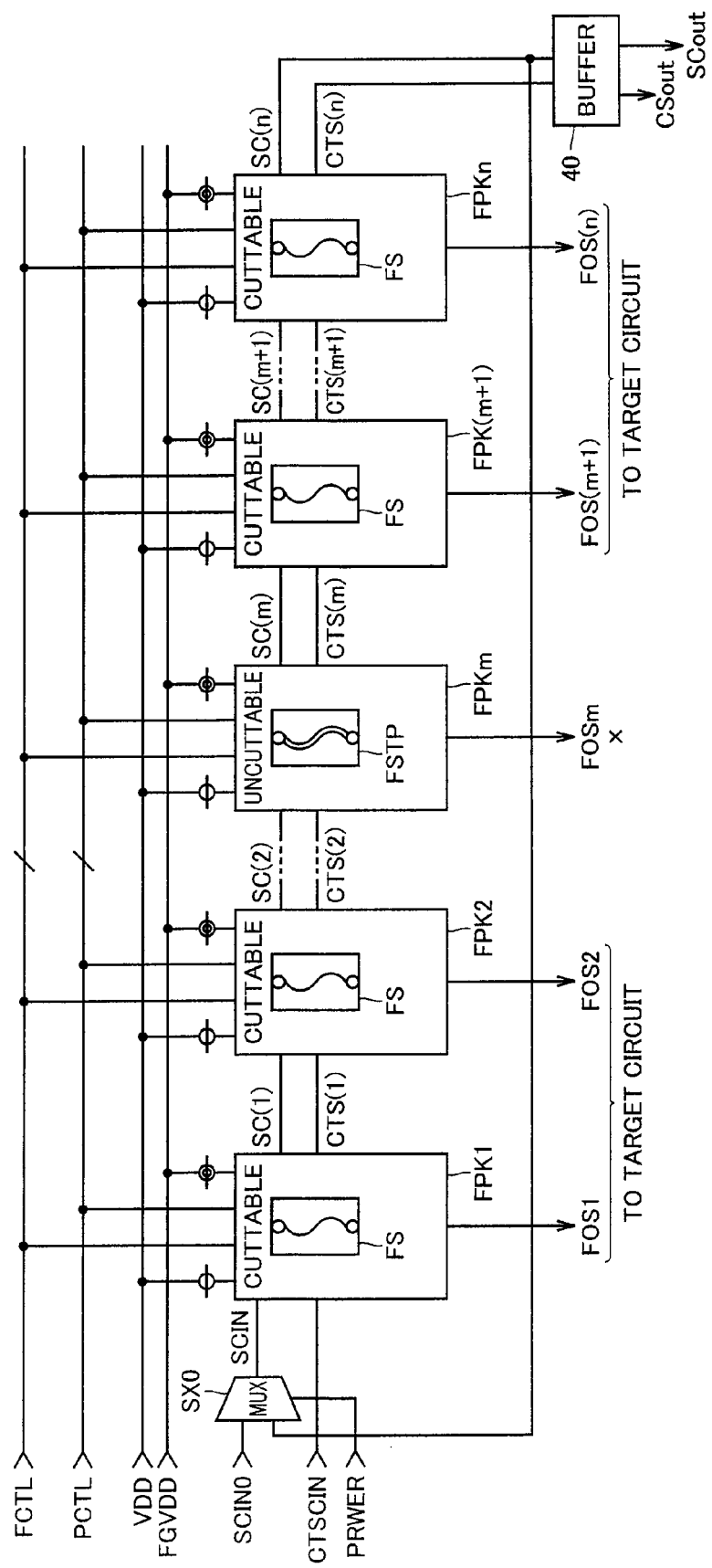
FIG. 13 shows a modification of the fuse program circuit according to the invention.

FIG. 13 shows a modification of the fuse program circuit according to the first embodiment of the invention. In FIG. 13, fuse program circuits FPK1-FPKn are cascaded. Fuse program circuits FPK1-FPKn are the same in circuit structure as fuse program circuits FPK1-FPKn shown in FIG. 4. To fuse program circuit FPK1 at the initial stage, there is arranged a multiplexer SX0 that selects one of a scan-in signal SCIN0 applied external to the scan path and a scan-out signal SC(n) of fuse program circuit FPKn at the final stage according to multiplexer select control signal PRWER. An output SCIN of multiplexer SX0 corresponds to program scan-in input SCIN shown in FIG. 5.

Fuse program circuit FPKn at the final stage applies its output signals SC(n) and CTS(n) to a buffer 40. Buffer 40 outputs scan output signals SCout and CSout. Scan output signal CSout corresponds to the data transferred via FF select scan flip-flops FSSR shown in FIG. 5, and scan output signal SCout corresponds to the output signal of program scans flip-flop PSR shown in FIG. 5.

Program scan-out signal SC(n) of the final stage fuse program circuit FPKn is fed back to the initial stage fuse program circuit FPK1 via multiplexer SX0. Even when in fuse program circuits FPK1-FPKn, the data stored in the program scan flip-flops are sequentially read out via buffer 40 through the scan-out operation, the data are transferred through the feedback path to fuse program circuits FPK1-FPKn for rewriting. Therefore, it is possible to prevent destruction of the internal storage information of program scan flip-flops PSR when stored information of each program scan flip-flop PSR is externally read or when the output signal of the cut determination circuit is externally read.

Each of fuse program circuits FPK1-FPKn receives power supply voltage VDD and fuse gate power supply voltage FGVDD, and also receives a fuse-cut related control signal FCTL and program information control related information PCTL. Fuse-cut related control signal FCTL represents a signal (a clock signal and a reset signal) controlling the transferring operation of FS select scan flip-flops FSSR shown in FIG. 5. Program control signal PCTL corresponds to a signal (a reset signal and a clock signal) controlling the transferring operation of program scan flip-flops PSR shown in FIG. 5.

These control signals FCTL and PCTL, scan inputs SCIN0 and CTSCIN, and multiplexer select control signal PRWER are applied from a tester outside the chip, or is produced from a BIST (Built-In Self-Test circuit) inside the chip. The output signal of buffer 40 is applied to the external tester or the BIST.

Output signals FOS1-FOS(m−1) and FOS(m+1)-FOS(n) of the select determination circuits of fuse program circuits FPK1-FPK(m−1) and FPK(m+1)-FPKn are applied to a target circuit such as a memory or a redundant decoder. However, fuse program circuit FPKm does not apply the output signal of the cut determination circuit, i.e., fuse program information FOS to the target circuit. Fuse program circuit FPKm has fuse element FSTP having a line width that is, e.g., ten times larger than those of fuse elements FS included in other fuse program circuits FPK1-FPK(m−1) and FPK(m+1)-FPKn. Therefore, fuse elements FS of fuse program circuits FPK1-FPK(m−1) and FPK(m+1)-FPKn can be blown off by the blowing current, but fuse element FSTP cannot be blown off by the blowing current used for fuse element FS.

Uncuttable fuse element FSTP is arranged as the fuse element in fuse program circuit FPKm, to make it possible to check the capability of blowing current supply transistor CTr, to adjust the voltage levels of power supply voltage VDD and fuse gate power supply voltage FGVDD, for setting an optimum blowing current value.

Figure 14:
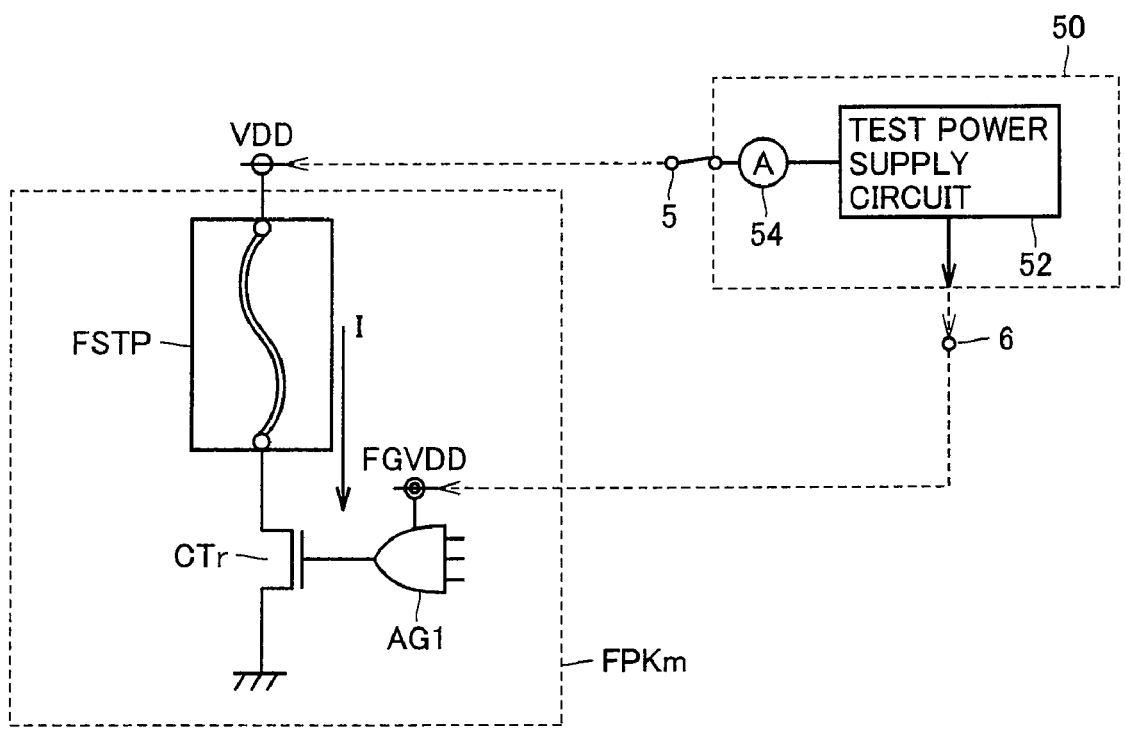
FIG. 14 schematically shows a construction of fuse drive current measuring circuitry in FIG. 13.

FIG. 14 schematically shows an arrangement for current measurement of fuse program circuit FPKm. In FIG. 14, a tester 50 includes a test power supply circuit 52 producing power supply voltages VDD and FGVDD, and an ammeter 54 for detecting a current of a power supply line transmitting power supply voltage VDD from test power supply circuit 52 to fuse program circuit FPKm through power supply node 5. Tester 50 may be a BIST or a test apparatus arranged outside the chip. Test power supply circuit 52 supplies fuse gate power supply voltage FGVDD through fuse gate power supply node 6 to the power supply node of AND circuit AG1 of fuse program circuit FPKm.

Test power supply circuit 52 adjusts the voltage levels of power supply voltages VDD and FGVDD. Blowing current supply transistor CTr receives fuse gate power supply voltage FGVDD on its gate when made conductive. Therefore, the driving current (drain current) of blowing current supply transistor CTr can be adjusted according to the relationship between power supply voltage VDD and fuse gate power supply voltage FGVDD. Ammeter 54 provided in tester 50 detects a current I flowing through fuse element FSTP and blowing current supply transistor CTr, and power supply voltage VDD and/or fuse gate power supply voltage FGVDD are adjusted to the voltage level(s) corresponding to the optimum value(s) such as design specification value. Thereby, the blowing currents of other fuse program circuits FPK1-FPK(m−1) and FPK(m+1)-FPKn can be optimized to the optimum current.

Ammeter 54 may be formed of a current comparing circuit that merely determines whether current I flowing through fuse program circuit FPKm is larger than a predetermined value.

[Modification of Fuse Program Circuit Scan Path]

Figure 15:
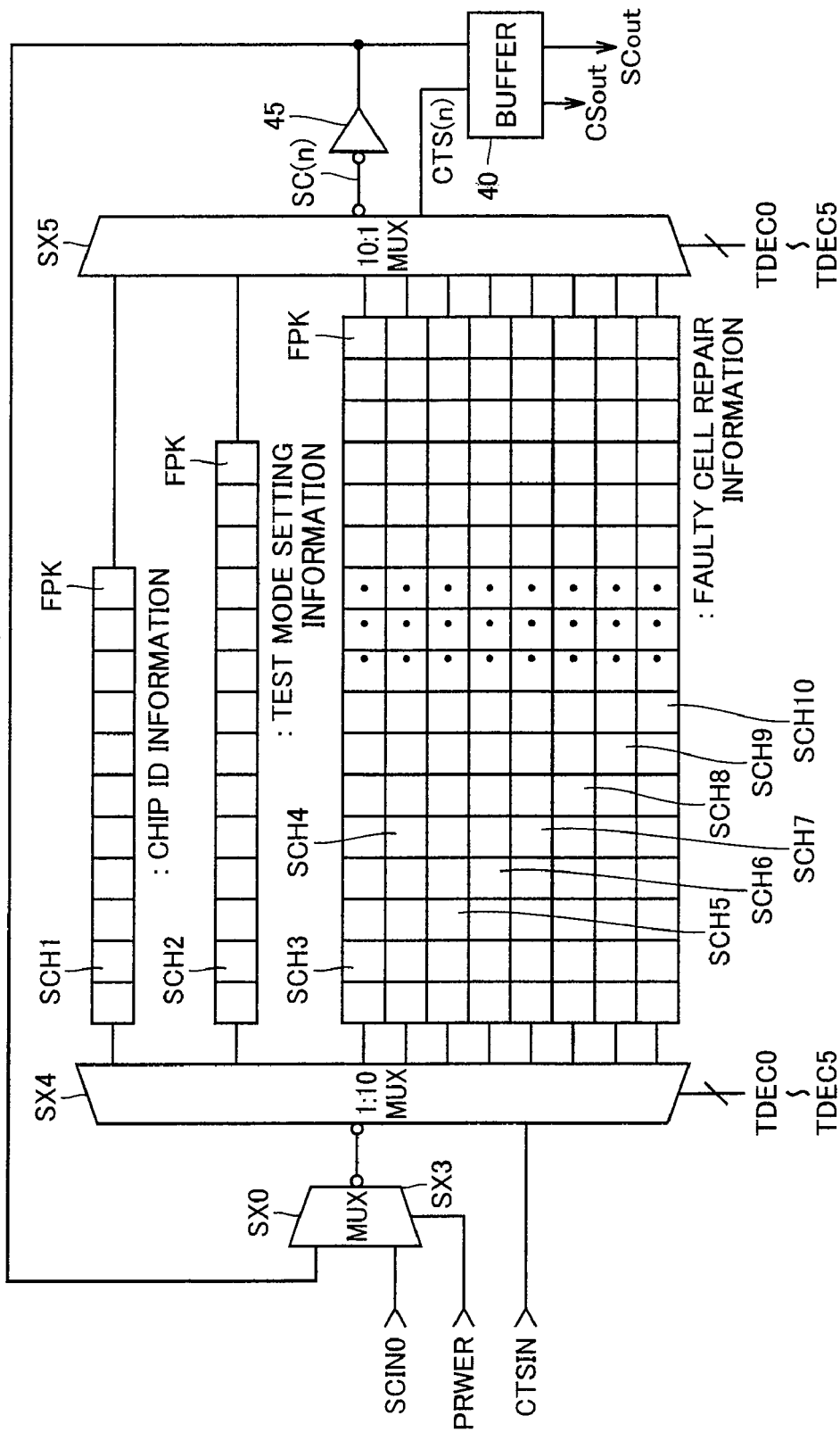
FIG. 15 shows a modification of the fuse program circuitry shown in FIG. 5.

FIG. 15 shows a modification of a scan path of the fuse program circuit of the semiconductor device according to the invention. In FIG. 15, the scan path of the fuse program circuit is divided into a plurality of scan chains (sub-scan paths) SCH1-SCH10. FIG. 15 shows, by way of example, ten divided scan chains SCH1-SCH10, but the number of divided scan chains is not restricted to ten.

For scan chains SCH1-SCH10, there are arranged a one-to-ten multiplexer SCV4 that performs a one-to-ten demultiplexing operation according to decode signals TDEC0-TDEC5 as well as a ten-to-one multiplexer (MEX) SCX5 that selects one of scan chains SCH1-SCH10 according to decode signals TDEC0-TDEC5.

One-to-ten multiplexer SCX4 at the input stage receives the output signal of multiplexer SX0, which in turn receives scan input SCIN0 as well as scan output signal SC(n) of ten-to-one multiplexer SCX5 at the output stage applied through an inverter 45. Inverter 45 applies its output to buffer 40, which in turn produces scan output SCout. Buffer 40 is also supplied with an output signal CTS(n) of the FS select scan flip-flop series, to shift out scan output SCout.

Multiplexer SX0 in the input initial stage selects one of externally applied input signal SCIN0 and the feedback information applied from inverter 45 according to multiplexer select control signal PRWER. One-to-ten multiplexer SCX4 and ten-to-one multiplexer SCX5 select one scan chain according to a combination of logic levels of decode signals TDEC0-TDEC5. These multiplexers SCX4 and SCX5 transfer fuse select input information CTSIN and CTS(n). Multiplexers SCX4 and SCX5 merely set the transmission path of the signal (fuse cut control information) for one scan chain according to the combination of logic levels of decode signals TDEC0-TDEC5.

For the control signals (the fuse program transfer control signal and program information transfer control signal), the control signal transfer path is likewise selected for one scan chain. For example, a common control signal is applied to the scan chains, and one of the select gates provided for the respective scan chains and the select gate for the selected scan chain is enabled.

Using inverter 45, the program information read from the scan chain is fed back via multiplexers SX0 and SX5, and the program information stored in the scan chains is sequentially and externally read via buffer 40 by the transfer operation, so that it is possible to determine whether the programming is accurately performed. In reading the signal/data, the shift operation is performed in the scan path. The feedback path allows rewriting of the program information into the original flip-flop to prevent the loss of stored information.

As shown in FIG. 15, since the scan path is divided into a plurality of scan chains SCH1-SCH10, the propagation path of the scan chain can be short, and the number of stages of flip-flops in each scan chain can be reduced. Therefore, it is possible to suppress occurrence of a failure in a scan path, and the lowering of yield of the scan path can be prevented. In this case, a spare scan chain may be employed, and a faulty scan chain may be replaced with the spare scan chain for repairing the failure in the scan path itself.

Scan chains SCH1-SCH10 are grouped depending on the program information. For example, scan chain SCH1 stores information for identifying the chip, a lot number, a wafer number, the coordinates on the wafer and a chip ID number.

Scan chain SCH2 stores, as test mode setting information, bits for indicating the test mode and control bits for controlling the test state in the test mode. The test mode bits are stored, as the test mode setting information, in fuse program circuit FPK of scan chain SCH2, whereby a plurality of different test modes can be set in one test mode instructing cycle. Also, adjustment of a resistance value such as adjustment of a reference current amount is performed according to the control bit information.

When the semiconductor device is a memory, each of scan chains SCH3-SCH10 stores the addresses indicating a redundant column and a redundant row for the redundant replacement and indicating the position of each faulty cell. For example, when one scan chain is provided with fuse program circuits FPK of 140 bits and 35 bits are allocated as the row and column addresses for a memory macro of 512 Kbits, each of scan chains SCH3-SCH10 can store the failure addresses for the memory block of 2 Mbits. Therefore, eight scan chains SCH3-SCH10 can program the failure addresses for the memory of a storage capacity of 16 Mbits. Accordingly, the failure repair can be achieved through the redundant replacement in units of memory blocks.

The above kind of the program information stored in scan chains SCH1-SCH10 is merely an example, and the program information to be stored can be appropriately determined according to the construction of the semiconductor device employing fuse program circuits FPK.

Each of scan chains SCH1-SCH10 has substantially the same construction as the scan path of the fuse program circuits shown in FIG. 5. Each of fuse program circuits FPK in scan chains SCH1-SCH10 outputs the program information (produced by blowing or non-blowing the fuse element) through multiplexer SX2 as shown in FIG. 5, and therefore the above program information is output in parallel, and is applied to the target circuit such as the redundant decoder.

The program information of scan chain SCH2 is applied to the test control circuit, and is used for setting the test operation in a test mode.

[Construction of Cut Determination Circuit]

Figure 16:
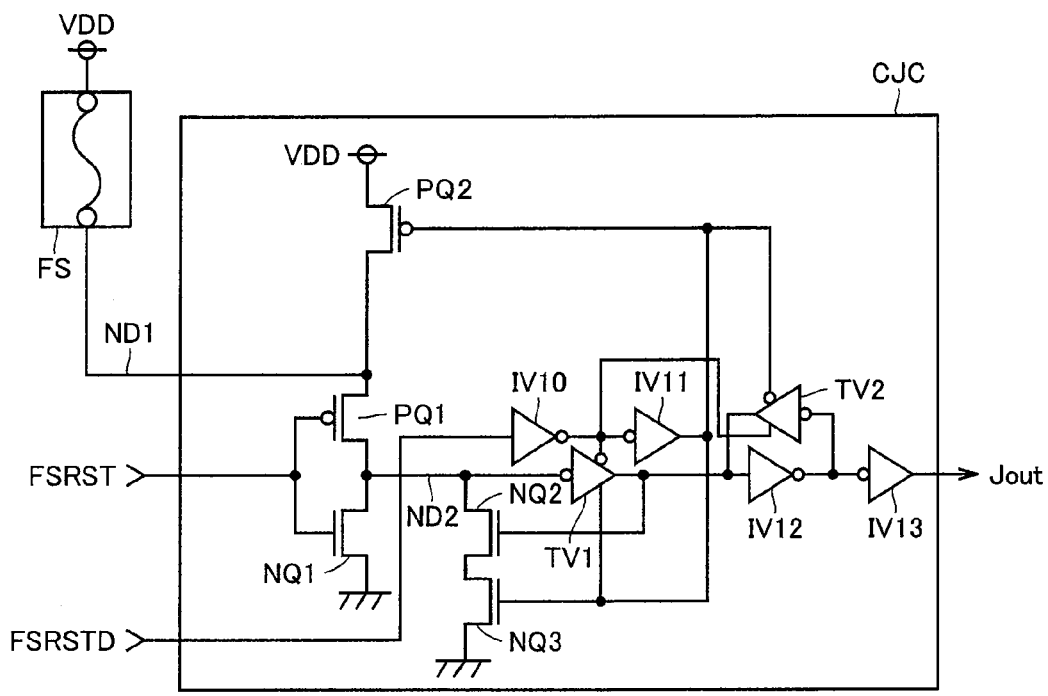
FIG. 16 shows an example of a construction of a cut determining circuit shown in FIG. 5.

FIG. 16 shows an example of a construction of cut determination circuit CJC included in the fuse program circuit according to the first embodiment of the invention. In FIG. 16, cut determination circuit CJC includes a P-channel MOS transistor PQ1 connected between nodes ND1 and ND2 and receiving on its gate a fuse element reset signal FSRST, and an N-channel MOS transistor NQ1 connected between node ND2 and the ground node receiving fuse element reset signal FSRST on its gate.

Cut determination circuit CJC further includes an inverter IV10 receiving a fuse element reset delay signal FSRSTD, a tristate inverter TV1 made active to invert the signal on node ND2 when an output signal of inverter IV10 is at L level, an inverter IV11 receiving the output signal of inverter IV10, an inverter IV12 receiving an output signal of tristate inverter TV1, a tristate inverter TV2 made active to transmit an output signal of inverter IV12 to an input of inverter IV10 when the output signal of inverter IV10 is at H level, and an inverter IV13 inverting the output signal of inverter IV12 to produce a determination result signal Jout.

The cut determination circuit further includes a P-channel MOS transistor PQ2 made conductive to couple the power supply node to node ND1 when the output signal of inverter IV11 is at L level, and N-channel MOS transistors NQ2 and NQ3 connected in series between node ND2 and the ground node.

MOS transistor NQ2 receives, on its gate, the output signal of tristate inverter TV1, and MOS transistor NQ3 receives, on its gate, the output signal of inverter IV11.

Node ND1 is connected to fuse element FS. Although not shown, the blowing current supply transistor is also connected to node ND1.

Figure 17:
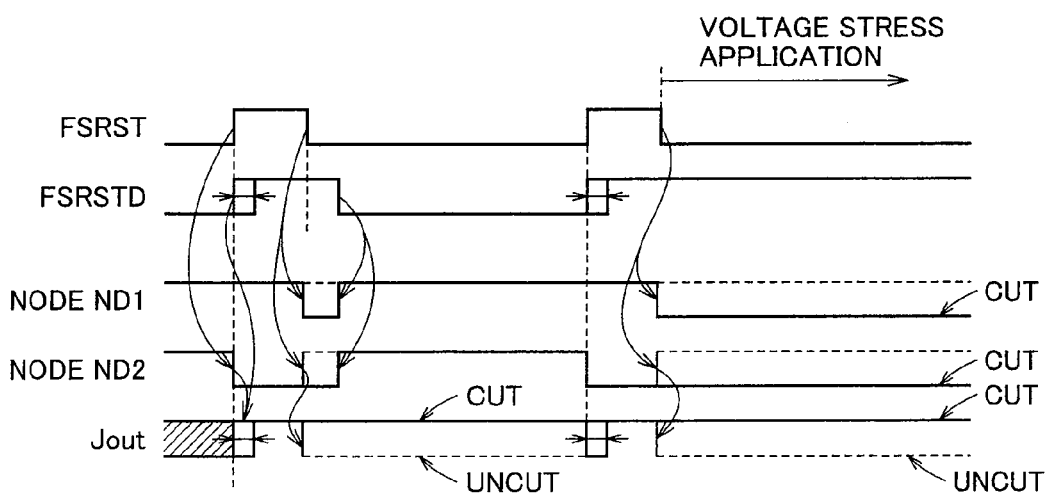
FIG. 17 is a timing chart representing an operation of the cut determining circuit shown in FIG. 16.

FIG. 17 is a signal waveform diagram representing an operation of cut determination circuit CJC shown in FIG. 16. Referring to FIG. 17, the operation of cut determination circuit CJC will now be described.

When fuse element reset signal FSRST and fuse element reset delay signal FSRSTD are both at L level, node ND2 is electrically coupled to node ND1 via MOS transistor PQ1. The output signal of inverter IV10 is at H level, and the output signal of inverter IV11 is at L level. Therefore, MOS transistor PQ2 is conductive, and electrically couples node ND1 to the power supply node. MOS transistor NQ3 is non-conductive, and electrically isolates node ND2 from the ground node. Thus, node ND2 is charged to the level of power supply voltage VDD via MOS transistor PQ1. Tristate inverter TV1 is in the output high-impedance state, and the state of determination result output signal Jout does not change.

When fuse element reset signal FSRST is set to H level, MOS transistor PQ1 is turned off, and MOS transistor NQ1 is turned on to drive node ND2 to the ground voltage level. In this state, MOS transistor PQ1 is in the off state, and electrically isolates node ND1 from node ND2. Fuse element reset delay signal FSRSTD rises to the H level, and the output signals of inverters IV10 and IV11 are driven to the L and H levels, respectively, so that MOS transistor PQ2 is turned off, and MOS transistor NQ3 is turned on. Tristate inverter TV1 turns active, to drive the output signal thereof to the H level according to the ground voltage level of node ND2, so that MOS transistor NQ2 is turned on. Accordingly, tristate inverter TV1 and MOS transistors NQ2 and NQ3 form a latch circuit to keep node ND2 at the ground voltage level.

Thus, internal node ND2 is initialized, and output signal Jout of the determination circuit attains the H level.

Then, fuse element reset signal FSRST is driven to the L level. In this time, fuse element reset delay signal FSRSTD is at the H level. In this state, MOS transistor NQ1 is turned off, and MOS transistor PQ1 is turned on to couple electrically nodes ND1 and ND2 to each other. Fuse element FS, when not blown, has a current driving capability larger than the current driving capability of MOS transistors NQ2 and NQ3, and node ND2 is driven to the level of power supply voltage VDD. When fuse element FS is blown off, node ND1 is discharged via MOS transistors PQ1, NQ2 and NQ3, to have the voltage level thereof kept at the ground voltage level.

When fuse element reset delay signal FSRSTD attains the L level thereafter, tristate inverter TV1 enters the output high-impedance state, and MOS transistor NQ3 is turned off Responsively, MOS transistors PQ2 and PQ1 precharge nodes ND1 and ND2 to the level of power supply voltage VDD. At this time, tristate inverter TV1 is in the output high-impedance state, and output signal Jout is kept at H level when fuse element FS is blown off. When fuse element FS is uncut, output signal Jout is kept at the L level.

After the initialization, therefore, output signal Jout of cut determination circuit CJC can be set according to the program state of fuse element FS in the fuse program circuit, and thus can be set to the logic level corresponding to the program information (the state of the fuse element).

In the test mode, fuse element reset delay signal FSRSTD is kept at the H-level after the internal nodes are initialized according to reset signals FSRST and FSRSTD, and only reset signal FSRST is driven to L level. In this state, nodes ND1 and ND2 are kept at the L or H level according to the blown/non-blown state of fuse element FS. Likewise, output signal Jout is set to the logic level corresponding to the blown/non-blown of fuse element FS because tristate inverter TV1 is active.

In this test operation, when fuse element FS is uncut, fuse element FS holds node ND1 at the level of power supply voltage VDD. In this case, node ND2 is likewise kept at the level of power supply voltage VDD, but MOS transistor NQ3 is in the off state according to delay signal FSRSTD, and cuts off the current path from the power supply node via this fuse element FS to the ground node. Therefore, uncut fuse element FS does not undergo the stress due to by bias voltage VDD.

When fuse element FS is blown, node ND1 is at the ground voltage level. Therefore, when fuse element FS is blown, a bias voltage is applied between the opposite ends of fuse element FS. Bias voltage VDD is applied to broken pieces of the blown fuse element or to the fuse interconnect in a high-resistance state, and through an electromigration phenomenon, copper (Cu) atoms moves according to the applied voltage. Consequently, the fuse element changes from the high-resistance state to the low-resistance state.

Figure 18:
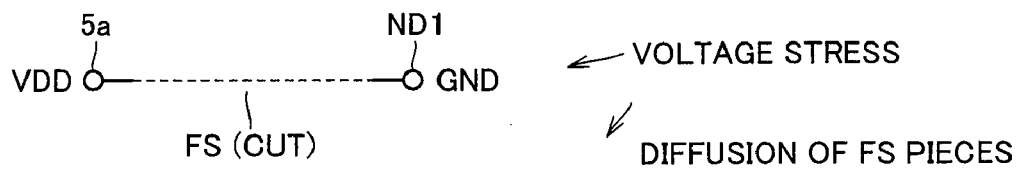
FIG. 18 schematically shows a state of the fuse element in a case when a voltage stress as represented in FIG. 17 is applied.

FIG. 18 schematically shows a state of the cut fuse element. A stress of voltage VDD is applied between a power supply node 5a and node ND1. When fuse element FS is a copper interconnect, the copper atoms in the broken pieces or the copper atoms in the interconnect of the high-resistance state move in an insulating film according to the voltage application. The copper atoms moving in the insulating film causes insulation breakdown of the insulating film, and the short circuit between the interconnects and the like cause a failure in the fuse program circuit. In addition, the fuse element in ht high-resistance state and determined to be in the cut state has the resistance value lowered, so that the program state may probably be inverted.

Accordingly, by applying this voltage stress, it is possible to measure a lifetime of fuse element FS formed of a copper interconnect. Further, to an uncut fuse element, no voltage stress is applied and in addition a path passing the current is not present. Therefore, when the voltage stress is applied, the path of the current flow is cut off regardless of the blown/non-blown of fuse element FS, and the lifetime of the cut fuse element can be measured.

Fuse reset delay signal FSRSTD may rise to the H level at the same timing as fuse element reset signal FSRST, or may rise to the H level with a delay. It is merely required that fuse reset delay signal FSRSTD falls with a delay to the falling of fuse reset signal FSRST to ensure a period during which the voltage levels of nodes ND1 and ND2 are set according to the cut/uncut state of fuse element FS.

[Construction of 2-Input Multiplexer]

Figure 19A:
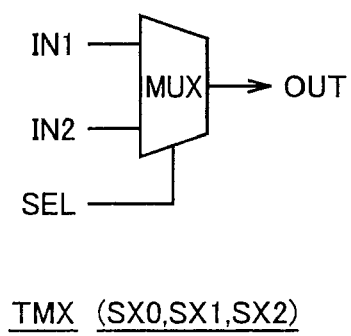
FIGS. 19A and 19B illustrate by way of example an electrical symbol and an electrically equivalent circuit of a two-input multiplexer shown in FIG. 5.

FIG. 19A shows a construction at a block level of a two-input and one-output multiplexer. A two-input multiplexer TMX shown in FIG. 19A corresponds to multiplexers SX1 and SX2 shown in FIG. 5 as well as multiplexer SX0 shown in FIGS. 13 and 15. Since these multiplexers SX0-SX2 differ from each other in input signal, output signal and select signal, FIG. 19A indicates input signals by "IN1" and "IN2", and also indicates the output signal and the select control signal by "OUT" and "SEL", respectively.

Figure 19B:
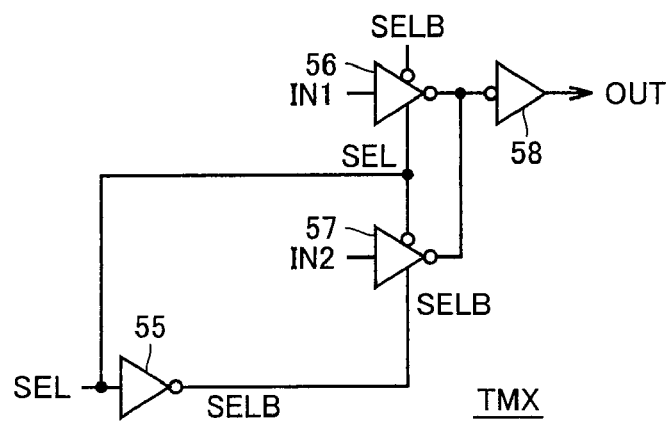

FIG. 19B shows an example of a construction of two-input multiplexer TMX shown in FIG. 19A. In FIG. 19B, two-input multiplexer TMX includes an inverter 55 for inverting select control signal SEL to produce an inverted select control signal SELB, a tristate inverter 56 made active to invert input signal IN1 when select control signal SEL is at the L level, and an inverter 58 inverting the output signals of tristate inverter 56 or 57 to produce output signal OUT.

Tristate inverters 56 and 57 are activated/deactivated according to complementary select control signals SEL and SELB, respectively, and are set to the output high-impedance state when made inactive. Therefore, according to select control signal SEL, one of input signals IN1 and IN2 is transmitted to inverter 58, which in turn produces output signal OUT corresponding to the selected input signal.

[Programming Sequence of Fuse Element]

Figure 20:
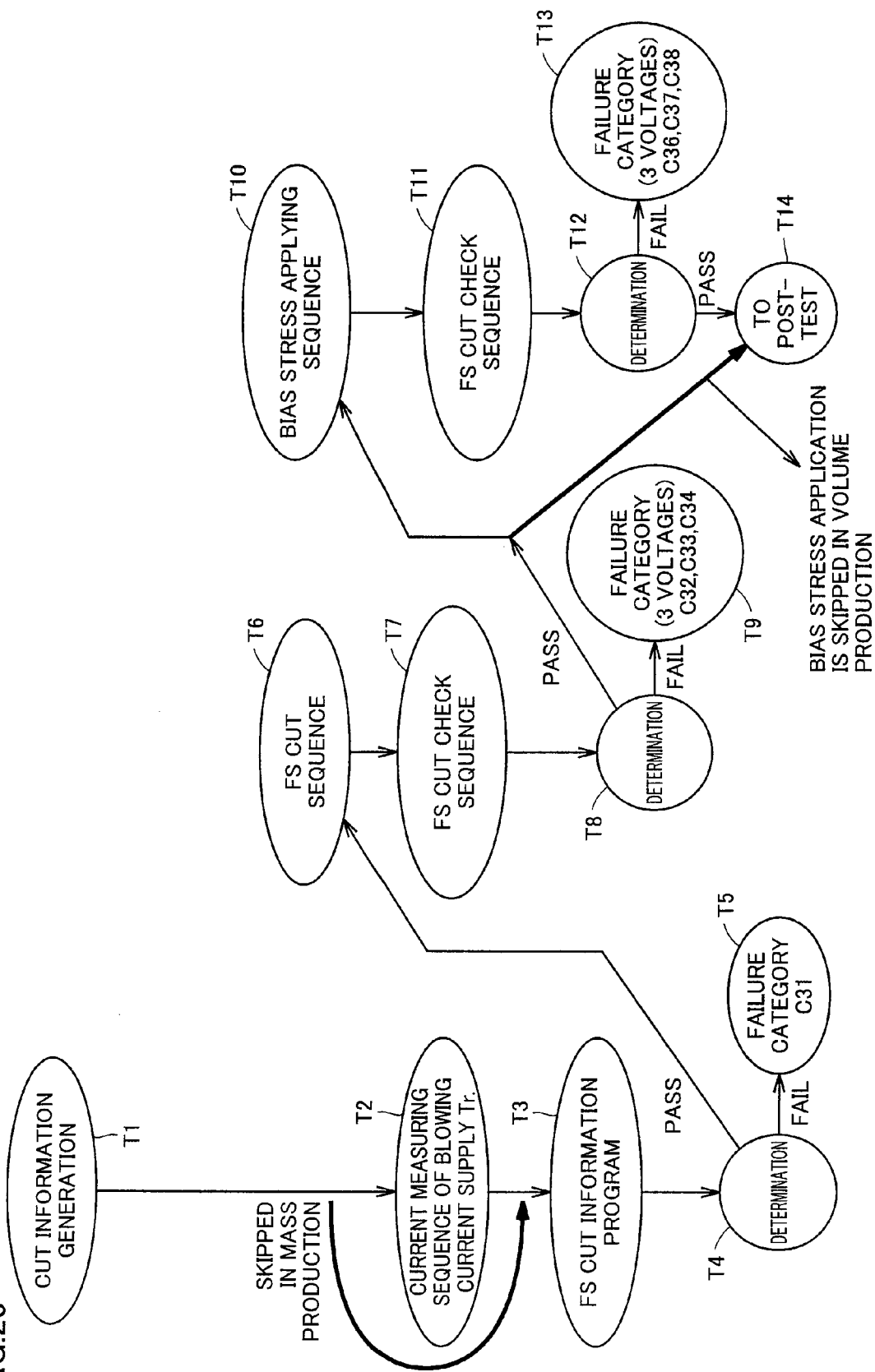
FIG. 20 is a flow chart representing a fuse program sequence of the semiconductor device according to the invention.

FIG. 20 shows a programming sequence of the fuse element. Referring to FIG. 20, the programming sequence of the fuse element will now be described briefly, and then respective steps will be described in detail.

First, cut information is generated in step T1. This cut information provides redundant cell repair information (redundant row and column addresses) for the memory, test mode setting information, chip identification information or trimming information about the resistance value in an analog circuit.

Before storing the cut information in the program scan flip-flop, the current of the blowing current supply transistor (Tr) is measured in step T2. This measurement of the current of blowing current supply transistor is performed using fuse element FSTP in FIG. 13 that cannot be blown.

The current measurement sequence of the blowing current supply transistor in step T2 is executed when a manufacturing process is unstable in a design stage or an initial stage such as a start of the manufacturing steps. When mass production is performed, the optimum blowing current is already determined, and step T2 is skipped and is not executed.

The cut information for fuse element FS is programmed according to the cut information produced in step T1 (step T3). In this cut information programming processing, the program information series produced based on the produced cut information is transferred by sequential shifting operations via program scan flip-flops PSR shown in FIG. 4, and program scan flip-flop PSR of each fuse program circuit stores the corresponding fuse cut information among transferred information (step T3).

Then, the shift operation is performed again to read the cut information stored in program scan flip-flops PSR (see FIG. 5), and it is determined whether the program scan flip-flops have correctly stored the cut information (step T4). According to whether the read out cut information matches with the written cut information, it is determined whether the scan path is faulty. Upon failure (FAIL), a failure category C31 is set, and the cut information program indicates occurrence of the failure (step T5). When it is determined that the cut information programming of fuse element FS is correctly executed (PASS), the sequence of cutting fuse element FS is executed (step T6).

When fuse element FS is cut, the fuse element select data is sequentially transferred via the FS select scan flip-flops shown in FIG. 5. According to the transferred data, the fuse elements are sequentially selected one by one, and the blowing current for cutting the fuse element is selectively caused to flow through the selected fuse elements one by one according to the stored cut information (i.e., fuse programming is performed).

When step T6 is completed, it is determined whether fuse element FS is correctly cut according to the program information (step T7). In step T7 for executing the FS cut check sequence, the output signal of each cut determination circuit (CJC) is transferred to the program scan flip-flops via the multiplexer, and these output signals are sequentially and externally transferred via the program scan flip-flop series.

According to the transferred information, the state of the fuse elements are determined. Specifically, it is determined whether the output signal of the cut determination circuit thus read corresponds to the cut program information (step T8). In this determination, the failure categories are determined with three voltages C32, C33 and C34 (step T9). The determination of the failure categories with three voltages C32, C33 and C34 is performed because the determination on the presence/absence of the failure is performed in the states where power supply voltage VDD in cutting the fuse element is at a low voltage level, a typical power supply voltage level and a high voltage level, respectively. The influence of process variations of the fuse elements is analyzed, and countermeasure is taken e.g., to adjust the blowing current at the time of occurrence of the failure.

When it is determined in step T8 that fuse element FS is correctly cut according to the program (PASS), a post-test is performed in a stage of mass production (T14). This post-test includes a test of determining whether each internal circuit operates accurately according to the fuse element program after completion of the programming of the fuse elements, the burn-in and the like.

In the design stage or in starting up the process, a bias stress application sequence is executed subsequent to step T8 (step T10). In this bias stress application sequence, a bias is applied to each cut fuse element, using cut determination circuit CJC shown in FIG. 15 and cut determination circuit CJC in FIG. 16, and a stress is applied to each fuse element.

After application of the bias stress, it is verified whether fuse element FS is correctly cut (step T11). The blown/non-blown of fuse element FS can be checked by determining whether cut fuse element FS reenters the short-circuited state as a result of movement of its copper atoms. For this determination, power supply voltage VDD for applying the stress is set to three levels of high, middle and low levels, and the determination is performed with each voltage level (step T12). When a failure occurs in determination step T12 (FAIL), the failure categories are classified into three voltages C36, C37 and C38 according to the level of power supply voltage VDD in the stress application (step T13). When it is determined in determination step T12 that fuse element FS is correctly cut (PASS), a post-test is executed in step T14.

In steps T5, T9 and T13, the classification is performed with failure categories C31-C38. Thereby, it is possible to identify the step or sequence in which the failure occurred as well as contents of the failure, and the test failure analysis can be easily performed.

Each sequence will now be described with reference to actual operation waveforms.

Figure 21:
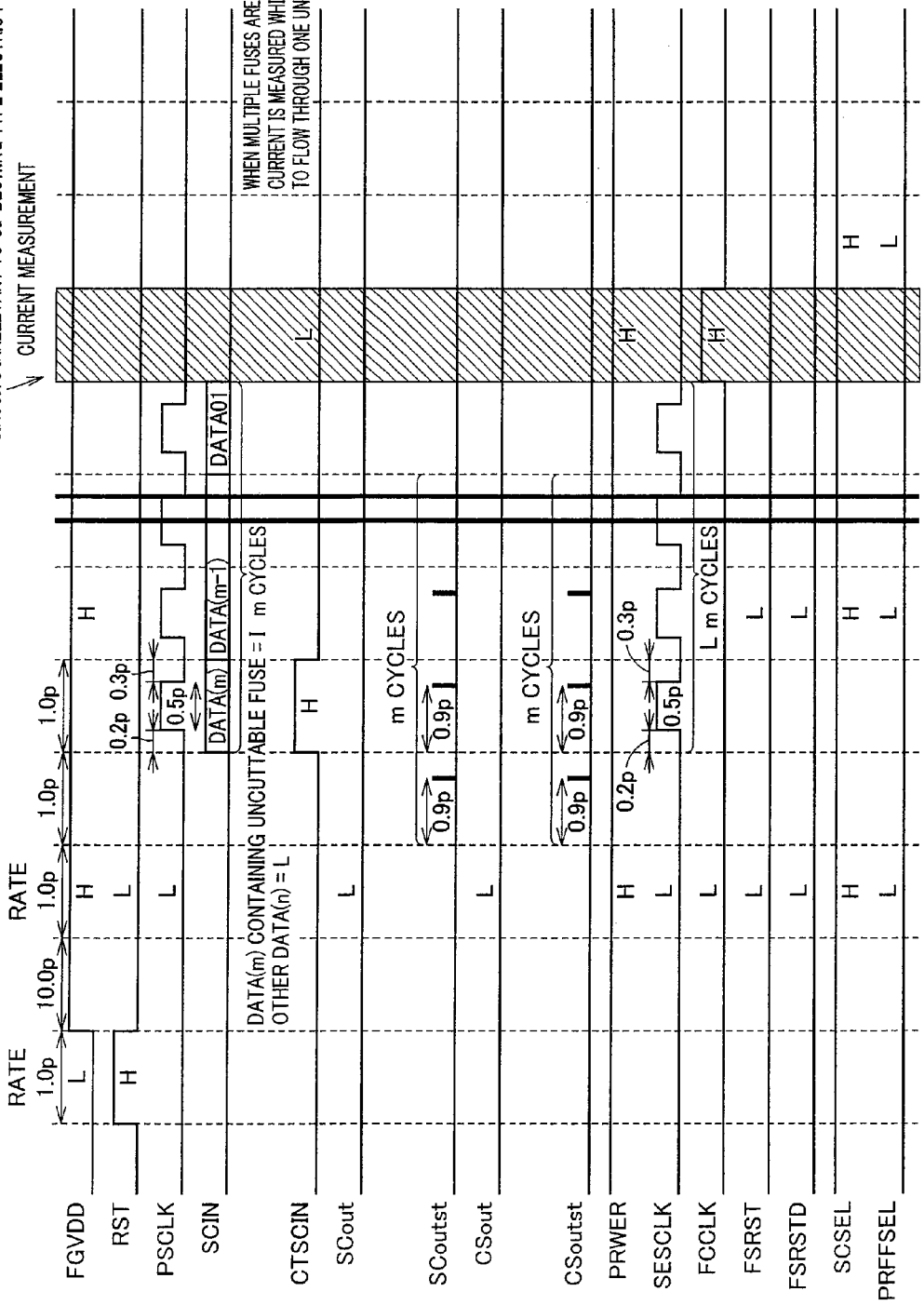
FIG. 21 is a timing chart representing an operation in a blowing current measuring sequence illustrated in FIG. 20.

FIG. 21 is a timing chart representing an internal operation of the fuse program circuit in the sequence (step T2) of measuring the current of blowing current supply transistor (CTr) shown in FIG. 20. Control signals represent the control signals for the fuse program circuit series shown in FIG. 5. The fuse program circuit for the current measurement is arranged in fuse program circuit FPKm (see FIG. 13). A rate (RATE) is 1.0 p (ns). This rare represents a clock cycle period for which the current measurement is performed on one fuse program circuit.

First, reset signal RST is set to H level. At this time, fuse gate power supply voltage FGVDD is at L level. With reset signal RST, all program scan flip-flops PSR and FS select scan flip-flops FSSR are set to L data storing state as shown in FIG. 5.

Then, reset signal RST is set to the L level, and fuse gate power supply voltage FGVDD is set to H level. Fuse gate power supply voltage FGVDD is kept at the H level for about 10.0 p (ns), i.e., 10 cycle periods, to stabilize the voltage level of fuse gate power supply voltage FGVDD for stabilizing fuse gate power supply voltage FGVDD in each fuse program circuit.

At this time, scan select signal SCSEL is set to H level, and multiplexer SX1 shown in FIG. 5 is set to the state for selecting corresponding program data SCIN. Likewise, select control signal PRWER for multiplexer SX0 shown in FIG. 13 is set to the H level, and multiplexer SX0 enters the state of selecting scan input signal SCIN0 externally applied.

Then, a scan-out strobe signal SCoutst and a fuse cut output strobe signal CSoutst are produced in the form of one-shot pulse in each of m cycle periods. Responsively, buffer 40 shown in FIG. 15 successively takes in and outputs scan-out signals SC(n) and CTS(n) applied from fuse program circuit FPKn at the final stage.

In a cycle next to the generation of strobe signals SCoutst and CSoutst, program scan clock signal PSCLK is made active. In the first cycle, a fuse select signal CTCIN is set to the H level. The shifting clock signal PSCLK is kept inactive for 0.2 p period in one cycle, then is set to and kept at the H level for half a cycle period (0.5 p) and then is kept inactive for a 0.3 p cycle. The active period of the shifting clock signal PSCLK can be set to an appropriate value based on correlation between strobe signals SCoutsc and CSoutsc. The activation timing and the active periods of strobe signals SCoutsc and CSoutsc in the cycle are not restrictive, and can be adjusted and determined appropriately according to the made definite timing of the transfer signal.

First (leading) program scan input signal SCIN is set in data DATA(m), which is data set in fuse program circuit FPK(m) having the uncuttable fuse. At this time, data CTSIN is set to the H level, and the data at the H level is sequentially transferred via FS select scan flip-flops FSSR.

When shift clock signal PSCLK is sequentially activated for m cycles, fuse program circuit FPKm stores the H level signal in FS select scan flip-flop FSSR. Data DATA(m) is set to the H level indicating the cut of the fuse. All data DATA(m−1)-DATA01 for the other fuse program circuits are at the L level indicating the uncut state of all the other fuses. These data DATA(m−1)-DATA01 are set in fuse program circuits FPK(m−1)-FPK1 shown in FIG. 12, respectively. Downstream fuse program circuits FPK(m+1)-FPKn store the reset information (L data) transferred from the fuse program circuits at the preceding stages, respectively. Therefore, it is not required to transfer the data to these downstream fuse program circuits for storage.

After completion of the transfer cycle for the data of m in number, the current measurement is executed. In this current measuring, the voltage levels of power supply voltage VDD and fuse gate power supply voltage FGVDD are set, and the internal current is measured in this state. In this current measuring operation, all the circuits other than fuse program circuit FPKm are in a standby state. Only fuse program circuit FPKm consumes the blowing current, and this current is measured.

In this current measuring operation, fuse cut clock signal FCCLK is set to the H level. Thereby, as shown in FIG. 5, the output signal of AND circuit AG1 attains the H level, and the corresponding blowing current supply transistor is turned on to pass the current through corresponding fuse element FSTP, and this current is measured.

In this current measuring sequence, the current measurement is performed using the uncuttable fuse element of one fuse program circuit FPKm. When a plurality of uncuttable fuse elements are employed, the application sequence of data DATA and cut fuse select input CTCIN is adjusted to pass the current through one uncuttable fuse element.

By executing the above sequence, the cutting conditions of the fuse elements can be easily optimized.

Figure 22:
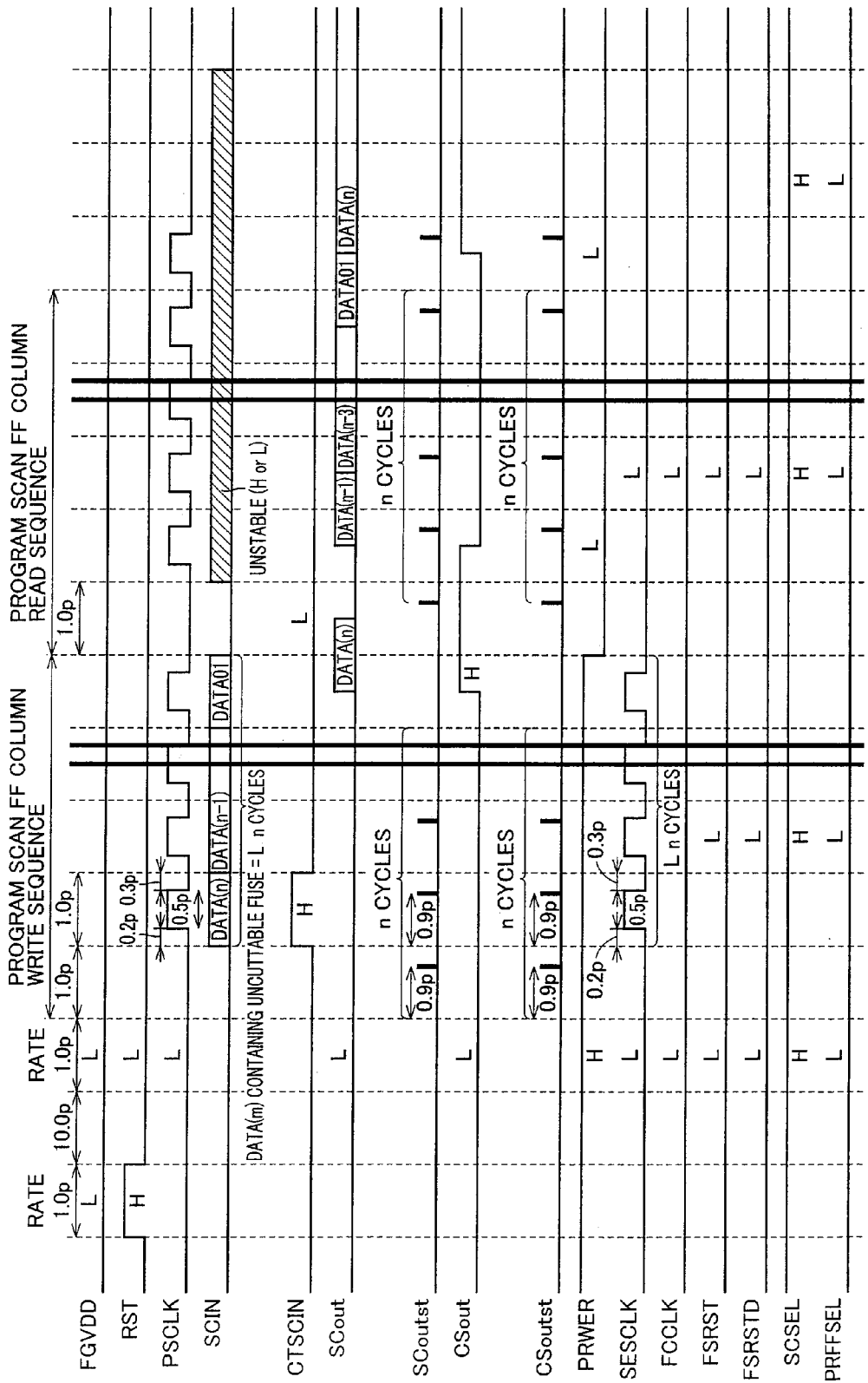
FIG. 22 is a signal waveform diagram illustrating an operation in an FS cut information program sequence as represented in FIG. 20.

FIG. 22 is a timing chart representing an internal operation of FS cut information program step T3 in the fuse element cut sequence shown in FIG. 20. Referring to FIG. 22, an internal operation for the FS cut information programming will now be described. The clock cycle (RATE) is 1.0 p (ns).

First, reset signal RST is set to the H level, and the storage data of FS select scan flip-flop FSSR and program scan flip-flop PSR shown in FIG. 5 is initialized (i.e., the L level data is stored).

Select control signal PRWER for multiplexer SX0 at the initial stage is at H level. Accordingly, multiplexer SX0 at the initial stage shown in FIG. 13 is set to the state of selecting externally applied program information (scan input information) SCIN0. Input select control signal SCSEL is at the H level, and multiplexer SX1 at the input portion of each of fuse program circuits FPK1-FPKn shown in FIG. 5 is set to the state of selecting scan input signal SCIN applied from the output portion in the preceding stage.

In the cycle before actually scanning the program data, the strobe signals SCoutst and CSoutst are made active in the form of one-shot pulse. These strobe signals are made active in each cycle for a period of n cycles, and the data is transferred from the buffer.

In and after the next cycle, scan input data DATA(n)-DATA01 are sequentially input. When the scan input data is applied, fuse element select data CTSCIN is set to the H level in the initial cycle. Thereafter, fuse element select clock signal SESCLK and program scan clock signal PSCLK are sequentially activated in each cycle for a period of n cycles. For the activation period of the scan clock signal, a pre-period of 0.2 p and a post-period of 0.3 p are set as an inactive period, and a period of 0.5 p cycle between them is set as an active period. The clock pulse waveform is described merely by way of example, and is optimized according to the operation characteristics of the flip-flops on the transfer path.

At this time, the serial scan input data and fuse select data are transferred in the fuse program circuit series by shifting operations, and fuse program circuits FPK1-FPKn store the data. The data of data DATA(m) for fuse program circuit FPKm that includes the uncuttable fuse element is set to the L level indicating the uncut state.

When the transfer cycles of n in number are completed, input select control signal PRWER is set to the L level. Accordingly, initial multiplexer SX0 shown in FIG. 13 is set to the state of selecting output signal SC(n) of fuse program circuit FPKn at the final stage, and fuse program circuits FPK1-FPKn form a loop.

Then, the strobe signals SCoutst and CSoutst are formed in the form of one-shot pulse, and the buffer produces the serial output signal. Scan output data SCout that is externally output changes at every cycle, and data DATA(n)-DATA01 are sequentially shifted out. After elapsing of n cycles, original data DATA(n) is selected and output again.

During the output operation, fuse element select scan output signal CSout that is transferred via FS select scan flip-flop FSSR is set to the H level for the period corresponding to data DATA(n), and is set to the L level for the remaining period, as in the scan-in period. Thereby, the leading data of the read data series can be identified. In this scan-out period, the state of scan-in input SCIN is unstable, and is set to an arbitrary state.

Data DATA(n)-DATA01 is read as scan output signal SCout, and is compared with the writing program information that is already generated. Thus, it is determined in step T4 shown in FIG. 20 whether each program scan flip-flop PSR has correctly stored the information corresponding to the generated blowing information.

Figure 23:
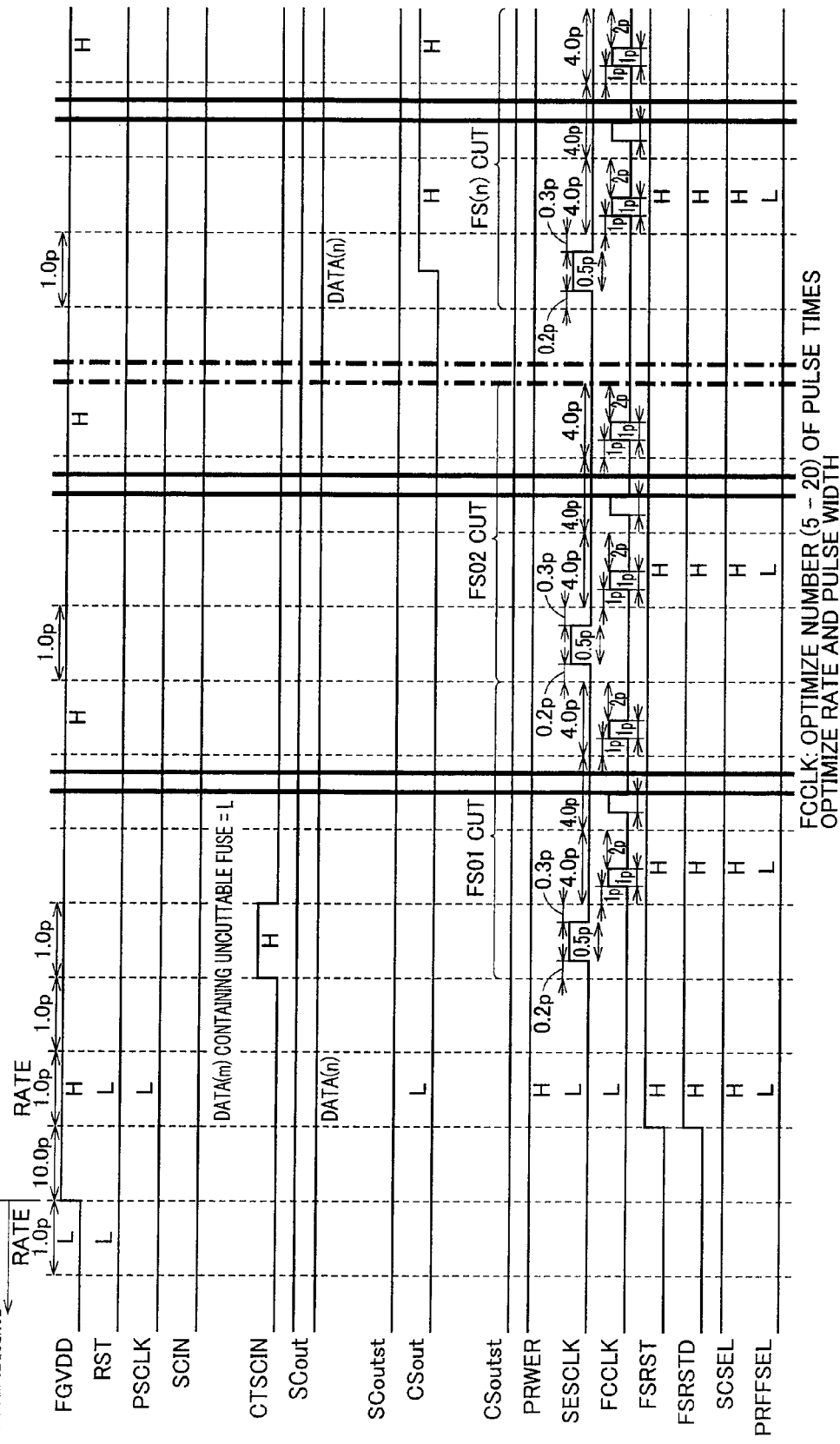
FIG. 23 is a timing chart representing an operation in an FS cut sequence as represented in FIG. 20.

FIG. 23 is a timing chart representing an internal operation of a FS cut sequence (step T6) shown in FIG. 20. Referring to FIG. 23, the FS cut sequence will now be described.

The FS cut sequence (step T6) is executed on the chip which is determined as "PASS" by the determining operation subsequent to the cut information program sequence.

First, fuse gate power supply voltage FGVDD is set to the H level in this FS cut sequence. After elapsing of 10.0 p cycles, it is determined that fuse gate power supply voltage FGVDD becomes stable, and fuse element reset signal FSRST and fuse element reset delay signal FSRSTD are driven to the H level. Responsively, cut determination circuit CJC shown in FIG. 16 sets nodes ND1 and ND2 to the H and L levels, respectively. In this state, the path of current flow in cut determination circuit CJC is cut off.

Then, fuse select scan input CTSCIN is set to the H level, and a fuse element select clock signal SCSCLK is driven to the H level in the same cycle. According to the pulse width conditions in the clock cycle, fuse element select clock signal SCSCLK has an inactive period of a pre-period of 0.2 p cycle and a post-period of 0.3 p cycle, and is kept at the H level for a period of 0.5 p. This clock waveform is merely an example, and is optimized according to the operation characteristics of the transfer path.

According to fuse element select clock signal SCSCLK, FS select scan flip-flops FSSR shown in FIG. 5 performs the shifting operation, and take in fuse select signal CTSCIN at the H level externally applied. Fuse element FS01 in fuse program circuit FPK01 at the initial stage is set to the state of being cut.

In this state, fuse cut clock signal FCCLK is applied, e.g., with an inactive period of a pre-period of 1 p cycle period and a post-period of 2 p, and a period (active period) at the H level of one 1 p. According to this pulse waveform, one cycle is 4.0 p, and fuse cut clock signal FCCLK having a pulse width of ¼ cycle period is applied. This pulse signal is applied 5 to 20 times. This number of pulse application times is optimized according to the driving current amount and each blowing current amount. Also, the pulse width is optimized.

The period for which the output signal of AND circuit AG1 shown in FIG. 4 is at the H level is optimized by applying fuse cut clock signal FCCLK with the predetermined number of times, the pulse width and the pulse interval optimized. This optimizes the period for which blowing current supply transistor CTr is turned on to pass the blowing current from the power supply node to the ground node via fuse element FS, to optimize the power consumption in blowing the fuse. Through the Joule heat generated by this blowing current, fuse element FS01 is cut off.

When the cutting of fuse element FS01 is completed, fuse element select clock signal SESCLK is driven to the H level again, and the shifting operation in FS select scan flip-flops FSSR shifts scan input CTSCIN by one stage, and the cutting of fuse element FS02 of fuse program circuit FPK2 is selectively executed according to the program information stored in the program scan flip-flop. Fuse cut clock signal FCCLK is applied a predetermined number of times with a predetermined pulse width at predetermined pulse intervals. In this case, fuse program information DATA(m) for fuse program circuit FPKm is at the L level, and the blowing current is not supplied to uncuttable fuse element (FSTP).

Fuse cut clock signal FCCLK is produced in each clock cycle, and the fuse select signal is transferred. In each fuse program circuit, the corresponding fuse select signal is activated, fuse element select clock signal SSCLK is set at the H level for a predetermined period and selective cutting is performed according to the program information of the fuse element.

When the shift operation is performed a predetermined number of times (n times), the cutting performed on fuse program circuit FPKn at the final stage. At this time, the signal CTS(n) applied from a fuse FS select delay flip-flop corresponding to the fuse program circuit attains the H level, and accordingly fuse cut scan output signal CSout applied from the buffer (40) attains the H level. This indicates that the selective cutting is performed according to the program information of the fuse element in fuse program circuit FPKn at the final stage. Likewise, fuse cut clock signal FCCLK is applied a predetermined number of times, whereby the selective cutting of the fuse elements is executed. Thereby, the cut sequence of the fuse element is completed.

Figure 24:
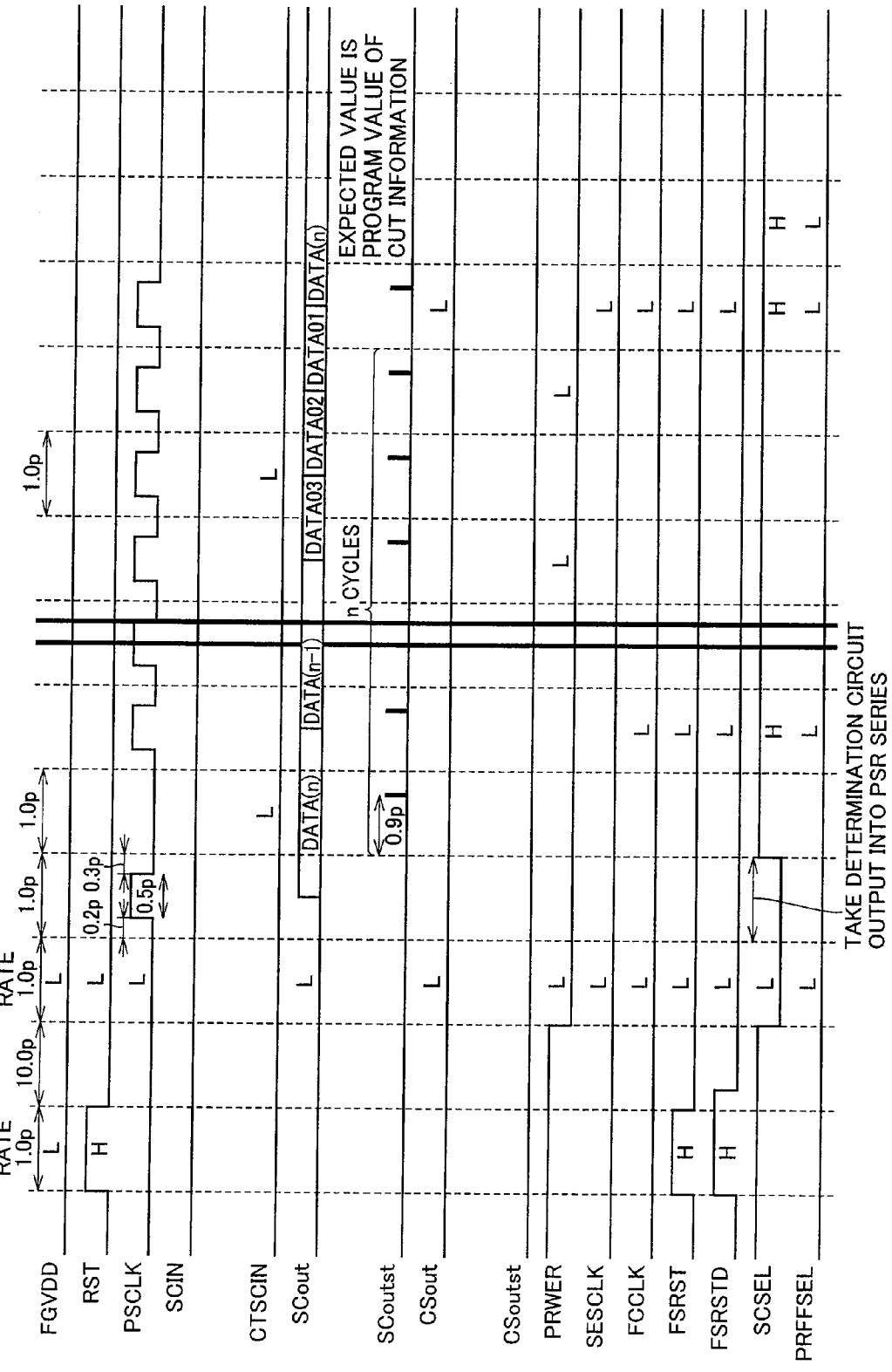
FIG. 24 is a timing chart representing an operation of an FS cut check sequence as shown in FIG. 20.

FIG. 24 is a timing chart representing an operation of the FS cut check sequence (step T7) shown in FIG. 20. Referring to FIG. 24, an internal operation of the FS cut check sequence will now be described.

First, reset signal RST is set to the H level, and fuse element reset signal FSRST and fuse element reset delay signal FSRSTD are set to the H level. Accordingly, the storage data of FS select scan flip-flop FSSR and program scan flip-flop PSR shown in FIG. 4 is initialized to the L level. The internal state of cut determination circuit CJC is initialized.

Thereafter, reset signals RST and FSRST fall to the L level, and then fuse element reset delay signal FSRSTD falls to the L level. Consequently, the output signal of cut determination circuit (CJC) in each fuse program circuit is set to the logic level corresponding to the state of blow/non-blown of fuse element FS.

Then, multiplexer input control signal PRWER changes from the H level to the L level, and scan path select signal SCSEL falls to the L level. Accordingly, multiplexer SX0 at the initial stage shown in FIG. 12 is set to the state of selecting the output signal of the program scan flip-flop at the final stage, and multiplexer SX1 at the initial stage in each of fuse program circuits FPK1-FPKn attains the state of selecting the output signal of corresponding cut determination circuit CJC.

When program shift clock signal PSCLK is applied in this state, the output signal of the determination circuit in each of fuse program circuits FPK-FPKn is stored in corresponding program scan flip-flop PSR. The signal waveform of program shift clock signal PSCLK and the rate (RATE) at the time of transfer are substantially the same as those in the program sequence of the cut information represented in FIG. 22.

Then, multiplexer input select control signal SCSEL rises to the H level again, and multiplexer SX1 in each fuse program circuit shown in FIG. 5 is set to the state of selecting scan input signal (SCIN or SC(1)-SC(n)) applied from the preceding stage. Select control signal PRWER for multiplexer SX0 at the preceding stage in fuse program circuit FPK1 is kept at the L level, and the flip-flop series of fuse program circuits FPK1-FPKn keeps the loop form.

In this state, scan out strobe signal SCoutst is applied with a predetermined pulse width in a period of n cycles, and program shift clock signal PSCLK is applied in a period of n cycles. By the shifting operation of program scan flip-flops PSR, the output signals of cut determination circuit CJC stored in the respective program scan flip-flops PSR are sequentially read out externally. Data DATA(n)-DATA01 of scan out signal SCout thus read externally are compared with the program values of the cut information, i.e., the expected values, and it is determined in determination step T8 in FIG. 20 whether fuse element FS in each of fuse program circuits FPK1-FPKn is already set to the blonw/non-blown state according to the program information.

Figure 25:
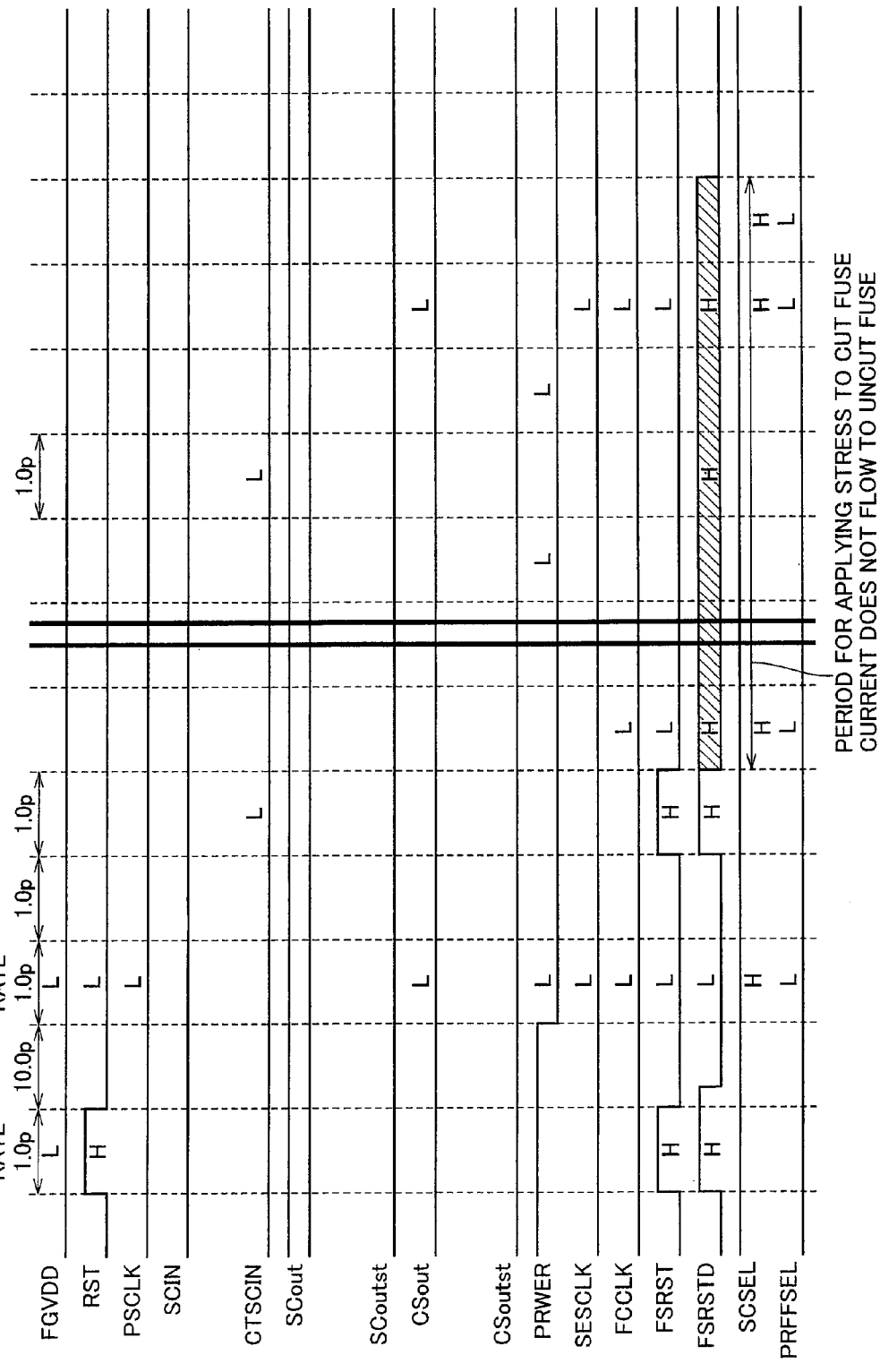
FIG. 25 is a timing chart representing an operation in a bias stress application sequence as shown in FIG. 20.

FIG. 25 is a timing chart representing an internal operation of the bias application sequence (step T10) shown in FIG. 20. Referring to FIG. 25, an internal operation of the bias application sequence will now be described.

The operation timing chart of FIG. 25 is substantially the same as the timing chart of FIG. 17. In this sequence in FIG. 25, rate RATE of clock signal is 1.0 p (ns).

First, reset signals RST and FSRST as well as fuse element reset delay signal FSRSTD rise to the H level to initialize FS select scan flip-flop FSSR and program scan flip-flop PSR shown in FIG. 4, and the voltage levels of internal nodes (ND1 and ND2) in cut determination circuit CJC are initialized.

Then, reset signals RST and FSRST fall to the L level, and thereafter reset delay signal FSRSTD falls to the L level with a delay. Accordingly, the voltage level of the internal node (ND2) in cut determination circuit CJC (see FIG. 16) is set to the voltage level corresponding to the blown/non-blown state of corresponding fuse element FS.

Then, input select control signal PRWER falls from the H level to the L level, and multiplexer SX0 is set to the state of selecting output signal S(n) of fuse program circuit FPKn at the final stage. Accordingly, one loop is formed in the scan path, fuse program circuits FPK1-FPKn are isolated from external circuitry and all the external circuits are kept in the standby state.

In this state, the internal nodes (ND1 and ND2) of cut determination circuit CJC are initialized according to fuse element reset signal FSRST and fuse element reset delay signal FSRSTD. Then, fuse element reset signal FSRST falls to the L level, and fuse element reset delay signal FSRSTD is kept at H level. Thereby, as already described with reference to FIGS. 16 and 17, a stress of voltage VDD is applied to the cut fuse element, and the opposite ends of the uncut fuse element are kept at the same voltage level. Cut determination circuit CJC cuts off the discharging path or the path of a through current flow.

By maintaining this state for a predetermined period, due to bias voltage VDD, a stress is applied to the cut fuse element. After application of the voltage stress, the FS cut sequence (step T11 and determination step T12) shown in FIG. 20 is performed to measure the lifetime of the fuse element (i.e., to measure the short circuit of the fuse element or the short circuit between the interconnects due to the diffusion of copper (Cu) atoms of the broken pieces of the cut fuse element). The operation of the FS cut check sequence in step T11 is the same as the operation that is executed in the FS cut check sequence in step T7 shown in FIG. 24. In determination step T12, the blown/non-blown state of the fuse element is determined by checking the externally read out state-indicating information on the fuse element.

By using the sequences shown in FIGS. 20 to 25, it is possible to perform, through the path of the scan flip-flops, the setting of information of the fuse program, cutting of the fuses and determination of the result of cutting. By using the scan flip-flop series, the state of the fuses can be checked, and the program of the program information can be checked. Using the FS select flip-flops, the FS select information can be sequentially transferred through the shifting operation, to cut the fuse elements one by one. Accordingly, such a state can be prevented that a large blowing current flows at a time, and the current consumption can be reduced.

[Structure of Fuse Element]

Figure 26:
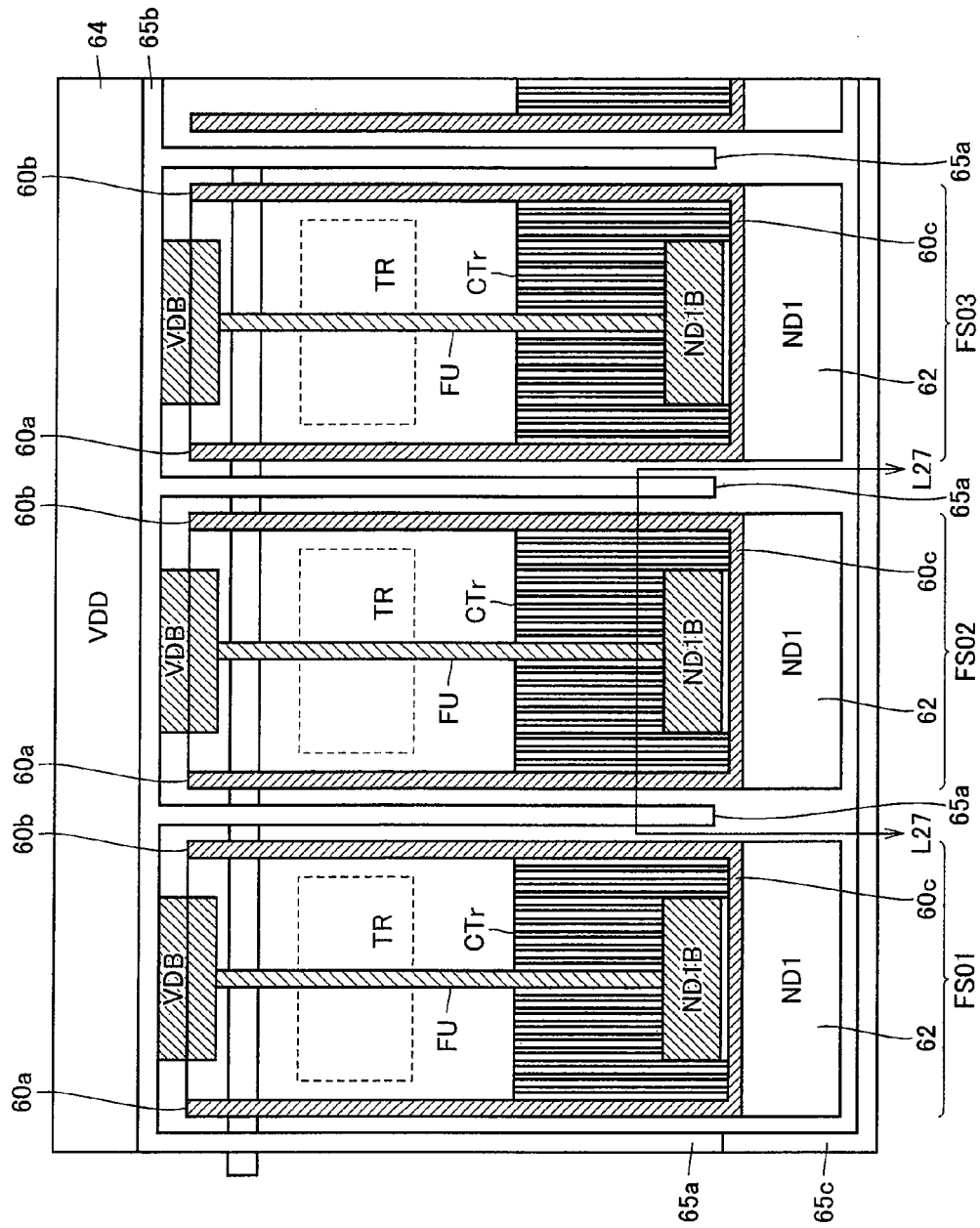
FIG. 26 schematically shows a planar layout of the fuse program circuit according to the invention.

FIG. 26 schematically shows a structure of the fuse elements in the fuse program circuit. FIG. 26 schematically shows a planar layout of fuse elements FS01-FS03. These fuse elements FS01-FS03 include fuses FU formed of copper (Cu) interconnects, respectively. Fuse FU is implemented using a metal interconnect in an upper layer, i.e., in or above the third metal interconnection layer. Fuse FU is coupled to a power supply line 64 via a wide bed region VDB, and is also connected electrically to an interconnection region 62 forming node ND1 through a node bed region ND1B.

Fuse FU is an upper layer interconnect. Below fuse FU, a transistor arrangement region TR is provided for arranging a transistor for cutting fuse FU, and blowing current supply transistor CTr is also arranged. Interconnection region 62 for forming node ND1 is coupled to a drain of blowing current supply transistor CTr, and node bed region ND1B is electrically connected to metal interconnection region 62. By arranging bed regions VDB and ND1B of large widths on the opposite ends of fuse FU, respectively, local concentration of the current is prevented, and the electric connection to fuse FU is stably made.

In a planar layout, interconnects 60a, 60c and 60b are continuously formed substantially in a U-shaped form surrounding fuse FU for forming a protective barrier region against diffusion of copper. Barrier-against-diffusion interconnects 60a-60c are also formed continuously in the direction of height. Although the sectional structure of the fuse element will be described later in detail, interconnect 62 forming node ND1 is also formed above fuse FU.

For interconnect 64 supplying power supply voltage VDD, barrier-against-diffusion interconnections 65a extending in the extending direction of the fuse are arranged alternately to barrier-against-diffusion interconnects 60a and 60b. These barrier-against-diffusion interconnects 65a are connected to power supply interconnect 64, and are also interconnected via barrier-against-diffusion interconnect 65b, which in turn is located near first ends of the fuse elements and extends continuously in a direction crossing the extending direction of fuse FU.

With a barrier wall structure by barrier-against-diffusion interconnects 60a-60c using the interconnects implementing nodes ND1 as well as barrier-against-diffusion interconnects 65a and 65b transmitting the power supply voltage, the diffusion of copper (Cu) of fuse FU is prevented.

Transistor formation region TR and blowing current supply transistor CTr are arranged overlapping with fuse FS in a plan view, so that the occupation area of the fuse program circuit can be small.

Transistors that implement an AND circuit controlling the conduction/non-conduction of blowing current supply transistor CTr are arranged in transistor formation region TR, as will be described later. This AND circuit includes a level conversion circuit and a buffer circuit, and receives fuse gate power supply voltage FGVDD as its operation power supply voltage. The flip-flop of the fuse program circuit is arranged in a region other than a region where fuse FU is arranged.

In this structure of blowing current supply transistor CTr, as already described with reference to FIG. 10, a plurality of unit transistors are arranged in parallel, the source electrode interconnects and the drain electrode interconnects of the unit transistors are arranged alternately, and these drain electrode interconnects are commonly coupled to metal interconnection region 62 and bed interconnect ND1B. The gate electrode interconnect is arranged between the drain and source electrode interconnects. Although not clearly shown in FIG. 26, these gate electrode interconnects are coupled to the outputs of the buffers arranged in transistor formation region TR (see leading-out interconnect 25 in FIG. 10).

Figure 27:
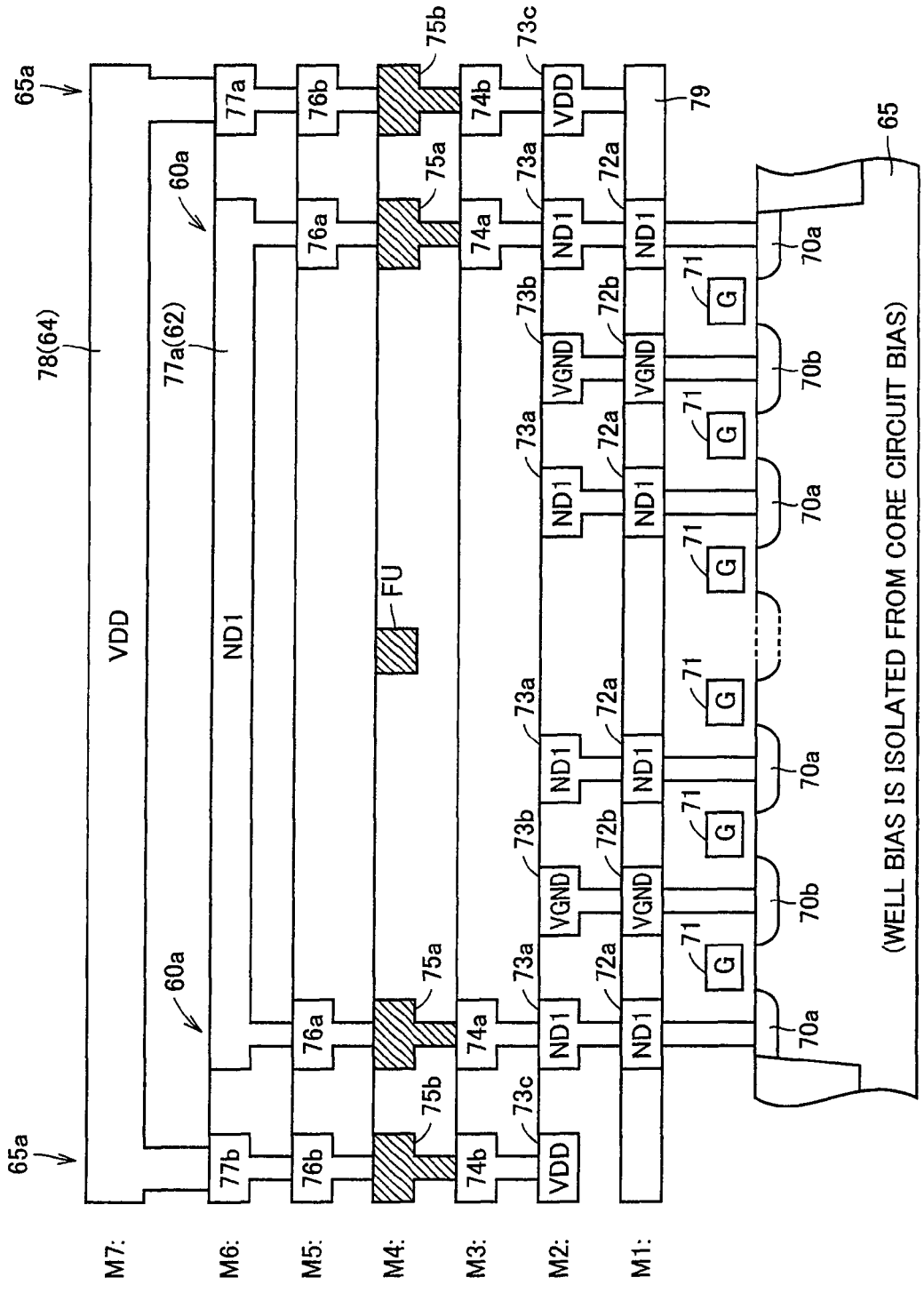
FIG. 27 schematically shows a sectional structure taken along line L27-L27 in FIG. 26.

FIG. 27 schematically shows a sectional structure taken along line L27-L27 in FIG. 26. In FIG. 27, impurity regions 70a and 70b are arranged, at the surface of substrate region (well region) 65, alternately to each other with a space in between. A gate electrode interconnect 71 implementing a gate electrode G is arranged between impurity regions 70a and 70b.

First metal interconnects 72a and 72b are arranged in first metal interconnection layer M1, and are electrically coupled to impurity regions 70a and 70b via contacts, respectively. First metal interconnect 72a is an interconnect electrically connected to node ND1, and first metal interconnect 72b is an interconnect connected to a virtual ground line VGND described later. Virtual ground line VGND is not connected directly to the ground node, and the voltage level thereof is changeable.

In second metal interconnection layer M2, second metal interconnects 73a and 73b are arranged corresponding to first metal interconnects 72a and 72b, and are electrically coupled thereto through first vias, respectively.

Second metal interconnects 73c are arranged at the outermost portions outside second metal interconnects 73a and 73b. Second metal interconnect 73c is electrically coupled to the power supply line, and supplies power supply voltage VDD.

In third metal interconnection layer M3, third metal interconnects 74a and 74b are arranged, and are electrically coupled to second metal interconnects 73a and 73c through second vias, respectively. Third metal interconnects 74a and 74b are arranged in alignment with second metal interconnects 73a and 73b, respectively.

In a fourth metal interconnection layer M4, fourth metal interconnects 75a and 75b are arranged, and are electrically coupled to third metal interconnects 74a and 74b through third vias, respectively. In fourth metal interconnection layer M4, fuse FU is provided using the fourth metal interconnect. In the vicinity of fuse FU, an interconnect is not arranged for the purpose of preventing short circuit due to diffusion of broken pieces of blown fuse and the purpose of preventing a neighboring interconnect from emitting the heat generated from the fuse to suppress rising of the fuse temperature.

In a fifth metal interconnection layer M5, fifth metal interconnects 76a and 76b are arranged, and are electrically coupled to fourth metal interconnects 75a and 75b through the fourth vias, respectively. Fifth metal interconnects 76a and 76b are arrangement in alignment with fourth metal interconnects 75a and 75b. Likewise, an interconnect is not arranged in the vicinity of fuse FU in fifth metal interconnection layer M5.

In a sixth metal interconnection layer M6, a sixth metal interconnect 77a forming node ND1 is arranged over fuse FU. Sixth metal interconnection 77a is electrically coupled to fifth metal interconnect 76a through a fifth via. Sixth metal interconnect 77a is electrically coupled to metal interconnect 62 implementing node ND1 shown in FIG. 26.

In sixth metal interconnection layer M6, a sixth metal interconnect 77b is arranged corresponding to and in alignment with fifth metal interconnect 76b. Sixth metal interconnect 77b is electrically coupled to fifth metal interconnect 75b through the fifth via. A metal interconnection structure transmitting power supply voltage VDD is arranged outside sixth metal interconnect 77a implementing node ND1.

In a seventh metal interconnection layer M7, a seventh metal interconnect 78 is arranged over sixth metal interconnect 77a. Sixth metal interconnect 77b is electrically coupled to seventh metal interconnect 78 through a sixth via. As shown in FIG. 25, power supply interconnect 64 transmitting power supply voltage VDD shown in FIG. 25 is arranged substantially entirely covering fuse FU. Seventh metal interconnect M7 is called a "semi-global interconnect", has a larger film thickness than lower metal interconnects M2-M6, and has a low sheet resistance. In a design rule, seventh metal interconnect M7 (global metal interconnect) is not miniaturized, and has a large interconnect width. This global metal interconnects are used as the power supply lines transmitting ground voltage GND, power supply voltage VDD and the like as well as interconnects transmitting high speed signals of the clock signal system.

In the sectional structure shown in FIG. 27, the structure formed of metal interconnects 73c, 74b, 75b, 76b, 77b and 78 corresponds to barrier-against-diffusion interconnection structure 65a, and the ends of metal interconnects 72a, 73a, 74a, 75a, 76a and 77a correspond to barrier-against-diffusion interconnection structure 60a.

As shown in FIG. 27, the vias and interconnects are arranged over fuse FU. When fuse FU is cut, the barrier layer formed of the barrier metal of fuse FU and the diffusion-proof insulating film is destroyed. The barrier-against-diffusion interconnection structure surrounding fuse FU can prevent the diffusion of copper (Cu) in a planar direction even when the barrier layer is destructed.

To first to seventh metal interconnection layers M1-M7, there are provided interlayer insulating films 79. In FIG. 27, only the interlayer insulating film arranged in first metal interconnection layer M1 is allotted the reference numerals, but similar interlayer insulating films are arranged in the other layers. Interlayer insulating film 79 is an insulative film such as SiCN and has a function of preventing diffusion of copper atoms.

Figure 28:
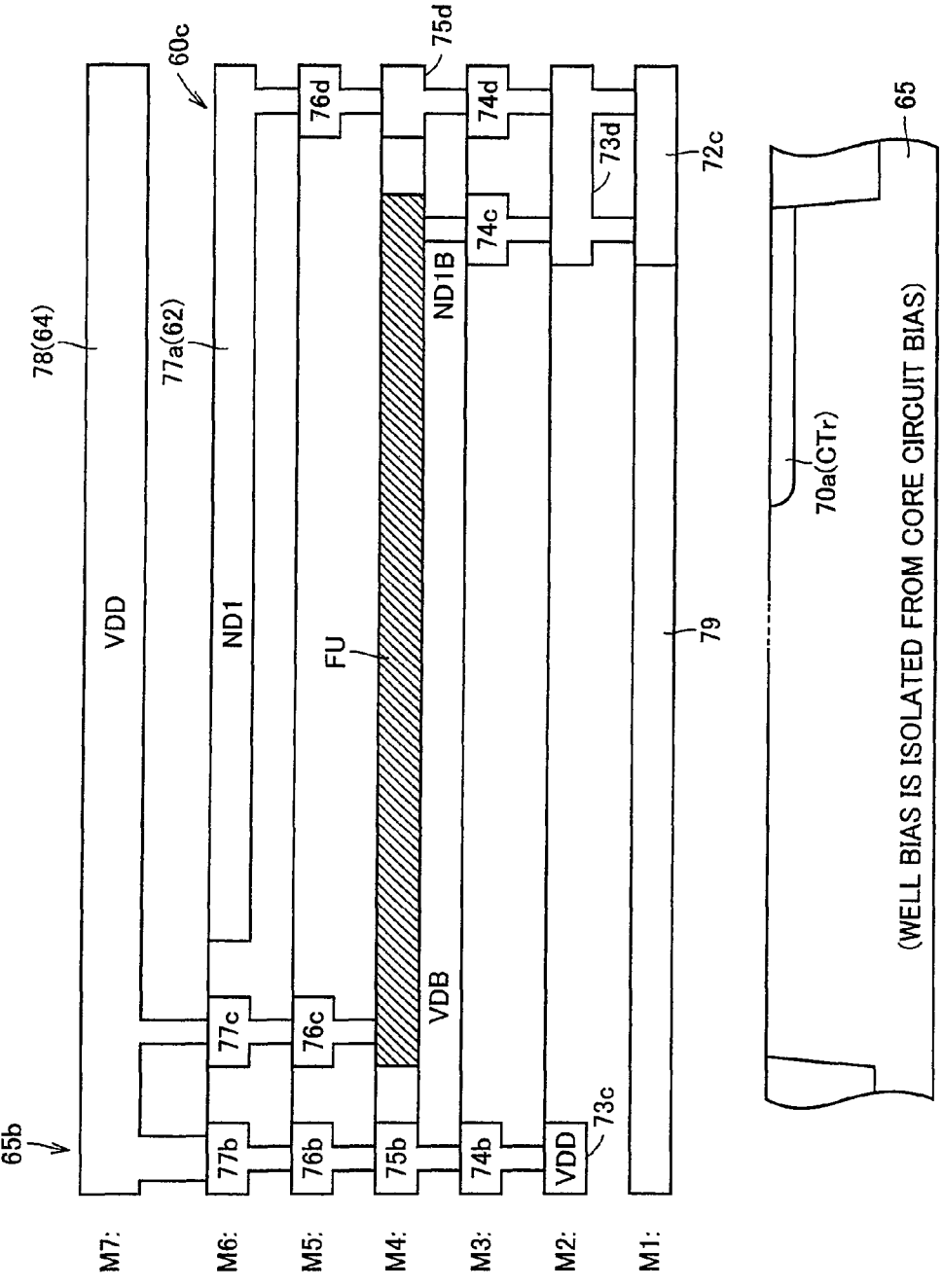
FIG. 28 schematically shows a sectional structure taken along a fuse FU in FIG. 26.

FIG. 28 schematically shows a sectional structure taken in a length direction of fuse FU shown in FIG. 26. In FIG. 28, an active region (impurity region 70a) is formed at the surface of substrate region 65 under fuse FU. Active region 70a is a source or drain region of blowing current supply transistor CTr.

First and second metal interconnects forming a drain electrode of blowing current supply transistor CTr are connected to first and second metal interconnects 72c and 73d through not-shown portions. Second metal interconnects 73c and 73d are electrically connected to third metal interconnects 74c and 74d through vias, respectively.

Third metal interconnect 74c is electrically connected to fuse FU through a second via. Third metal interconnect 74d is electrically connected to sixth metal interconnect 77a (62) covering fuse FU via fourth and fifth metal interconnects 75d and 76d.

The other end of fuse FU in bed region VDB is electrically connected to a fifth metal interconnect 76c through a fourth via. Fifth metal interconnect 76c is connected through a fifth via to a sixth metal interconnect 77c, which in turn is electrically coupled to seventh metal interconnect 78 through a sixth via. Seventh metal interconnect 78 is a semi-global interconnect transmitting power supply voltage VDD or the like, and extends substantially over fuse FU in the length direction of fuse FU.

Seventh metal interconnect 78 is electrically connected through vias to sixth, fifth, fourth, third and second metal interconnects 77b, 76b, 75b, 74b and 73c.

The reference numeral "79" indicating the interlayer insulating film is assigned to the interlayer insulating film arranged in first metal interconnection layer M1 and having the diffusion barrier function. Likewise, interlayer insulating films having a function of preventing the copper diffusion are arranged for the other layers, respectively.

Therefore, even at the opposite ends of fuse FU, barrier-against-diffusion interconnection structures 65b and 65c are formed, and prevent the diffusion of copper (Cu) atoms in the planar direction thereof.

Transistors are arranged below fuse FU. The interconnect in fourth metal interconnection layer M4 is used as fuse FU. When a shield interconnect for preventing the diffusion or a normal interconnect (the interconnect in second or fourth metal interconnection layer M2 or M4 in the case of using the interconnect in third metal interconnection layer M3 as fuse FU) is present immediately above or immediately under fuse FU, such interconnect functions to release a heat, and suppresses rising of the temperature of fuse FU to make it difficult to cut fuse FU. Although the fuse can be implemented using the metal interconnect in third metal interconnection layer M3, With fuse FU being implemented by the fourth metal interconnect in the upper layer, the fuse can efficiently be heated to be cut.

The interconnects for the transistors formed below fuse FU are arranged using the interconnects in the second and lower interconnection layers. In third metal interconnection layer M3, the interconnect is not arranged under fuse FU. This prevents an impact caused by the fuse blowing from adversely affecting the lower interconnects, and/or the copper (Cu) atoms from diffusing into the interconnects in the lower layers through the interlayer insulating films to cause failure such as short circuit.

Seventh metal interconnect 78 transmitting power supply voltage VDD has a portion located outside interconnection structure 62 forming node ND1, and this portion is also connected to the interconnect in the lower layer to form the interconnection structure of the diffusion barrier structure.

Figure 29A:
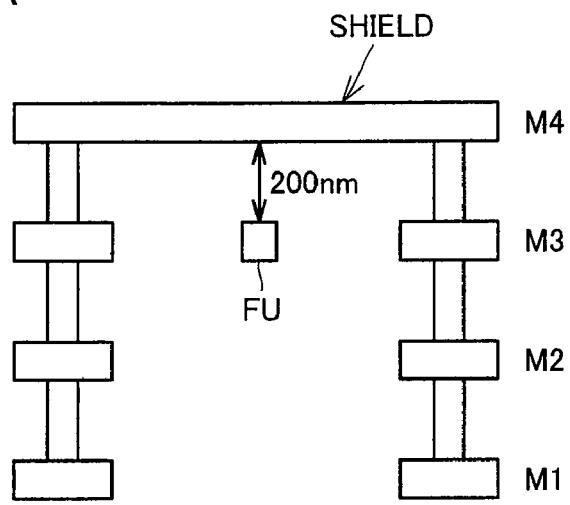
FIG. 29A shows an example of the fuse and an diffusion protection barrier structure.
Figure 29B:
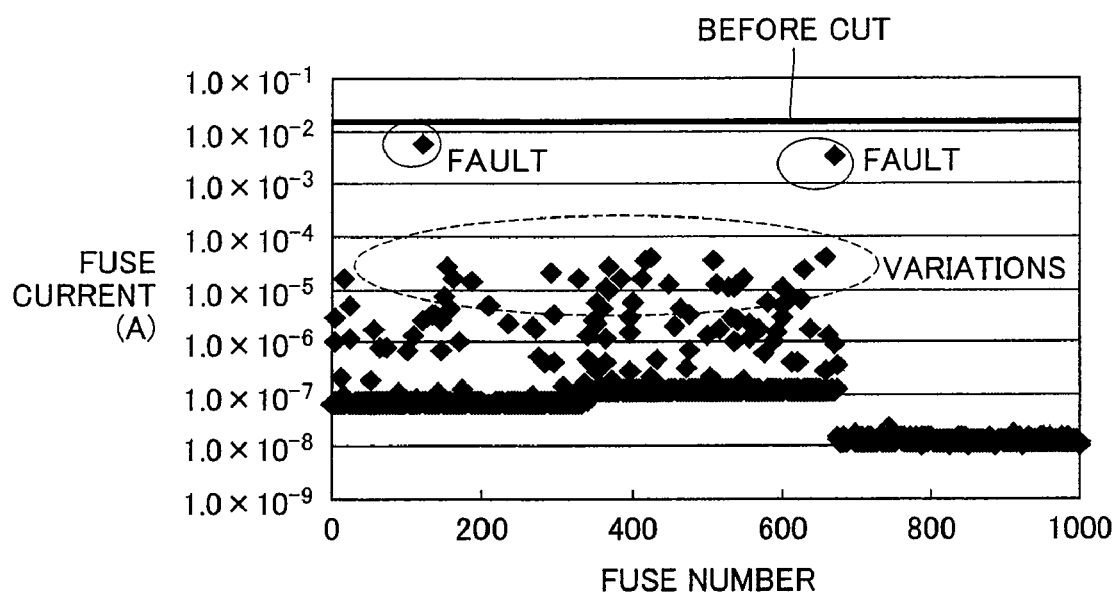
FIG. 29B shows a distribution of fuse currents flowing before and after the cut of the fuse structure in FIG. 29A.
Figure 30A:
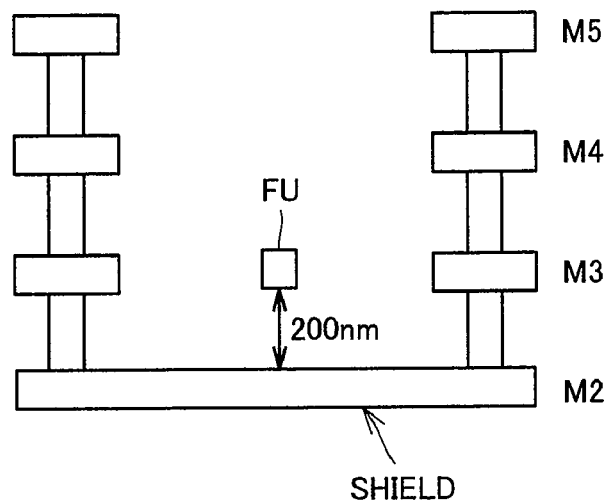
FIG. 30A shows another example of the fuse and the diffusion protection barrier structure.
Figure 30B:
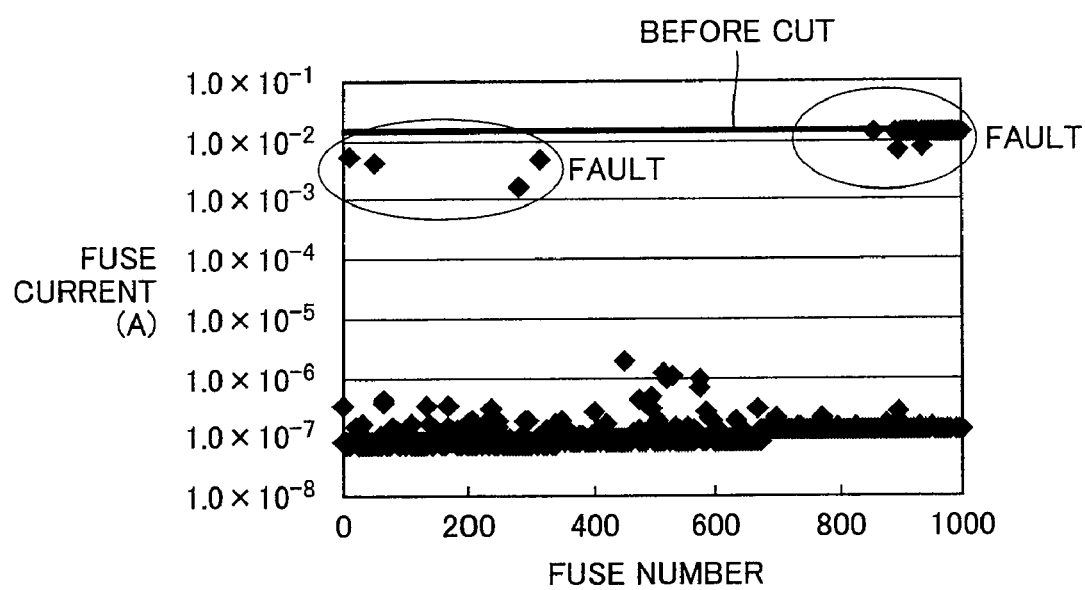
FIG. 30B shows a distribution of the fuse currents flowing before and after the blowing of the fuse structure in FIG. 30A.
Figure 31A:
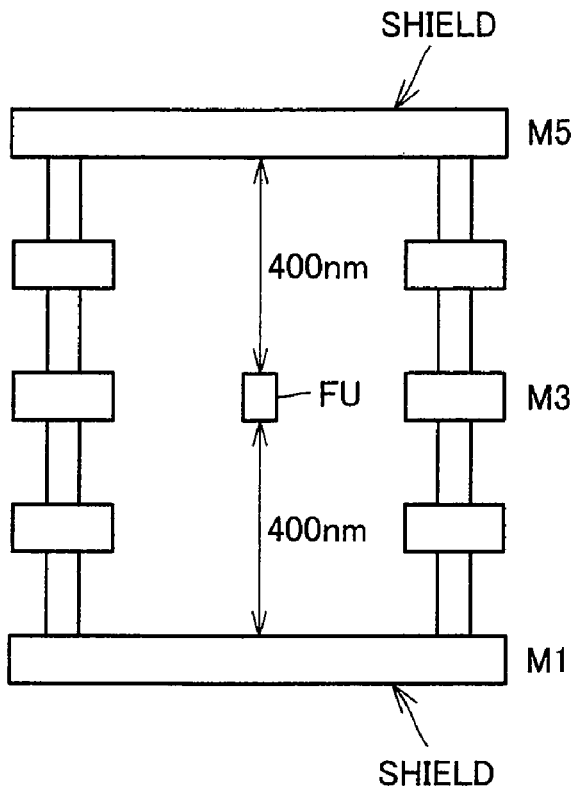
FIG. 31A shows still another example of the fuse and the diffusion protection barrier structure.

FIGS. 29A and 29B-31A and 31B show a relationship of the distance between the fuse and the shield interconnect with respect to the cuttability of the fuse. FIGS. 29A, 30A and 31A show the barrier interconnection structure of the fuse, and fuse 29B, 30B and 31B show the fuse current in the corresponding fuse structure before the cutting. In each of FIGS. 29B, 30B and 31B, the vertical axis measures a fuse current in ampere (A), and a horizontal axis measures a fuse number. As for the current application condition, an operation of applying voltages of 1.8 V and 1.3 V for 1 μs repeated 10 times. The current before the cutting is indicated by a straight line slightly higher than 1.0E-02A (−2 raised to the power of 10), and the currents flowing after the cutting are indicated by black rhombus.

In FIG. 29A, fourth metal interconnect M4 is used as the shield interconnect, and fuse FU is formed of third metal interconnect M3. A distance between fuse FU and the shield interconnect (fourth metal interconnect) is 200 nm. In this state, large variation occurs in fuse current after the cutting as shown in FIG. 29B. Also, faulty cutting occurs in some fuses. Since the shield interconnect in the layer above fuse FU absorbs and emits the heat produced by fuse FU, the temperature rising of the fuse is suppressed.

In FIG. 30A, fuse FU is likewise formed of third metal interconnect M3. Second metal interconnect M2 in the lower layer is used as the shield interconnect. In this case, the distance between fuse FU and the lower shield interconnect is 200 nm. In this case, variation in current after the cutting is small, but faulty cutting occurs in some fuses. Since the neighboring shield interconnect is not present in the upper layer, the heat generated by fuse FU is absorbed to a lower extent than the structure shown in FIG. 29A, and variation in cutting of fuses FU is small. However, the shield interconnect is present in the lower layer, and therefore absorbs the heat so that faulty cutting occurs in some fuses.

Figure 31B:
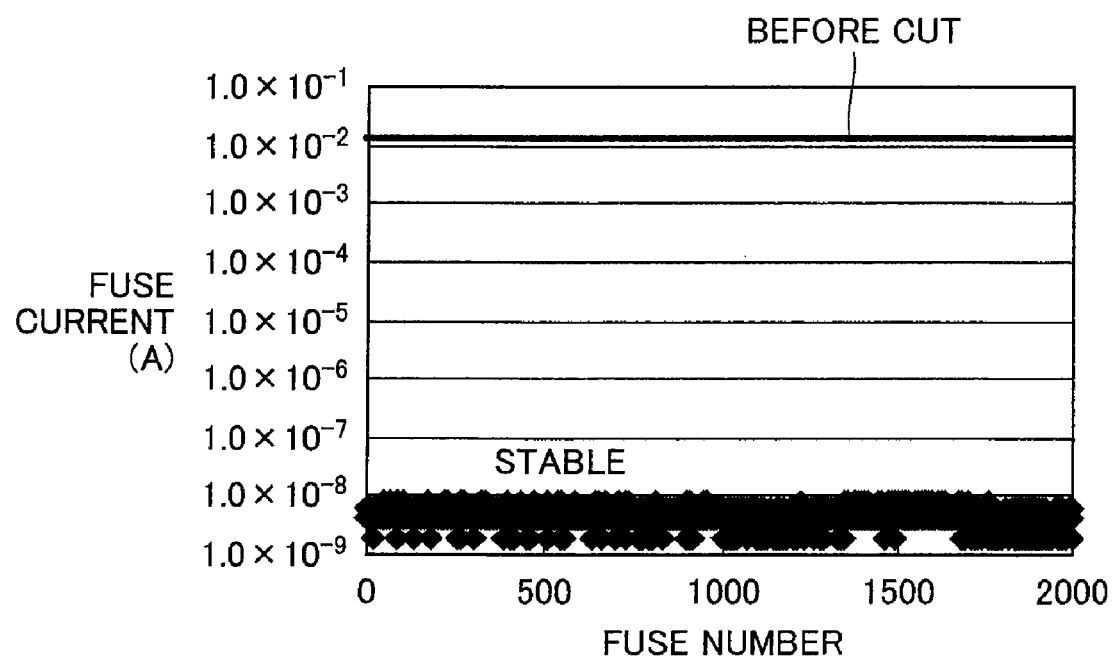
FIG. 31B shows a distribution of the fuse currents flowing before and after the blowing of the fuse structure in FIG. 31A.

In FIG. 31A, fuse FU is formed of third metal interconnect M3, but first metal interconnect M1 in the lower layer and the fifth metal interconnect in the upper layer are used as the shield interconnects. The distance between fuse FU and the shield interconnect is 400 nm. No shield interconnect neighbors to the upper or lower layer, and the heat is absorbed only extremely slightly. As shown in FIG. 31B, therefore, no variation occurs in fuse current after the cutting, and no faulty cutting of fuse occurs. The fuse current after the cutting is equal to or lower than 1.0E-08A, and every fuse is reliably blown off.

As shown in FIGS. 29A and 29B-31A and 31B, when the interconnect (s) is (are) present near the fuse, the shield interconnect (s) act (s) as a emitting plate(s), and suppress the temperature rising of the fuse so that the fuse cannot be cut easily. When second and first metal interconnects M2 and M1 are used for the interconnects of the transistors formed in the lower layer, by using an interconnect in the fourth or higher metal interconnection layer for fuse FU, a space of one or more layers can be formed between the fuse and the shield interconnect, so that the fuse can have the temperature raised easily, to be cut reliably.

Figure 32:
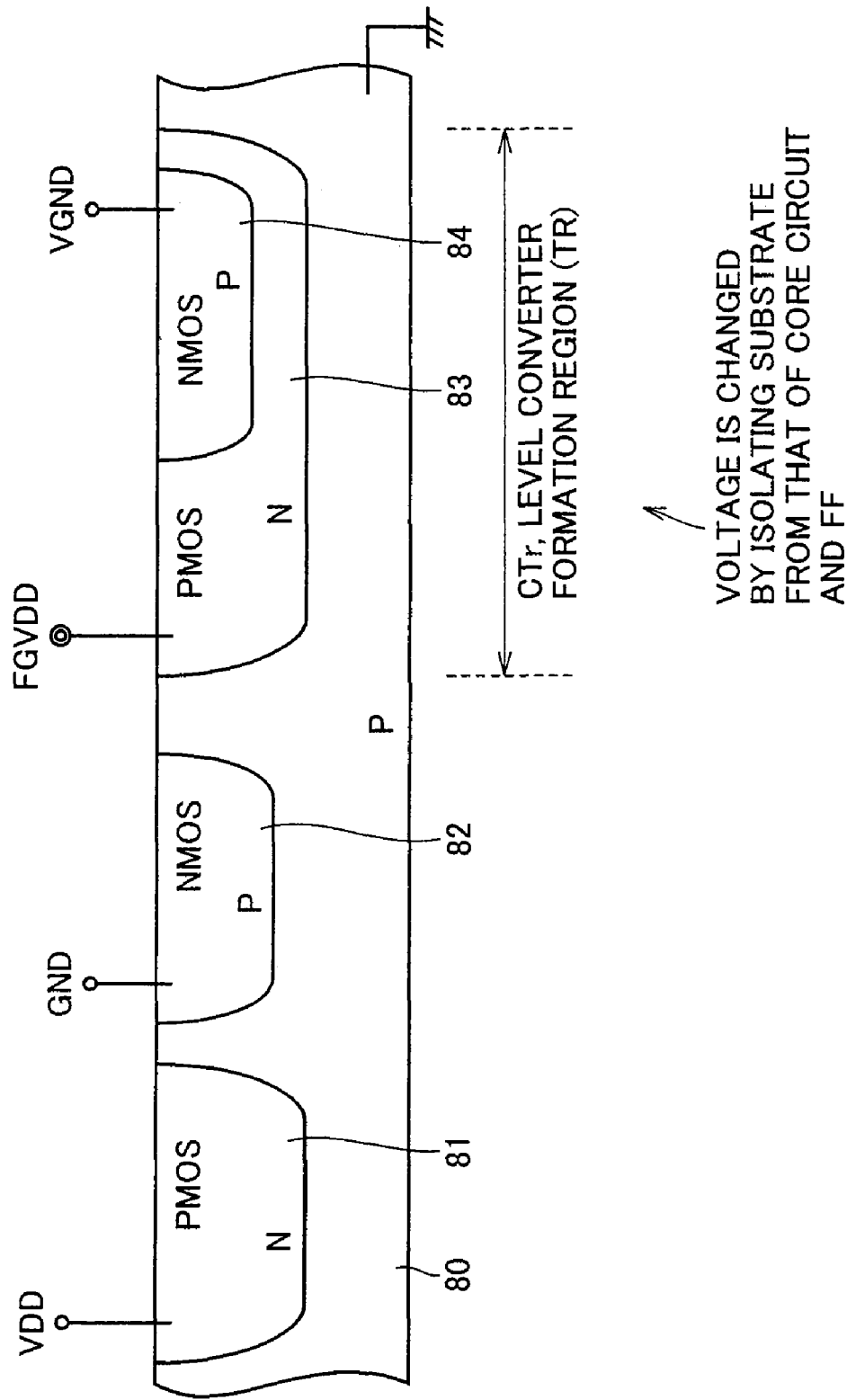
FIG. 32 schematically shows a structure of a transistor formation region in the fuse element shown in FIG. 26.

FIG. 32 shows a schematic structure of the fuse program circuit, and particularly shows a region for forming and arranging the transistors under the fuse element. In FIG. 32, an N-well 81, a P-well 82 and an N-well 83 spaced from each other are formed at a surface of a substrate region 82 in a region under fuse FU of the fuse program circuit. Further, a P-well 84 is formed at N-well 83, and N-channel MOS transistors are formed at P-wells 82 and 84.

Blowing current supply transistor CTr and the level converter including the buffer are formed in the region of the triple well structure that has N- and P-wells 83 and 84 formed in the P-type substrate region. This level converter formation region corresponds to transistor formation region TR shown in FIG. 26.

A component such as a flip-flop (FF; PS and FSSR) in the fuse program circuit and a circuit such as a multiplexer are formed at N-well 81 and P-well 82. Power voltage VDD is applied as the substrate bias voltage to N-well 81, and ground voltage GND is applied as the substrate bias voltage to P-well 82. Fuse gate power supply voltage FGVDD is applied as the bias voltage to N-well 83, and P-well 84 is coupled to virtual ground line VGND, which will be described later.

Fuse gate power supply voltage FGVDD is applied from a pad (power supply node) other than power supply voltage VDD. Fuse gate power supply voltage FGVDD is used to adjust the current driven by blowing current supply transistor CTr, and has the voltage level set higher or lower than power supply voltage VDD. Therefore, N- and P-wells 83 and 84 are spaced from other wells 81 and 82 on substrate region 80, whereby the voltage level of fuse gate power supply voltage FGVDD can be adjusted without affecting the circuits receiving another power supply voltage VDD.

Virtual ground line VGND is coupled to P-well 84, and prevents a substrate noise caused by the blowing current flowing at the time of fuse blowing from propagating to another circuit region to cause a circuit malfunction. Also, the voltage level of fuse gate power supply voltage FGVDD can be set to an optimum value independently of the voltage level of power supply voltage VDD.

The triple-well structure (wells 83 and 84) in each fuse program circuit is spaced from those in the other fuse program circuits.

[Construction of Virtual Ground Line]

Figure 33:
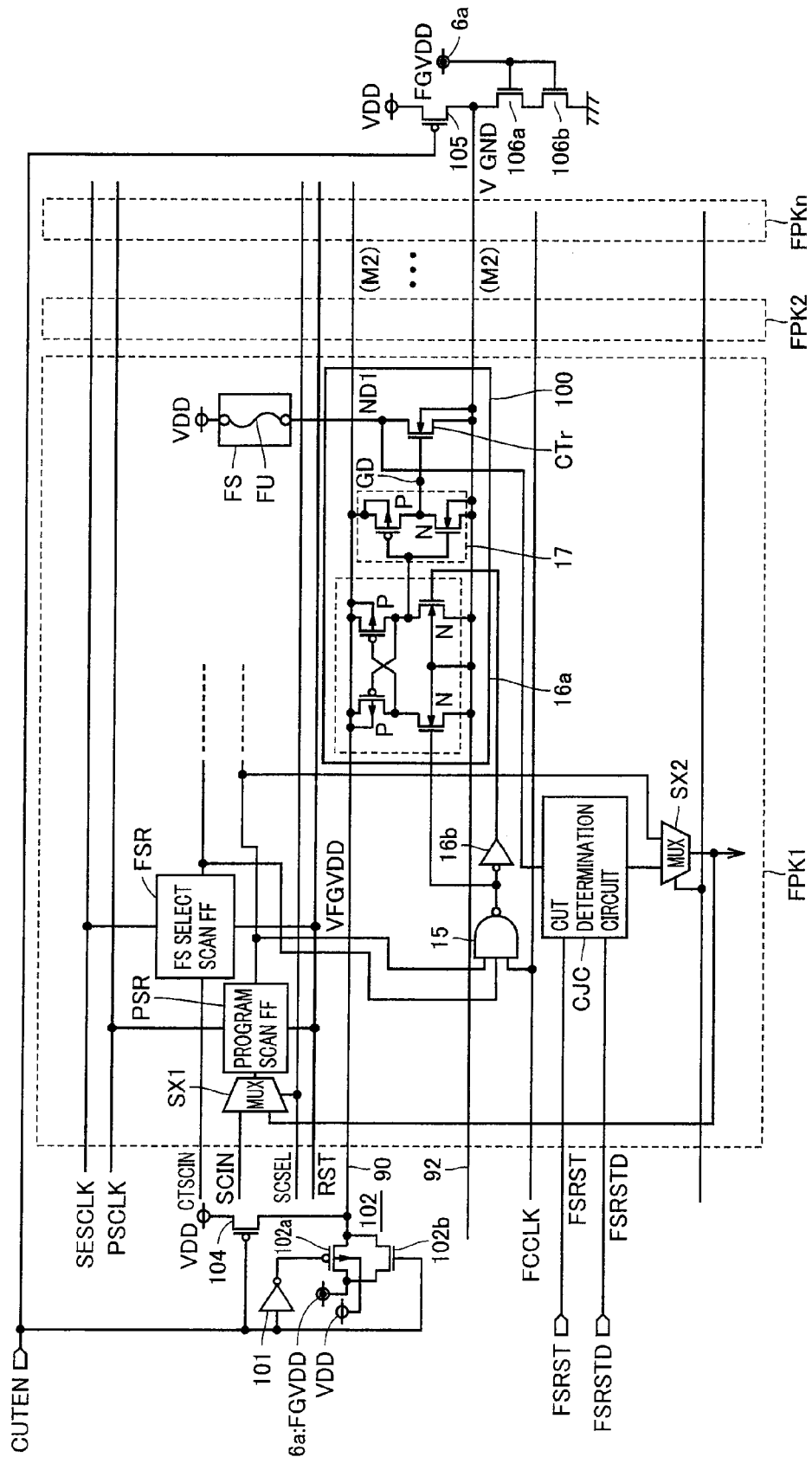
FIG. 33 schematically shows a construction of a power supply control circuitry of the fuse program circuit according to the invention.

FIG. 33 shows a construction of a power supply system for the portion driving blowing current supply transistor CTr. In FIG. 33, fuse program circuits FPK1-FPKn are arranged. Since these fuse program circuits FPK1-FPKn have the same construction, FIG. 33 representatively shows a construction of fuse program circuit FPK1.

Fuse element FS includes fuse FU, and a circuit block 100 is arranged under fuse FU. Circuit block 100 includes a level converter 16a, inverter buffer 17 inverting an output signal of level converter 16a, and blowing current supply transistor CTr selectively made conductive according to an output signal of inverter 17.

Level converter 16a and an inverter 16b form level conversion circuit 16 shown in FIG. 8. Inverter 16b receives power supply voltage VDD as an operation power supply voltage, and is not arranged under fuse FU. A transistor receiving fuse gate power supply voltage FGVDD is arranged under fuse FU.

A fuse gate power supply line 90 and a virtual ground line (VGND) 92 are arranged being shared by fuse program circuits FPK1-FPKn. Fuse gate power supply line 90 is coupled to sources and substrate regions of P-channel MOS transistors (indicated by "P") in this circuit block 100. Virtual ground line 92 is coupled to sources and substrate regions of N-channel MOS transistors (indicated by "N") in circuit block 100. In these N-channel MOS transistors, such situations are prevented that a back gate effect is exerted even to potential changes of virtual ground line 92, and that a PN junction between the substrate region and the impurity region becomes conductive. Thereby, these transistors can operate stably even when the voltage on virtual ground line 92 changes.

To fuse gate power supply line 90, there are provided a P-channel MOS transistor 104 that is selectively made conductive according to cut enable signal CUTEN, to transmit power supply voltage VDD to fuse gate power supply line 90, and a CMOS transmission gate 102 that is made conductive to couple fuse gate power supply node 6 to fuse gate power supply line 90 when cut enable signal CUTEN is at H level.

CMOS transmission gate 102 includes P- and N-channel MOS transistors 102a and 102b. A substrate region of P channel MOS transistor 102 is coupled to the power supply node supplying power supply voltage VDD. Even when fuse gate power supply voltage FGVDD is set to a voltage level higher than power supply voltage VDD, the PN junction (between the impurity region and the substrate region) of P channel MOS transistor 102a is kept in a reverse bias state by its built-in voltage, and the conduction of the PN junction of the substrate region is prevented. In the case where fuse gate power supply voltage FGVDD is set to a voltage level higher than a sum of power supply voltage VDD and the built-in voltage, it is sufficient to provide a switch circuit that selectively connects the substrate region of P-channel MOS transistor 102a to fuse gate power supply node 6a and the node (power supply node 5a) supplying power supply voltage VDD according to the operation mode.

To virtual ground line 92, there are provided a P-channel MOS transistor 105 that is turned on to transmit power supply voltage VDD to virtual ground line 92 when a cut enable signal CUTEN is at L level, and N channel MOS transistors 106a and 106b that are connected in series between virtual ground line 92 and the ground node and have gates coupled to fuse gate power supply node 6a. These MOS transistors 106a and 106b are implemented by core transistors having the same structure (the same gate insulating film thickness, gate insulating film material and (gate width)/(gate length)) as the transistors in the core circuit.

Other circuit configuration of fuse program circuit FPK1 is the same as that of fuse program circuits FPK1-FPKn shown in FIG. 5. Corresponding portions are allotted the same reference numerals, and description thereof will not be repeated.

Figure 34:
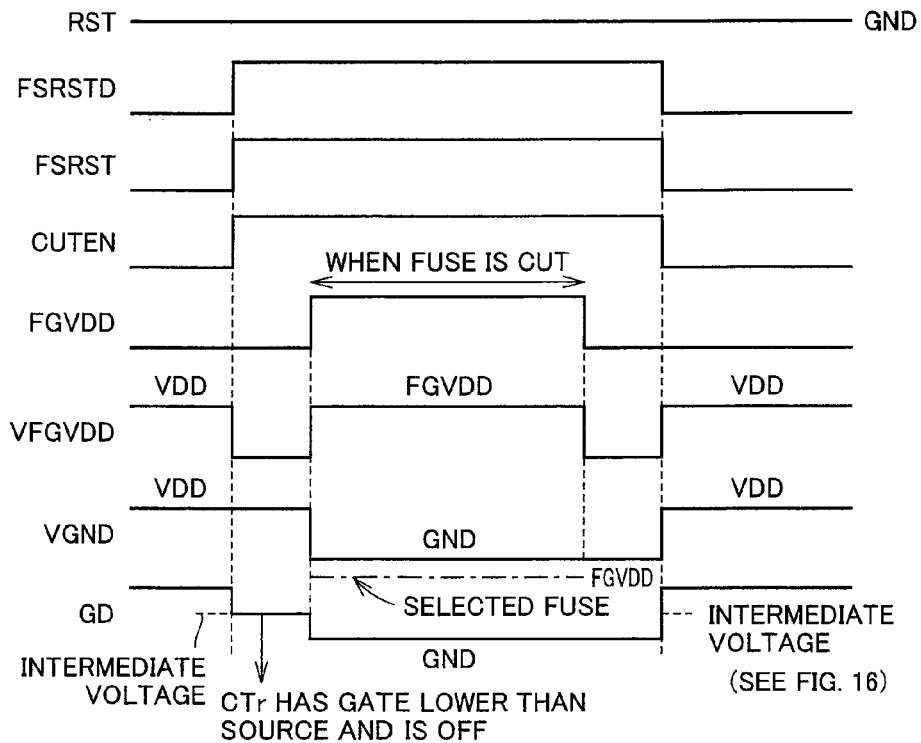
FIG. 34 is a signal waveform diagram representing an operation of the fuse program circuit shown in FIG. 33 performed in fuse cutting.

FIG. 34 shows a change sequence of fuse gate power supply voltage FGVDD and virtual ground voltage VGND in the fuse element blowing operation. Referring to FIG. 34, description will now be given on the sequence of applying voltages on fuse gate power supply line 90 and virtual ground line 92 in the fuse cut operation.

Before the fuse blowing, both reset signals FSRSTD and RSRST are at L level. In this state, MOS transistor PQ2 charges node ND1 to the level of power supply voltage VDD as shown in FIG. 16. Since cut enable signal CUTEN is at L level, MOS transistor 104 is in an on state, and CMOS transmission gate 102 is non-conductive. Voltage FGVDD on fuse gate power supply line 90 is at the level of power supply voltage VDD. MOS transistor 105 maintains virtual ground line 92 at the level of power supply voltage VDD. In this state, therefore, the power supply line and the ground line on the opposite sides in circuit block 100 are both at the level of power supply voltage VDD, and an output signal GD of inverter buffer 17 is at the level of power supply voltage VDD. Likewise, all the internal interconnects (first and second metal interconnects) in circuit block 100 are kept at the level of power supply voltage VDD, or at the voltage level equal to the voltage levels of the opposite ends of fuse FU.

First, in the fuse cutting operation, fuse element reset delay signal FSRSTD and fuse element reset signal FSRST attain the H level, and cut enable signal CUTEN attains the H level. Reset signal RST is kept at L level. Fuse gate power supply voltage FGVDD is driven to the ground voltage level. CMOS transmission gate 102 is turned on according to cut enable signal CUTEN, and the voltage VFGVDD on fuse gate power supply line 90 lowers to the ground voltage level. All MOS transistors 105, 106a and 106b are turned off and virtual ground line 92 is kept in the floating state at the level of power supply voltage VDD. In circuit block 100, therefore, the charges on the internal node that has been precharged to the power supply voltage level move according to the voltages on fuse gate power supply line 90 and virtual ground line 92. Specifically, the charges move from the internal node to fuse gate power supply line 90, and the voltage level thereof changes to an intermediate voltage level.

In this state, the gate potential of blowing current supply transistor CTr (the potential on node GD) is at an intermediate potential level lower than that of the source node (the voltage on virtual ground line 92), and blowing current supply transistor CTr is in a weak on state so that substantially no leakage current flows in circuit block 100. As shown in FIG. 16, MOS transistors PQ1 and PQ2 in cut determination circuit CJC are in an off state, and cut determination circuit CJC does not supply the current to node ND1.

Then, in the fuse cutting operation, fuse gate power supply voltage FGVDD supplied to node 6a rises to the cutting voltage level. In response to the rising of fuse gate power supply voltage FGVDD, the voltage VFGVDD on fuse gate power supply line 90 attains the voltage level of fuse gate power supply voltage FGVDD through CMOS transmission gate 102. When the voltage level of fuse gate power supply voltage FGVDD rises, MOS transistors 106a and 106b turn conductive, the voltage VGND on virtual ground line 92 is driven to the level of ground voltage GND. Accordingly, the output signal of inverter buffer 17 in an unselected fuse program circuit attains the level of ground voltage GND according to the output signal of NAND gate 15. In a selected fuse program circuit, the output signal GD of inverter buffer 17 attains the level of fuse gate power supply voltage FGVDD according to the output signal of NAND gate 15, and blowing current supply transistor CTr is turned on to pass the current through fuse FU for cutting fuse FU. By adjusting the voltage level of fuse gate power supply voltage FGVDD, it is possible to adjust the magnitude of the fuse blowing current flowing through blowing current supply transistor CTr.

When the fuse cutting period expires, fuse gate power supply voltage FGVDD is driven to the ground voltage level again so that the voltage VFGVDD on fuse gate power supply line 90 lowers to the ground voltage level. Responsively, MOS transistors 106a and 106b are turned off so that virtual ground line 92 enters the floating state. In circuit block 100, the voltage of fuse gate power supply line 90 lowers so that the voltage level thereof attains an intermediate voltage level.

In circuit block 100, NAND gate 15 generates the output signal at the H or L level and level converter 16a has the P channel MOS transistor (indicated by a reference character "P") made non-conductive, and the output signal thereof attains an intermediate voltage level.

In inverter buffer 17, the charges move via N- and P-channel MOS transistors (indicated by reference characters "N" and "P", respectively), and output signal GD in the selected fuse program circuit lowers to the ground voltage level. In the unselected fuse program circuit, output signal GD of inverter buffer 17 is kept at the ground voltage level. Therefore, blowing current supply transistor CTr is in the off state.

When the fuse cutting is completed in the selected fuse program circuit, the signals FSRSTD, FSRST and CUTEN fall to the L level. Responsively, CMOS transmission gate 102 is turned off, and MOS transistor 104 keeps the voltage VFGDD on fuse gate power supply line 90 at the level of power supply voltage VDD. Likewise, MOS transistor 105 keeps virtual ground line 92 at the level of power supply voltage VDD. Thus, the voltage level of the internal metal interconnects in circuit block 100 attains the level of power supply voltage VDD.

In the operations for the fuse cutting except for the actual fuse cutting operation, the metal interconnects in circuit block 100 are at the same level as those of the opposite ends of fuse FU, and this suppresses movement of the copper atoms of the broken pieces of the fuse to the interconnects. Further, the on and off of PMOS transistors 102a and 105 are controlled according to cut enable signal CUTEN, so that the voltage levels of fuse gate power supply line 90 and virtual ground line 92 are easily adjusted according to the fuse cutting operation.

When cut enable signal CUTEN is at the H level, the fuse element is cut according to fuse cut enable signal CUTEN. In an unselected fuse program circuit, the output signal of NAND gate 15 is at the H level regardless of the state of fuse cut clock signal FCCLK. The period of the H level of cut enable signal CUTEN determines the period for cutting the fuse.

Figure 35:
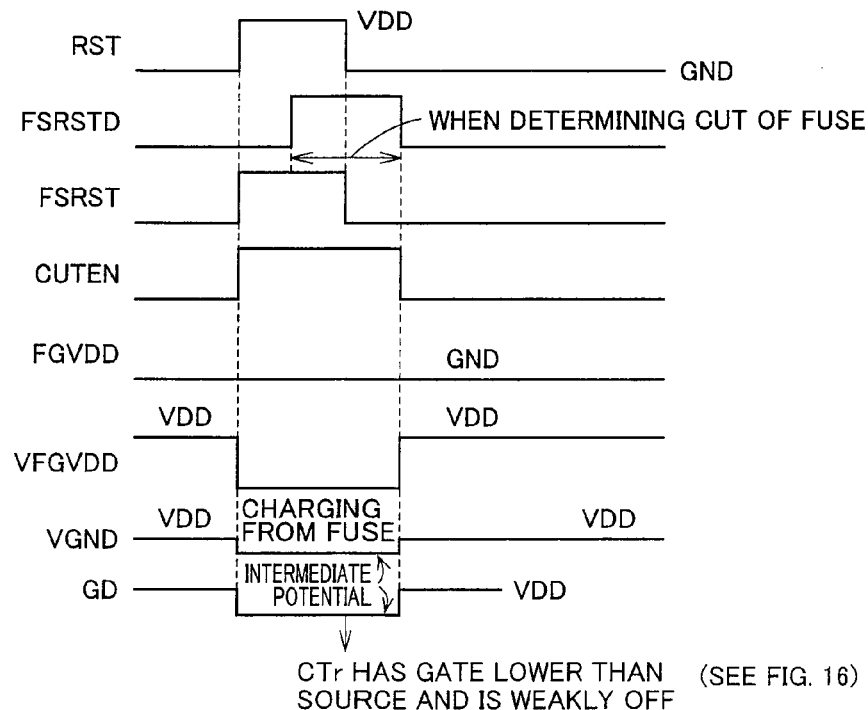
FIG. 35 is a signal waveform diagram representing an operation of the fuse program circuit shown in FIG. 33 performed in determining the fuse cutting.

FIG. 35 is a signal waveform diagram representing a determination operation after the fuse cutting. Referring to FIGS. 35 and 16, description will now be given on voltage changes of fuse gate power supply line 90 and virtual ground line 92 shown in FIG. 33.

Before determination of the fuse cutting, cut enable signal CUTEN is at the L level, and reset signal RST, fuse element reset signal FSRST and fuse element reset delay signal FSRSTD are at the L level. Therefore, voltage VFGVDD on fuse gate power supply line 90 and voltage VGND on virtual ground line 92 are both at the level of power supply voltage VDD. In the operation of determining the level, gate node GD of blowing current supply transistor CTr is at the level of power supply voltage VDD. The output signal and the output node of inverter buffer 17 are indicated by the same reference character.

Then, cut enable signal CUTEN is driven to the H level, and reset signals RST and FSRST are driven to the H level. Responsively, CMOS transmission gate 102 is turned on to maintain the voltage VFGVDD on fuse gate power supply line 90 at the level of ground voltage GND equal to fuse gate power supply voltage FGVDD. According to reset signal RST, the output signals of scan flip-flops PSR and FSR attain the L level, and the output signal of NAND gate 15 attains the H level. Responsively, the N channel MOS transistor (using node GD as its source node) in inverter buffer 17 is turned on, output signal GD of circuit block 100 attains the intermediate voltage level so that blowing current supply transistor CTr enters a weak off state.

MOS transistors 105, 106a and 106b are all in an off state, and virtual ground line 92 is in the floating state. Therefore, charges, supplied to virtual ground line 92 via blowing current supply transistor CTr by the current supplied from the uncut fuse or the current supplied in initialization period via the MOS transistor (PQ2) from cut determination circuit CJC, move to fuse gate power supply line 90 via circuit block 100 and accordingly, the virtual ground line has the voltage level lowered to an intermediate voltage level.

When a difference between output signal GD of inverter 17 and voltage VGND of virtual ground line 92 attains the level of the threshold voltage of blowing current supply transistor CTr, blowing current supply transistor CTr is turned off, and the leakage current decreases. Accordingly, the voltage level of virtual ground line 92 becomes stable at the voltage defined by the voltage level of the signal GD at the intermediate voltage level.

MOS transistors 106a and 106b provided for virtual ground line 92 have the gate voltages at the ground voltage level, and the leakage current that may flow from virtual ground line 92 to the ground node is suppressed.

Then, reset delay signal FSRSTD is driven to the H level, and reset signals RST and FSRST are driven to the L level. At this time, program scan flip-flop PSR may re-store via multiplexer SX2 the information that was stored before the resetting. In determining the cutting of the fuse element, the determination operation is merely performed in cut determination circuit CJC, and the stored information of scan flip-flops PSR and FSR do not affect the determination operation. Therefore, no particular problem occurs even when these scan flip-flops PSR and FSR hold the reset state. When fuse element reset delay signal FSRSTD attains the H level according to this reset signal RST, the voltage level of the internal node (ND2) in cut determination circuit CJC changes according to the cut/non-cut of this fuse element, and the cut/non-cut of the fuse is determined. During the period of this determination, no current flows to virtual ground line 92 (blowing current supply transistor CTr is in the off state).

When this determination period expires, fuse element reset delay signal FSRSTD and cut enable signal CUTEN are driven to the L level. Accordingly, MOS transistor 104 drives fuse gate power supply line 90 to the level of power supply voltage VDD, and MOS transistor 105 charges virtual ground line 92 to the level of power supply voltage VDD. Thereby, the internal node (second metal interconnect) in circuit block 100 is recovered to the level of power supply voltage VDD.

Figure 36:
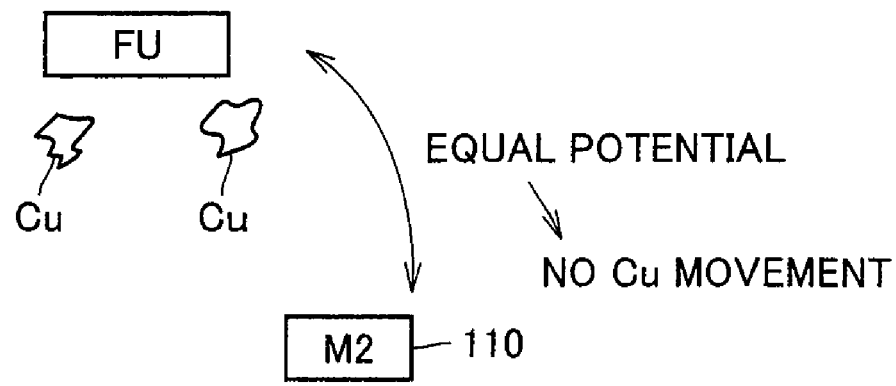
FIG. 36 schematically illustrates an effect of the construction shown in FIG. 33 achieved in fuse cutting.

Accordingly, during periods except the period of the actual fuse cutting, the internal nodes (second metal interconnect) in circuit block 100 are always kept at the level of the voltage (power supply voltage VDD) on the opposite ends of fuse FU. Therefore, during periods except the period of fuse cutting, fuse FU and second metal interconnect (M2) 110 are kept at the same potential as shown in FIG. 36. Fuse FU is blown, and the copper atoms of the broken portion or the dispersing portion do not move from fuse element FU to the second metal interconnect (M2) 110 so that insulation breakdown due to broken pieces of the fuse element and the like can be suppressed.

Figure 37:
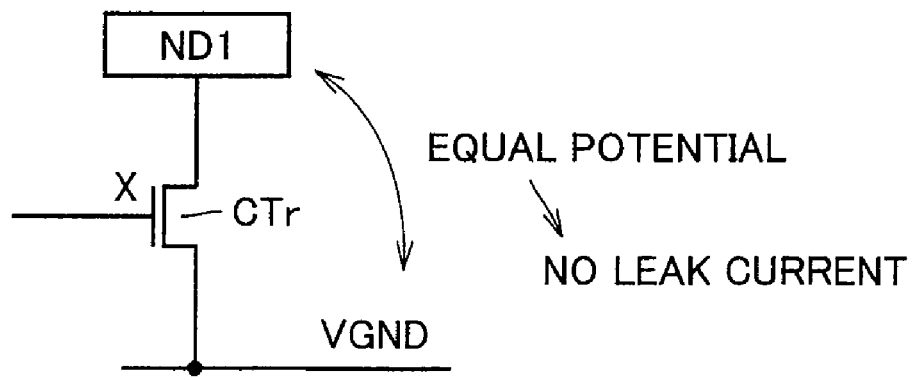
FIG. 37 schematically illustrates an effect of the construction of the fuse program circuitry shown in FIG. 33.

As shown in FIG. 37, even when the cutting of the fuse element causes destruction of the gate insulating film of blowing current supply transistor CTr formed in the lower layer as indicated by "X", the voltage VGND on the virtual ground line is kept at the same voltage level as the voltage at node ND1. Therefore, the equal potentials are always kept except for the period of the fuse cutting operation, the flow of the leakage current is suppressed (when the cut determination circuit operates). When fuse FU of corresponding fuse element FS is not cut, the gate potential (potential of GD) of blowing current supply transistor CTr is equal to the intermediate voltage level, and blowing current supply transistor CTr is kept off so that flow of the leakage current is suppressed. This holds for the MOS transistors of level converter 16a and inverter buffer 17.

In the operation of determining the cutting of the fuse, voltage VGND on virtual ground line 92 is kept at the level of power supply voltage VDD on the opposite ends of the fuse element, and the flow of the leakage current through circuit block 100 is suppressed.

On virtual ground line 92, two MOS transistors 106a and 106b are connected in series, and have the gates coupled to node 6a receiving fuse gate power supply voltage FGVDD. In a normal operation, therefore, the voltage FGVDD is kept at the ground voltage level so that the flow of the channel leakage current through virtual ground line 92 is suppressed.

Thereby, it is possible to suppress the flow of the leakage current through blowing current supply transistor CTr of a large size, regardless of the state of the fuse element.

[First Modification of Power Supply Circuit of Fuse Program Circuit]

Figure 38:
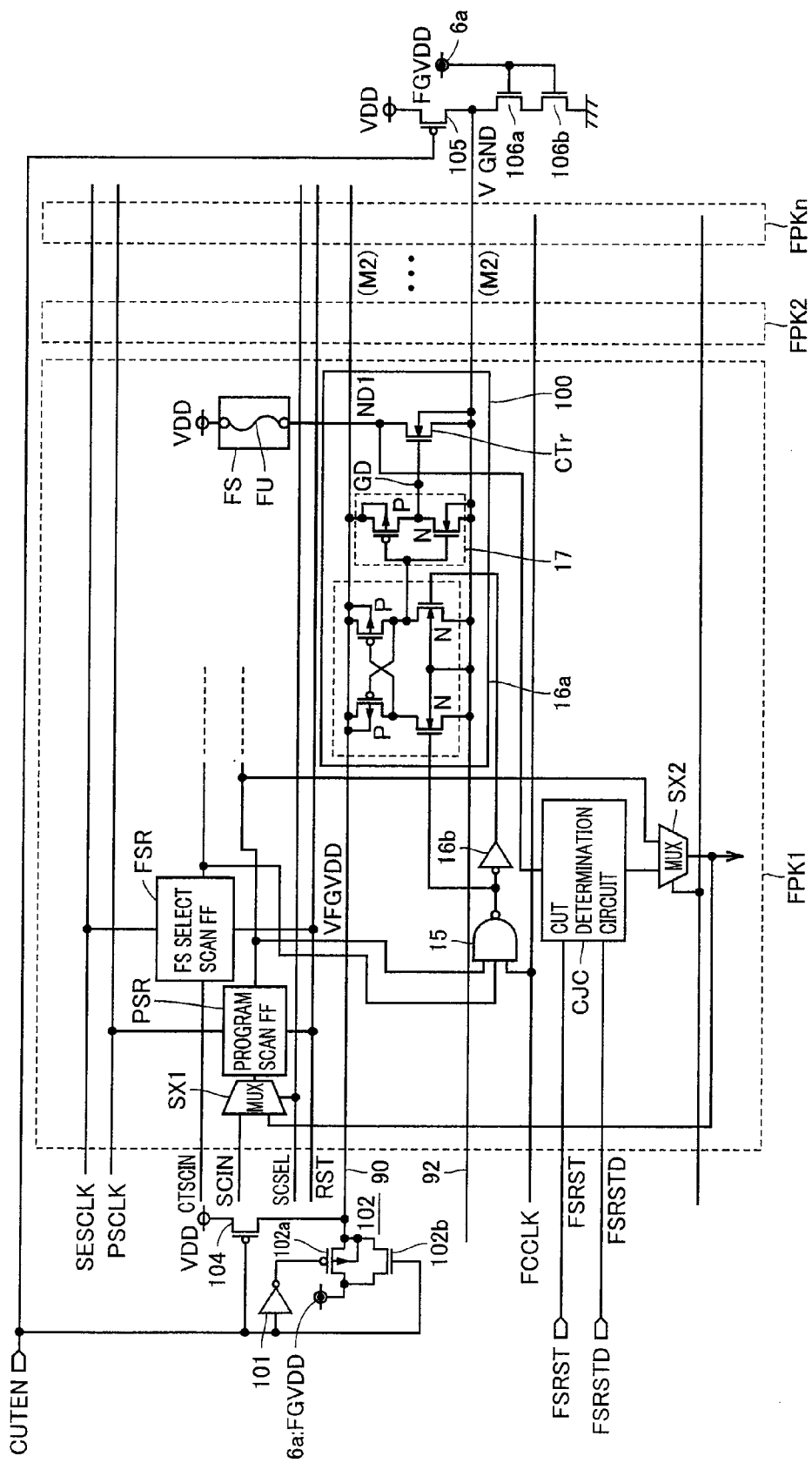
FIG. 38 shows a construction of a modification of the power supply control circuitry of the fuse program circuit according to the invention.

FIG. 38 shows a modification of the power supply circuit of the fuse program circuit. The power supply circuit of the fuse program circuit shown in FIG. 38 differs from the configuration of that shown in FIG. 33 in the following points. In CMOS transmission gate 102 coupled to fuse gate power supply line 90, the back gate of P channel MOS transistor 102a is coupled to fuse gate power supply line 90 instead of power supply node VDD. The other configuration of the power supply circuit and the fuse program circuit shown in FIG. 38 is the same as that shown in FIG. 33. The corresponding portions are allotted the same reference numerals, and description thereof will not be repeated.

In the construction shown in FIG. 38, even when fuse gate power supply voltage FGVDD is boosted to power supply voltage VDD or higher, it is possible to prevent the conduction of the junction between the back gate and source/drain in CMOS transmission gate 102, and boosted fuse gate power supply voltage FGVDD can be reliably transmitted to fuse gate power supply line 90.

Even when fuse gate power supply voltage FGVDD is at the ground voltage level and fuse gate power supply line 90 is set to the level of power supply voltage VDD by MOS transistor 104, the back gate of MOS transistor 102a is the N type substrate region (well), the back gate to drain of MOS transistor 102a is held in a reverse bias state, and fuse gate power supply line 90 is stably kept at the level of power supply voltage VDD.

Signal waveforms representing operations of the power supply circuit and the fuse program circuit shown in FIG. 38 are the same as those shown in FIG. 35, and substantially the same operations can be achieved as those of the circuit construction shown in FIG. 33. When fuse gate power supply voltage FGVDD is boosted to or above power supply voltage VDD, the stable operations can likewise be performed. The use of boosted voltage can further increase the driving current of blowing current supply transistor CTr, and thus can widen an adjust range of the fuse blowing current. As a result, the blowing current can be optimized.

[Second Modification of Power Supply Circuit of Fuse Program Circuit]

Figure 39:
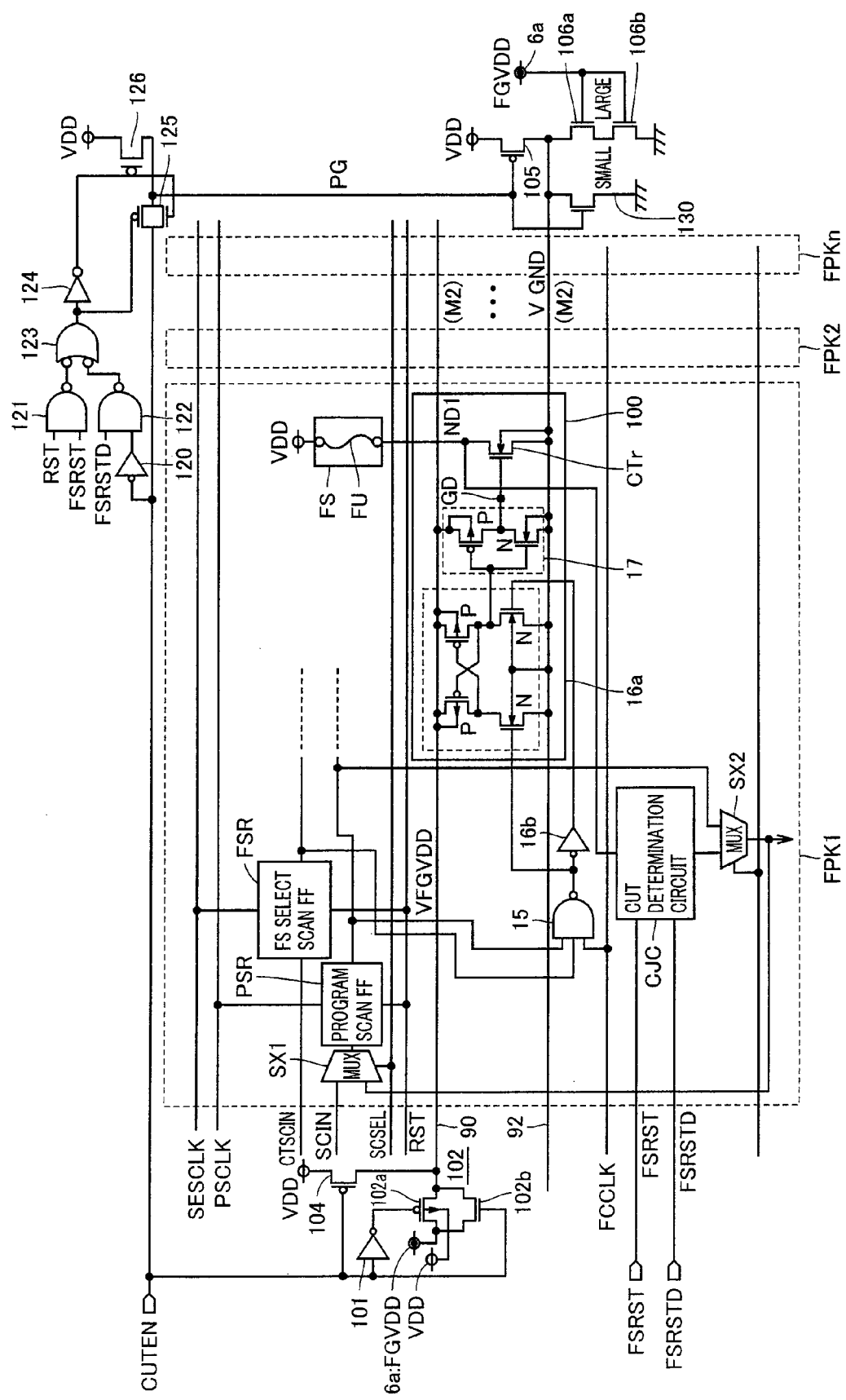
FIG. 39 shows a construction of another modification of the power supply control circuitry of the fuse program circuit according to the invention.

FIG. 39 shows a modification of the power supply circuit of the fuse program circuit. The circuit configuration shown in FIG. 39 differs from the configuration of the power supply circuit of the fuse program circuit shown in FIG. 33 in the following construction. An N channel MOS transistor 130 is arranged between virtual ground line 92 and the ground node. MOS transistor 130 has a smaller current driving capability than MOS transistors 106a and 106b. P channel MOS transistor 105 receives on its gate a control signal PG instead of cut enable signal CUTEN. The control signal PG is also supplied to the gate of MOS transistor 130.

For producing the control signal PG, there are provided an inverter 120 receiving cut enable signal CUTEN, an NAND gate 122 receiving an output signal of inverter 120 and fuse element reset delay signal FSRSTD, an NAND gate 121 receiving reset signals RST and FSRST, an NAND gate 123 receiving the output signals of NAND gates 121 and 122, an inverter 124 receiving the output signal of NAND gate 123, a CMOS transmission gate 125 transmitting cut enable signal CUTEN according to output signals of NAND gate 123 and inverter 124, and a P channel MOS transistor 126 made conductive complementarily to CMOS transmission gate 125 according to an output signal of inverter 124, to set control signal PG to the level of power supply voltage VDD.

When CMOS transmission gate 125 is in an on state, control signal PG is produced according to cut enable signal CUTEN. Other configuration of the circuit shown in FIG. 38 is the same as that of the circuit configuration shown in FIG. 33. The corresponding portions are assigned the same reference numerals, and description thereof will not be repeated.

Figure 40:
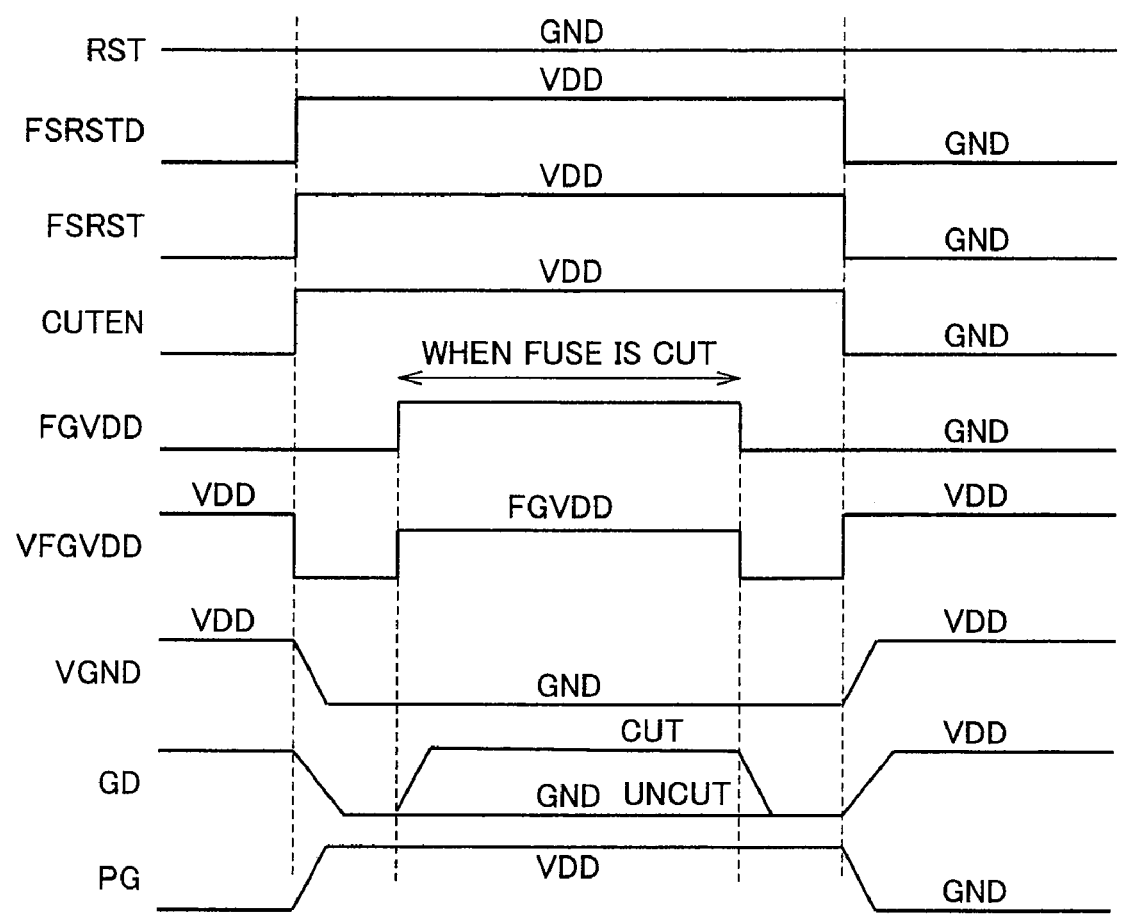
FIG. 40 is a signal waveform diagram representing an operation of the fuse program circuit shown in FIG. 39 performed in cutting.

FIG. 40 is a signal waveform diagram representing an operation performed for the fuse cutting in the circuit shown in FIG. 39. Referring to FIG. 40, the fuse cutting operation of the circuit shown in FIG. 39 will now be described.

In the cutting operation, reset signal RST is kept at the L level. Therefore, scan flip-flops PSR and FSR are in the state of holding the stored information. The fuse element to be cut is selected according to the output signals of scan flip-flops FSR.

Reset signals FSRST and FSRSTD are also kept at L level. Fuse cut enable signal CUTEN is at L level, and CMOS transmission gate 102 is in an off state. MOS transistor 104 is in the on state, and the voltage VFGVDD on fuse gate power supply line 90 is at the level of power supply voltage VDD.

The output signal of NAND gate 123 is at L level, CMOS transmission gate 125 is conductive and control signal PG is at L level according to fuse cut enable signal CUTEN. Accordingly, MOS transistor 105 is conductive, and the voltage VGND of virtual ground line 92 is at the level of power supply voltage VDD. Fuse gate power supply line 90 and virtual ground line 92 are both at the level of power supply voltage VDD. Output signal GD of inverter buffer 17 is at the level of power supply voltage VDD. Even when blowing current supply transistor CTr is conductive, the opposite ends of fuse element FS are both at the level of power supply voltage VDD, and no voltage is applied across fuse FU.

Then, fuse element reset signal FSRST and fuse element reset delay signal FSRSTD rise to the H level, and fuse cut enable signal CUTEN is driven to the H level. Responsively, CMOS transmission gate 102 is turned on, and MOS transistor 104 is turned off, so that the voltage VFGVDD on fuse gate power supply line 90 attains the level of the ground voltage equal to fuse gate power supply voltage FGVDD.

The output signals of NAND gates 121 and 122 are at the H level so that the output signal of NAND gate 123 is at L level. Therefore, CMOS transmission gate 125 is conductive, and control signal PG is at H level according to fuse cut enable signal CUTEN. Responsively, MOS transistor 105 is in the off state, and MOS transistor 130 is in the on state so that the voltage VGND on virtual ground line 92 is at the level of ground voltage GND. The voltages on fuse gate power supply line 90 and virtual ground line 92 are both equal to ground voltage GND, and output signal GD of inverter buffer 17 attains the ground voltage level regardless of the logic level of the output signal of NAND gate 15. In this state, blowing current supply transistor CTr is in the off state, and node ND1 is in the floating state at the level of power supply voltage VDD (see FIG. 16). In this state, therefore, no voltage difference occurs between the opposite ends of fuse FU.

When fuse gate power supply voltage FGVDD attains the blowing voltage level, inverter buffer 17 for the fuse element of cut target generates the output signal GD at the H level to turn on blowing current supply transistor CTr, and accordingly the current flows through fuse element FS to blow fuse FU off. At this time, both MOS transistors 106a and 106b are in the on state, and reliably discharge a large blowing current. For the uncut fuse elements, as shown in FIG. 39, inverter buffer 17 generates the output signal GD at the level of ground voltage GND, and blowing current supply transistor CTr is kept in the off state, so that no current flows through fuse element FS.

When the fuse cutting period expires, fuse gate power supply voltage FGVDD is driven to the ground voltage level, and accordingly the voltage VFGVDD on fuse gate power supply line 90 attains the ground voltage level. MOS transistor 130 holds the voltage VGND on virtual ground line 92 at the ground voltage level, and the output signal of inverter buffer 17 attains the level of ground voltage GND regardless of whether the fuse is to be cut or not to be cut.

When the fuse cutting cycle expires, fuse element reset signal FSRST and fuse element reset delay signal FSRSTD attain the L level, and fuse cut enable signal CUTEN attains the L level. Accordingly, CMOS transmission gates 102 and 125 are turned off, and MOS transistors 104 and 126 are turned on so that the voltage FGVDD on fuse gate power supply line 90 and the voltage VGND on virtual ground line 92 are both at the level of power supply voltage VDD. In this state, the cut determination circuit holds internal node ND1 at the level of power supply voltage VDD, and the opposite ends of fuse FU are kept at the same potential.

By keeping the ground voltage on virtual ground line 92 using MOS transistor 105, it is possible to prevent internal node GD or virtual ground line 92 from attaining the intermediate voltage level through the movement of the charges, and to avoid an unstable state of the internal node. Thus, the stable operation of the circuitry related to the fuse cutting can be ensured.

Further, MOS transistor 130 has a small current driving capability, and the leakage current during the normal operation is sufficiently small. The transistor 130 simply is used to prevent floating us or rise of the potential of virtual ground line 92, and the size thereof can be sufficiently small.

Figure 41:
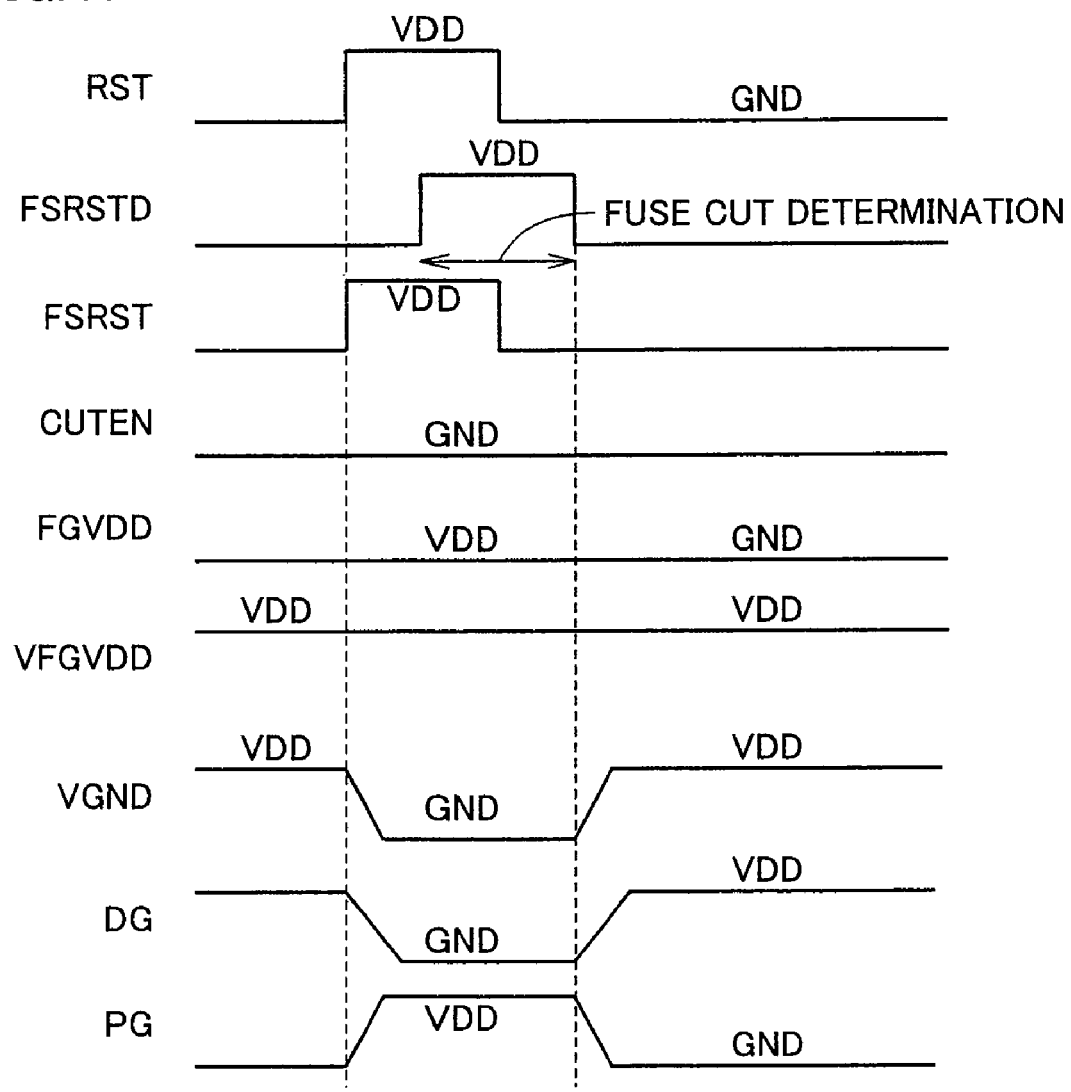
FIG. 41 is a signal waveform diagram representing an operation of the fuse program circuit shown in FIG. 39 performed in determining fuse cutting.

FIG. 41 is a signal waveform diagram representing the operation of determining the fuse state. Referring to FIG. 41, description will now be given on the operation of the circuit shown in FIG. 39.

In the fuse cut determining operation, fuse cut enable signal CUTEN is kept at L level. Therefore, CMOS transmission gate 102 is in the off state, and MOS transistor 104 is in the on state, so that the voltage VFGVDD on fuse gate power supply line 90 is kept at the level of power supply voltage VDD. Fuse gate power supply voltage FGVDD is kept at the ground voltage level, and MOS transistors 106a and 106b keep the off state.

In the initial state, reset signals RST, FSRST and FSRSTD are at the L level, and CMOS transmission gate 125 is conductive, so that control signal PG is at the level of ground voltage GND according to cut enable signal CUTEN. Accordingly, MOS transistor 105 is in the on state, and MOS transistor 130 is in the off state. Thus, voltage VGND on virtual ground line 92 is at the level of power supply voltage VDD.

For initializing internal node ND1, reset signals RST and FSRST are then driven to the H level. Accordingly, NAND gate 121 generates the output signal at the L level, and NAND gate 123 produces the output signal at the H level. Responsively, CMOS transmission gate 125 is turned off, MOS transistor 126 is turned on and control signal PG attains the H level. In response to the H level of control signal PG, MOS transistor 105 is turned off, MOS transistor 130 is turned on and virtual ground line 92 attains the level of ground voltage GND.

Reset signal RST sets both the output signals of scan flip-flops PSR and FSR to the L level, the output signal of NAND gate 15 attains the H level and output signal GD of inverter buffer 17 attains the L level of the ground voltage. In this state, virtual ground line 92 is coupled to the ground node via MOS transistor 105, internal node GD reliably is kept at the level of the ground voltage, and blowing current supply transistor CTr is kept in the off state.

Then, fuse reset delay signal FSRSTD is driven to the H-level, and the internal state of cut determination circuit CJC is set to the state ready for the determination (i.e., tristate inverter TV1 in FIG. 16 is enabled). In this state, since fuse reset delay signal FSRSTD is at the H-level, the output signal of NAND gate 122 attains the L-level so that the output signal of NAND gate 123 attains the H-level. CMOS transmission gate 125 is off, and MOS transistor 126 keeps control signal PG at the level of power supply voltage VDD.

When the determination period expires, fuse reset delay signal FSRSTD falls to the L level, both the output signals of NAND gates 121 and 122 attain the H level and responsively the output signal of NAND gate 123 attains the L level, so that CMOS transmission gate 125 is turned on, and MOS transistor 126 is turned off. Thus, control signal PG attains the level of ground voltage GND according to cut enable signal CUTEN, and virtual ground line 92 attains the level of power supply voltage VDD. Voltage VFGVDD of fuse gate power supply line 90 is at the level of power supply voltage, and output signal GD of inverter buffer 17 is at the level of power supply voltage VDD.

In this determining operation, the potential difference occurs between the opposite ends of fuse FU only while fuse reset delay signal FSRSTD is at the H level during the determination period (see the cut determination circuit in FIG. 16), but the period for which the voltage is applied to fuse element FS is sufficiently short.

Since the floating state of virtual ground line 92 is prevented using reset signals RST, FSRST and FSRSTD, it is possible to prevent the transition of internal node GD to an intermediate voltage level. Accordingly, such a situation can be prevented that a circuit operation become unstable due to increase in leakage current caused by variation in process parameter and the like. Therefore, the cutting of the fuse element and the cut determination can be reliably performed.

[Third Modification of Power Supply Circuit of Fuse Program Circuit]

Figure 42:
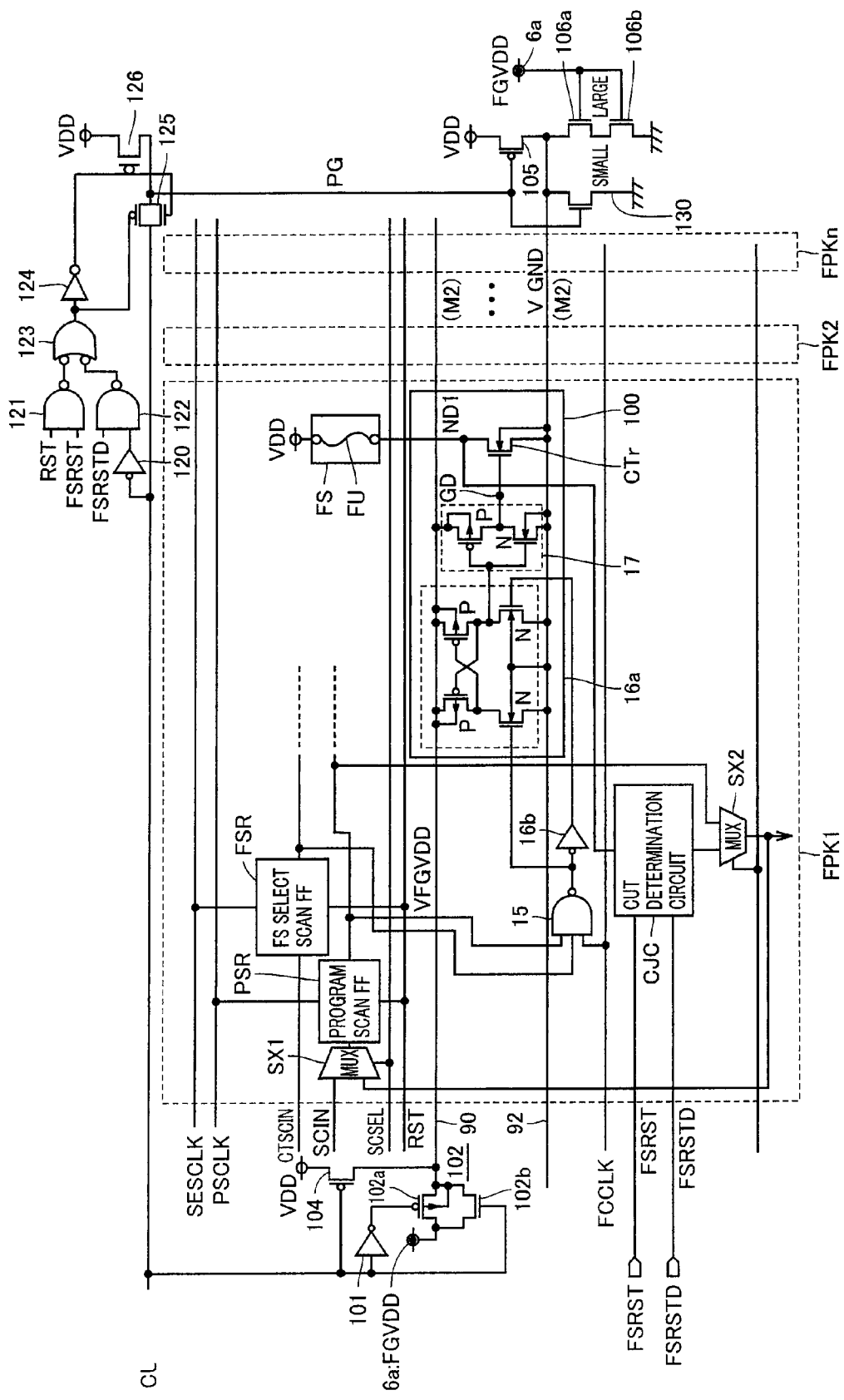
FIG. 42 shows a construction of still another modification of the power supply control circuitry in the fuse program circuit according to the invention.

FIG. 42 shows a configuration of a third modification of the power supply circuit of the fuse program circuit. The power supply circuit shown in FIG. 42 differs from that of the fuse program circuit shown in FIG. 39 in the following configuration. In CMOS transmission gate 102 coupled to fuse gate power supply line 90, the back gate of P-channel MOS transistor 102a is coupled to fuse gate power supply line 90 instead of the power supply node. The fuse program circuit and the power supply circuit shown in FIG. 42 are the same in configuration except for the above as those shown in FIG. 39. The corresponding portions are assigned the same reference numerals, and description thereof will not be repeated.

In the configuration of the power supply circuit shown in FIG. 42, even when fuse gate power supply voltage FGVDD is boosted to a voltage level higher than power supply voltage VDD, P channel MOS transistor 102a of CMOS transmission gate 102 is prevented from having the back gate and the source/drain forwardly biased to turn on the PN junction between the impurity region and the substrate. Thus, fuse gate power supply voltage FGVDD at a boosted voltage level can be stably transmitted to fuse gate power supply line 90. Therefore, the voltage level of blowing current supply transistor CTr can be raised to increase its conductance, and accordingly the current driving power can be increased. Thereby, the adjust range of the fuse blowing current can be increased, and the optimum fuse blowing current can be set.

As shown in FIGS. 40 and 41, even when fuse gate power supply line 90 attains the level of power supply voltage VDD while fuse gate power supply voltage FGVDD is at the ground voltage level, the back gate of P channel MOS transistor 102a is at the level of the power supply voltage, and the PN junction between back gate and the drain node receiving the ground voltage is in a deep reverse biased state. The source node coupled to fuse gate power supply line 90 and the back gate are at the same voltage, and the PN junction between them is kept off owing to the built-in voltage, so that no problem arises.

A signal waveform diagram representing the operations the circuit shown in FIG. 42 is the same as those of FIGS. 40 and 41, and the operations are substantially the same (except for that fuse gate power supply voltage FGVDD rises to the voltage level higher than power supply voltage VDD).

As described above, the invention achieves the fuse program circuit of the interconnect blowing type, which can blow the fuse with the internal power supply, can perform repair on wafer, in a molded state as well as on site. Therefore, the repair after the burn-in and the like can be performed to improve the productivity. By combination with BIST, a self-repair test can be built up, and a test cost can be reduced.

The invention can be applied to all the devices having fixed information programmed through the use of fuse elements in the semiconductor device using the copper interconnects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   (a) a semiconductor substrate,
   (b) an internal circuitry having a first transistor element formed over the semiconductor substrate,
   (c) at least one fuse program circuit having a second transistor element formed over the semiconductor substrate, the fuse program circuit including a fuse element, and
   (d) a plurality of metal interconnection layers formed over the first transistor element and the second transistor element;
   wherein the fuse element is formed of the metal interconnection layers and includes copper material,
   wherein the second transistor element connected in series to the fuse element is formed for selectively passing a current for blowing the fuse element,
   wherein the second transistor element includes a plurality of unit transistors connected in parallel and arranged in a first direction in plan view,
   wherein the unit transistors respectively have gate electrodes, source regions and drain regions extending in a second direction perpendicular to the first direction in plan view,
   wherein each of the source regions and each of the drain regions are arranged alternately to each other with a space between,
   wherein each of the gate electrodes is arranged between the source regions and the drain regions,
   wherein a first film material of a first gate insulation film of the first transistor is the same as a second film material of a second gate insulation film of each of the unit transistors, and
   wherein a first film thickness of the first gate insulation film is the same as a second film thickness of the second gate insulation film.

2. The semiconductor device according to claim 1, further comprising:
   a plurality of first wiring layers formed of the metal interconnection layers, each of the first wiring layers electrically connected to each of the source regions via each of a plurality of first vias, arranged in the first direction in plan view, and extending in the second direction in plan view;
   a plurality of second wiring layers formed of the metal interconnection layers, each of the second wiring layers electrically connected to each of the first wiring layers via each of a plurality of second vias, arranged in the first direction in plan view, and extending in the second direction in plan view;
   a plurality of third wiring layers formed of the metal interconnection layers, each of the third wiring layers electrically connected to each of the drain regions via each of a plurality of third vias, arranged in the first direction in plan view, and extending in the second direction in plan view;
   a plurality of fourth wiring layers formed of the metal interconnection layers, each of the fourth wiring layers electrically connected to each of the third wiring layers via each of a plurality of fourth vias, arranged in the first direction in plan view, and extending in the second direction in plan view,
   wherein each of the second wiring layers overlapping each of the first wiring layers in plan view, and
   wherein each of the fourth wiring layers overlapping each of the third wiring layers in plan view.

3. The semiconductor device according to claim 2, wherein the first wiring layers and the second are the lowest wiring layers.

4. The semiconductor device according to claim 1, further comprising:
   a first pad to which a first power supply voltage from outside of the semiconductor device is provide, the first power supply voltage provided to the internal circuit; and
   a second pad to which a second power supply voltage from outside of the semiconductor device is provide, the second power supply voltage being different from the first power supply voltage, the second power supply voltage provided to one terminal of the fuse element.

5. The semiconductor device according to claim 4, wherein a pad to which the second power supply voltage from outside of the semiconductor device is provided doesn't exist except for the second pad.

* * * * *